United States Patent
Tsurumaki et al.

(10) Patent No.: US 7,443,245 B2
(45) Date of Patent: Oct. 28, 2008

(54) HIGH FREQUENCY POWER AMPLIFIER CIRCUIT AND ELECTRONIC COMPONENT FOR HIGH FREQUENCY POWER AMPLIFIER

(75) Inventors: Hirokazu Tsurumaki, Myogi (JP); Hiroyuki Nagai, Takasaki (JP); Tomio Furuya, Tamamura (JP); Makoto Ishikawa, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 11/976,638

(22) Filed: Oct. 26, 2007

(65) Prior Publication Data

US 2008/0068086 A1    Mar. 20, 2008

Related U.S. Application Data

(62) Division of application No. 10/960,097, filed on Oct. 8, 2004, now Pat. No. 7,304,539.

(30) Foreign Application Priority Data

Oct. 16, 2003  (JP) ............................. 2003-356218
Oct. 16, 2003  (JP) ............................. 2003-356219

(51) Int. Cl.
      *H03G 3/10*   (2006.01)

(52) U.S. Cl. ........................ 330/285; 330/310; 330/134; 330/311

(58) Field of Classification Search .................. 330/285, 330/310, 134, 311
    See application file for complete search history.

(56) References Cited

U.S. PATENT DOCUMENTS

| 4,055,812 | A | 10/1977 | Rosenthal ................... 330/253 |
| 4,879,524 | A | 11/1989 | Bell ........................... 330/288 |
| 5,689,211 | A | 11/1997 | Embree ....................... 330/266 |
| 5,742,205 | A * | 4/1998 | Cowen et al. ............... 330/269 |
| 6,556,081 | B2 | 4/2003 | Muza .......................... 330/253 |
| 6,636,114 | B2 * | 10/2003 | Tsutsui et al. ................. 330/51 |
| 6,801,088 | B2 * | 10/2004 | Allen et al. .................... 330/277 |
| 6,803,824 | B2 * | 10/2004 | Rategh et al. ................ 330/302 |
| 7,116,173 | B2 * | 10/2006 | Tsutsui et al. ............... 330/285 |
| 7,123,094 | B2 * | 10/2006 | Tahara et al. ................. 330/285 |
| 2005/0030097 | A1 | 2/2005 | Ivanov et al. ................ 330/264 |
| 2005/0285676 | A1 | 12/2005 | Jones ........................ 330/255 |

FOREIGN PATENT DOCUMENTS

JP   2003017954   1/2003
JP   2004193846   7/2004

* cited by examiner

*Primary Examiner*—Patricia Nguyen
(74) *Attorney, Agent, or Firm*—Mattingly, Stanger, Malur & Brundidge, P.C.

(57) ABSTRACT

In a high frequency power amplifier circuit that supplies a bias to an amplifying FET by a current mirror method, scattering of a threshold voltage Vth due to the scattering of the channel impurity concentration of the FET, and a shift of a bias point caused by the scattering of the threshold voltage Vth and a channel length modulation coefficient λ due to a short channel effect are corrected automatically. The scattering of a high frequency power amplifying characteristic can be reduced as a result.

8 Claims, 27 Drawing Sheets

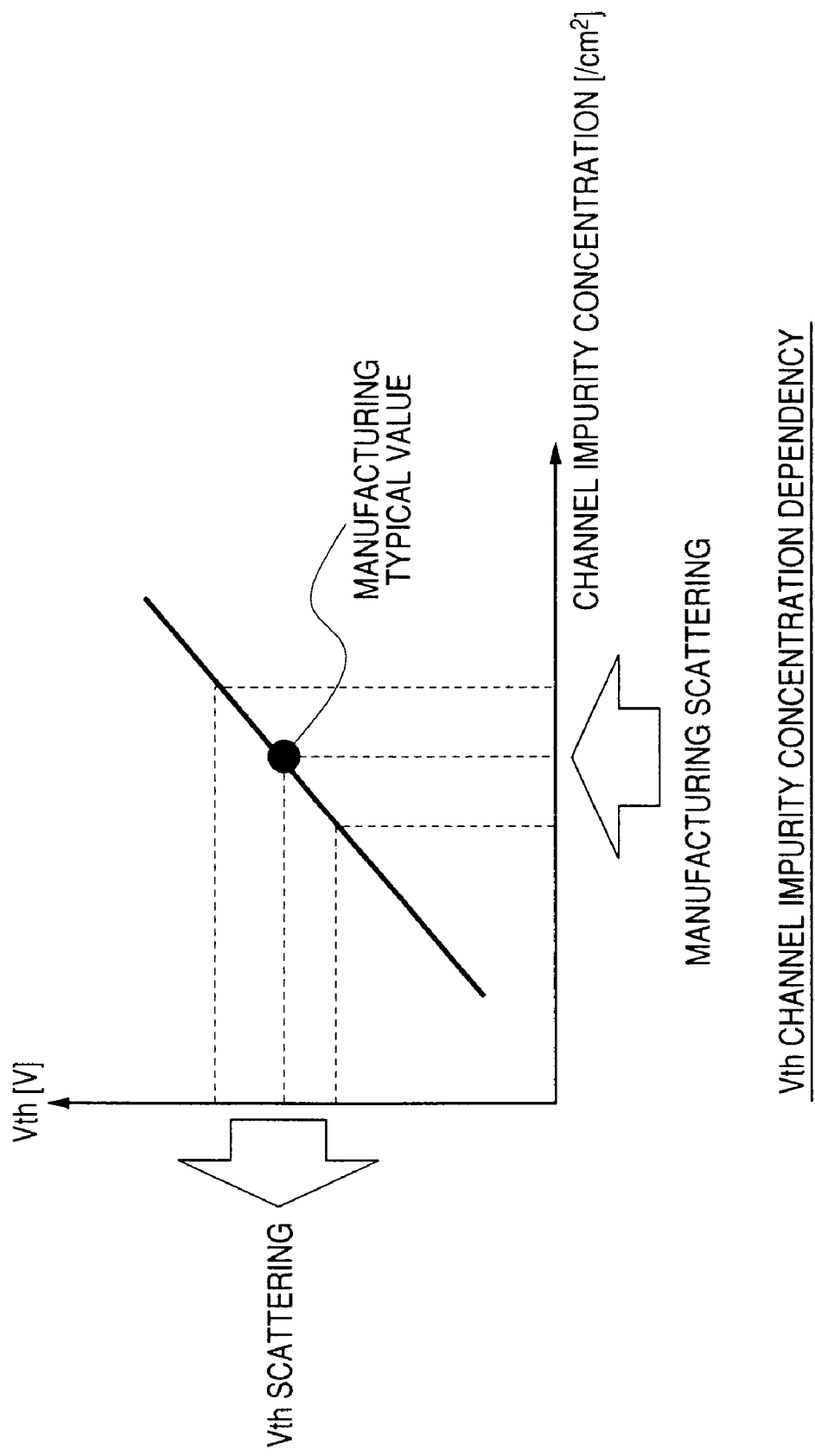

US 7,443,245 B2

HIGH FREQUENCY POWER AMPLIFIER CIRCUIT AND ELECTRONIC COMPONENT FOR HIGH FREQUENCY POWER AMPLIFIER

CROSS-REFERENCE TO RELATED APPLICATION

The present application is a Divisional application of application Ser. No. 10/960,097, filed Oct. 8, 2004; now U.S. Pat. No. 7,304,539 claims priority from Japanese Patent Application No. 2003-356219 filed on Oct. 16, 2003 and Japanese Patent Application No. 2003-356218 filed on Oct. 16, 2003, the contents of which are hereby incorporated by reference into this application.

BACKGROUND OF THE INVENTION

The present invention relates to an effective technology for applying to a high frequency power amplifier circuit and an electronic component for a high frequency power amplifier that incorporates this high frequency power amplifier circuit, and, in particular, relates to a technology that realizes a stable amplifying characteristic in the high frequency power amplifier circuit for supplying an amplifying transistor with a bias by a current mirror method.

A high frequency power amplifier circuit (having multistage composition usually) that uses a semiconductor amplifying device, such as a MOSFET (insulated gate field-effect transistor) or a GaAs-MESFET is incorporated in the transmitting-side output unit of a radio communication system (mobile communication system), such as a cellular phone.

This high frequency power amplifier circuit is, usually, constructed in most cases as a single electronic component. In the electronic component, a semiconductor chip including an amplifying transistor and its bias circuit is mounted on an insulating substrate, such as a ceramic substrate in which printed wiring applies on the surface or in the inside, together with a discrete component such as another semiconductor chip or a capacitor, and each component is coupled by the printed wiring or a bonding wire. This electronic component is called an RF power module.

Incidentally, in the case of a semiconductor chip used in an RF power module for a cellular phone, high integration is advancing to enable the high performance and miniaturization of the module. Moreover, in recent years, from the standpoint of the stabilization of a high frequency amplifying characteristic, an invention concerning the RF power module is proposed (for example, refer to Patent Document 1). According to this invention, as shown in FIG. 12, an amplifying FET Q0 and a biasing Q1 to which a gate is connected in common are provided. A bias current Iin is generated through a current mirror circuit consisting of FETs Q3 and Q4 to which a current from a constant current source CI is transferred. This bias current Iin applies to the biasing FET Q1 and a bias is supplied to the amplifying FET Q0 by a current mirror method, then a current Iout applies in accordance with a ratio of the widths of the Q1 and Q0.

In an RF power module that provides the amplifying FET Q0 with a bias by such a current mirror method, even if an FET threshold voltage (Vth) scatters, an idle current applied to the amplifying FET Q0 does not vary. Accordingly, as an advantage, element scattering need not be corrected, and even a yield improves. Further, when a bias is supplied to amplifying transistor by the current mirror method in a state in which a high frequency signal is not input, that is, there is no signal, a drain current applied to the amplifying transistor is referred to as the idle current in this specification.

Furthermore, an invention regarding a high frequency power amplifier circuit (refer to FIG. 13) that improves a high frequency amplifying characteristic is proposed (for example, refer to Patent Document 2). According to this invention, an FET having dual gate structure or two FETs of a series form are used as an first-stage power amplifying element of an RF power module to adjust a saturation point (the maximum current) of mutual conductance (gm) with a one-side gate voltage and to operate the RF power module in the vicinity of the saturation point.

[Patent Document 1] Japanese Unexamined Patent Publication No. 2003-017954

[Patent Document 2] Japanese Unexamined Patent Publication No. 2004-193846

SUMMARY OF THE INVENTION

In order to improve a high frequency power amplifying characteristic of an RF power module and enable high integration, it is effective to reduce a channel length of an amplifying FET. However, it is known as a phenomenon that, in an area in which an FET whose channel length is short, as shown in FIG. 13, a threshold voltage Vth and a channel length modulation coefficient $\lambda$ scatter largely due to slight scattering of the channel length. Such a phenomenon is called a short channel effect.

In an RF power module that supplies an amplifying FET with a bias by a current mirror method, when the FET threshold voltage Vth or the channel length modulation coefficient $\lambda$ scatters largely, a desired current mirror ratio is not obtained. Accordingly, a drain current (idle current) of the amplifying FET shifts from a desired value, and a desired high frequency power amplifying characteristic is not obtained, such as necessary output power is not output, and power consumption increases. However, in the RF power module of a conventional current mirror method as well as the prior invention, a shift of a bias point due to an FET short channel effect was not taken into consideration. Accordingly, if any measure for correction is not taken in the RF power module that uses the amplifying FET having a short channel length, the scattering of the high frequency power amplifying characteristic between the modules increases in such a degree as the scattering is not ignored, and there is a possibility of a stable amplifying characteristic being not obtained.

Moreover, it is supposed that a shift of a bias point due to an FET short channel effect is also corrected by an external resistive element. However, in that case, because the steps of accurately measuring an FET characteristic and adjusting the resistive element are required, a cost increase is incurred.

Besides, in a short channel FET, the channel modulation coefficient $\lambda$ cannot be ignored even in a saturation area, and a power voltage slightly differs depending on a user system. Accordingly, even if the shift of the bias point is corrected by adjusting the external resistive element, it became evident that an idle current of a desired size cannot apply to an amplifying FET due to the influence of $\lambda$ when the power voltage differs depending on the user system to be used.

Furthermore, a high frequency amplifier circuit that uses a bipolar transistor instead of the FETs Q0 and Q1 in the circuit of FIG. 12 is also supposed. By using the bipolar transistor, a fault due to a short channel effect can be prevented. In the bipolar transistor, however, instead of not obtaining the short channel effect in the FET, there is an Early effect that, even if a base-emitter voltage is kept constantly, as a collector-emitter voltage increases, an effective base width decreases and a collector current increases.

Accordingly, in a high frequency amplifier circuit that uses a bipolar transistor as an amplifying element, when the thickness of the base of an amplifying transistor is thinned, an element size (base thickness) will scatter due to manufacturing scattering every chip. In this case, a bias point of the base scatters every chip by an influence of an Early effect and a collector current (idle current) varies. Consequently, there is a possibility of a high frequency power amplifying characteristic not being obtained.

Furthermore, as shown in FIG. 27, a high frequency power amplifier circuit uses two FET Qa and FET Qb of a series form as a biasing element and a power amplifying element respectively to supply the power amplifying element with a bias by a current mirror method. In composition, the potential difference between the one gate and the other gate of the two FETs of the series form will be determined depending on the voltage generated by applying the bias current Iin to a resistor R121 or R122. Accordingly, as shown in FIG. 31, when the threshold voltage Vth scatters due to the scattering of channel impurity concentration, it became evident that, even if a drain current is identical, gm varies and a high frequency power amplifying characteristic will scatter. Furthermore, when the threshold voltage Vth and the channel length modulation coefficient λ scatter largely due to a short channel effect, it became clear that the drain current and the gm vary, and the high frequency power amplifying characteristic scatter even further. Further, this point is described in detail in the column of an example later.

An object of the present invention is, in a high frequency power amplifier circuit that supplies an amplifying FET with a bias by a current mirror method, to be able to automatically correct a shift of a bias point resulting from an FET short channel effect, and to reduce the scattering of the high frequency power amplifying characteristic between high frequency power amplifier circuit chips.

Another object of the present invention is, in a high frequency power amplifier circuit that supplies an amplifying bipolar transistor with a bias by a current mirror method, to be able to automatically correct a shift of a bias point due to an Early effect of the bipolar transistor, and to reduce the scattering of the amplifying characteristic between the high frequency power amplifier circuit chips.

Another object of the present invention is to provide a high frequency power amplifier circuit having small scattering of a high frequency power amplifying characteristic and being capable of miniaturization and high integration, and an electronic component (RF power module) for a high frequency power amplifier in which this high frequency power amplifier circuit is built.

Another object of the present invention is, in a high frequency amplifier circuit that uses an FET of dual gate structure or a series form as an first-stage power amplifying element to supply an amplifying FET with a bias by a current mirror method, to be able to automatically correct a shift of a bias point resulting from an FET short channel effect and the scattering of channel impurity concentration and to reduce the scattering of the high frequency power amplifying characteristic between the high frequency power amplifier circuit chips.

Another object of the present invention is, in a high frequency power amplifier circuit that uses a bipolar transistor of dual base structure or a series form in an first-stage power amplifying element to supply an amplifying transistor with a bias by a current mirror method, to be able to automatically correct a shift of a bias point resulting from an Early effect of the bipolar transistor and the scattering of channel impurity concentration and to reduce the scattering of the high frequency power amplifying characteristic between the high frequency power amplifier circuit chips.

Another object of the present invention is to provide a high frequency power amplifier circuit having small scattering of a high frequency power amplifying characteristic and enabling miniaturization and high integration, and to provide an electronic component (RF power module) for a high frequency power amplifier that incorporates the high frequency power amplifier circuit.

The above and other objects, and new characteristics of the present invention will become apparent from the description and accompanying drawings of this specification.

An outline of a typical invention among the inventions disclosed in this application is described below.

That is, the present invention has, in a high frequency power amplifier circuit that supplies an amplifying transistor with a bias by a current mirror method, a current simulating transistor having the same channel length or base width and formed in the same process as the amplifying transistor and a diode-connected transistor connected in series to the transistor. The present invention has also a bias generation circuit that supplies the amplifying transistor and the current simulating transistor with such a bias that compares a voltage formed based on a current applied to the diode-connected transistor with a reference voltage generated by a current-voltage converting element that converts a current from a constant current circuit into a voltage, and restrain the idle current of the amplifying transistor from changing due to a short channel effect or an Early effect.

More specifically, the present invention is provided with a bias generation circuit that includes a current simulating transistor having the same channel length or base width and formed in the same process as an amplifying transistor, a diode-connected transistor connected in series to the current simulating transistor, a transistor connected to the diode-connected transistor by a current mirror method, a first current-voltage converting element connected in series to the transistor, and a differential amplifier circuit that compares a voltage generated from the first current-voltage converting element with a reference voltage generated from a second current-voltage converting element that converts a constant current from a constant current circuit into a voltage and outputs the voltage in accordance with a potential difference. The differential amplifier circuit operates so that the voltage generated by the first current-voltage converting element can match the reference voltage and an output voltage of the differential amplifier circuit is applied to a control pin of the amplifying transistor, According to the aforementioned means, even if the channel length or base width of an amplifying transistor scatters, a bias voltage corrected so that the amplifying characteristic of the amplifying transistor automatically becomes a desired characteristic is generated without measuring the characteristic of the amplifying transistor and without adjusting a resistive element and can be supplied to a control pin (gate pin or base pin) of the amplifying transistor.

At this point, desirably, the gate width or emitter size of the current simulating transistor is made smaller than the gate width or emitter size of an amplifying transistor. Accordingly, an increase in power consumption due to providing the amplifying transistor can be suppressed.

Moreover, desirably, the channel length or base width of the current simulating transistor Tr1 is Lg (Tr1) or Lb (Tr1), and the channel length or base width of the diode-connected transistor Tr2 in series to the Tr1 is Lg (Tr2) or Lb (Tr2). Furthermore, the current-voltage converting element has a diode-connected transistor. In this case, when the channel length of the transistor Tr3 is set to Lg (Tr3), a relationship is established to satisfy Lg (Tr3)>(Tr1) or Lb (Tr3)>Lb (Tr1). Furthermore, the relationship is established to satisfy Lg (Tr2)☐Lg (Tr3)>Lg (Tr1) or Lb (Tr2)☐Lb (Tr3)>Lb (Tr1).

Accordingly, a reference voltage that does not depend on the scattering of the channel length or base width of an amplifying transistor can be generated as the reference voltage input to a differential circuit, and such a bias that inhibits an idle current of the amplifying transistor from varying due to a channel effect or an Early effect can accurately be supplied to the amplifying transistor.

Furthermore, desirably, an output power detecting transistor is provided which is connected so that the same voltage as the voltage applied to a gate pin or base pin of a final-stage amplifying transistor can be applied to the gate pin or base pin, and in which a current that is proportional to the current flowing to the amplifying transistor flows. Accordingly, output power with excellent linearity can be controlled by feeding back a current detected by the output power detecting transistor into a bias circuit and controlling a bias voltage.

Furthermore, an invention disclosed in this application described below. That is, according to the invention, in a high frequency power amplifier circuit that uses a transistor of dual gate structure or dual base structure having two control pins in an first-stage power amplifying element or a transistor of a series form to supply an amplifying transistor with a bias by a current mirror method, the bias voltages of the two control pins of the amplifying transistor settable independently and makes the bias ratio of the two control pins constant. The present invention comprises: a current simulating transistor having the same structure and the same channel length or base width and formed in the same process as the amplifying transistor; and a bias generation circuit that supplies the amplifying transistor and the current simulating transistor with such a bias that compares a voltage formed based on the current applied to the current simulating transistor with a reference voltage generated by a current-voltage converting element that converts a reference current (Iin) into a voltage, and inhibits the idle current of the amplifying transistor from varying due to a short channel effect or an Early effect.

More specifically, the present invention comprises: a current simulating transistor of a dual gate or dual base having the same channel length or base width and formed in the same process as the amplifying transistor of the dual gate or dual base; and a diode-connected transistor having the channel length so that a threshold voltage and a channel length modulation coefficient cannot vary due to manufacturing scattering and a base width so that an effective base width cannot vary in accordance with a collector-emitter voltage due to the manufacturing scattering. The present invention includes: a first bias generation circuit that compares a voltage formed based on a current applied to the diode-connected transistor with a reference voltage generated by a current-voltage converting element that converts the current from a current control circuit into a voltage, and supplies such a bias that an idle current of the amplifying transistor is inhibited from varying due to a short channel effect or an Early effect to a first gate or first base to which a signal to be amplified of the amplifying transistor is input and the first gate or first base to which the current simulating transistor corresponds; and a second bias generation circuit that compares a voltage formed based on the current applied to the diode-connected transistor with a reference voltage generated by the current-voltage converting element that converts a current from the current control circuit to a voltage and supplies second gates or second bases of the amplifying transistor and the current simulating transistor with the bias.

According to the aforementioned means, even if the channel length, base width and channel impurity concentration of an amplifying transistor scatter, a bias voltage corrected so that an amplifying characteristic of the amplifying transistor can be a desired characteristic is generated automatically and can be supplied to the gate or base of the amplifying transistor without measuring the characteristic of the amplifying transistor and without adjusting a resistive element.

At this point, desirably, a high frequency power amplifier circuit comprises: a power amplifying element having multiple amplifier stages connected in a cascade and in which each amplifier stage amplifies a high frequency signal respectively; and a current-voltage converting element that converts a current into a voltage by applying a predetermined current. In the high frequency power amplifier circuit, a voltage corresponding to the voltage generated by the current-voltage converting element is applied to a control pin of the power amplifying element thereby making flow a current proportional to the current flowing to the current-voltage converting element. In the high frequency power amplifier circuit, an FET of a dual gate or a bipolar transistor of a dual base is used as the power amplifying element of an first-stage amplifier stage. Because the high frequency power amplifier circuit having the multiple amplifier stages requires an output power control characteristic of the most linearity in the first-stage amplifier stage, a linear output power control characteristic is obtained even in an area of a low output power level by using the FET of the dual gate or the bipolar transistor of the dual base, and the deterioration of a control characteristic due to manufacturing scattering can be prevented.

Furthermore, desirably, the present invention is provided with an external pin to which an output power control voltage and an external pin to which predetermined fixed potential is input, and a switch that selects either of the voltages input to the two external pins and can be supplied to the bias generation circuit. The switching means selects the voltage input to the first external pin in a first mode in which a frequency-modulated high frequency signal is input to the amplifying transistor and selects the voltage input to the second external pin in a second mode in which phase-modulated and amplitude-modulated high frequency signals are input to the amplifying transistor. Accordingly, the high frequency signal modulated by multiple modulation methods is amplified and output through a single circuit or by a single module.

Effects obtained from a typical invention among the inventions disclosed in this application are briefly described below.

That is, according to the present invention, in a high frequency power amplifier circuit, a shift of a bias point due to an FET short channel effect, an Early effect of a bipolar transistor, and the scattering of channel impurity concentration is automatically corrected, and the scattering of the high frequency power amplifying characteristic between chips can be reduced.

Moreover, according to the present invention, even when a bipolar transistor of an FET of a short channel length or a thin base width is positively used as an amplifying transistor of a high frequency power amplifier circuit in order to improve a high frequency power amplifying characteristic and enable miniaturization, the scattering of the characteristic between the modules can be reduced.

Furthermore, according to the present invention, the controllability of a high frequency power amplifying characteristic is improved and the general-purpose use of a high frequency power amplifier circuit and a module that mounts the high frequency power amplifier circuit can be improved.

BRIEF DESCRIPTION OF THE DRAWINGS

FIGS. 2A and 2B are characteristic diagrams showing a relationship between a current Iin of a bias circuit and a current Iout applied to an amplifying FET Q0 in accordance with the current Iin in the high frequency power amplifier circuit, in which FIG. 2A shows an embodiment of this invention and FIG. 2B shows a conventional example;

FIG. 31 is a characteristic diagram showing channel impurity concentration dependency of the threshold voltage Vth of the FET.

DETAILED DESCRIPTION OF THE PREFERRED EMBODIMENTS

The embodiments of the present invention is described in detail below.

Embodiment 1

Figure 1:
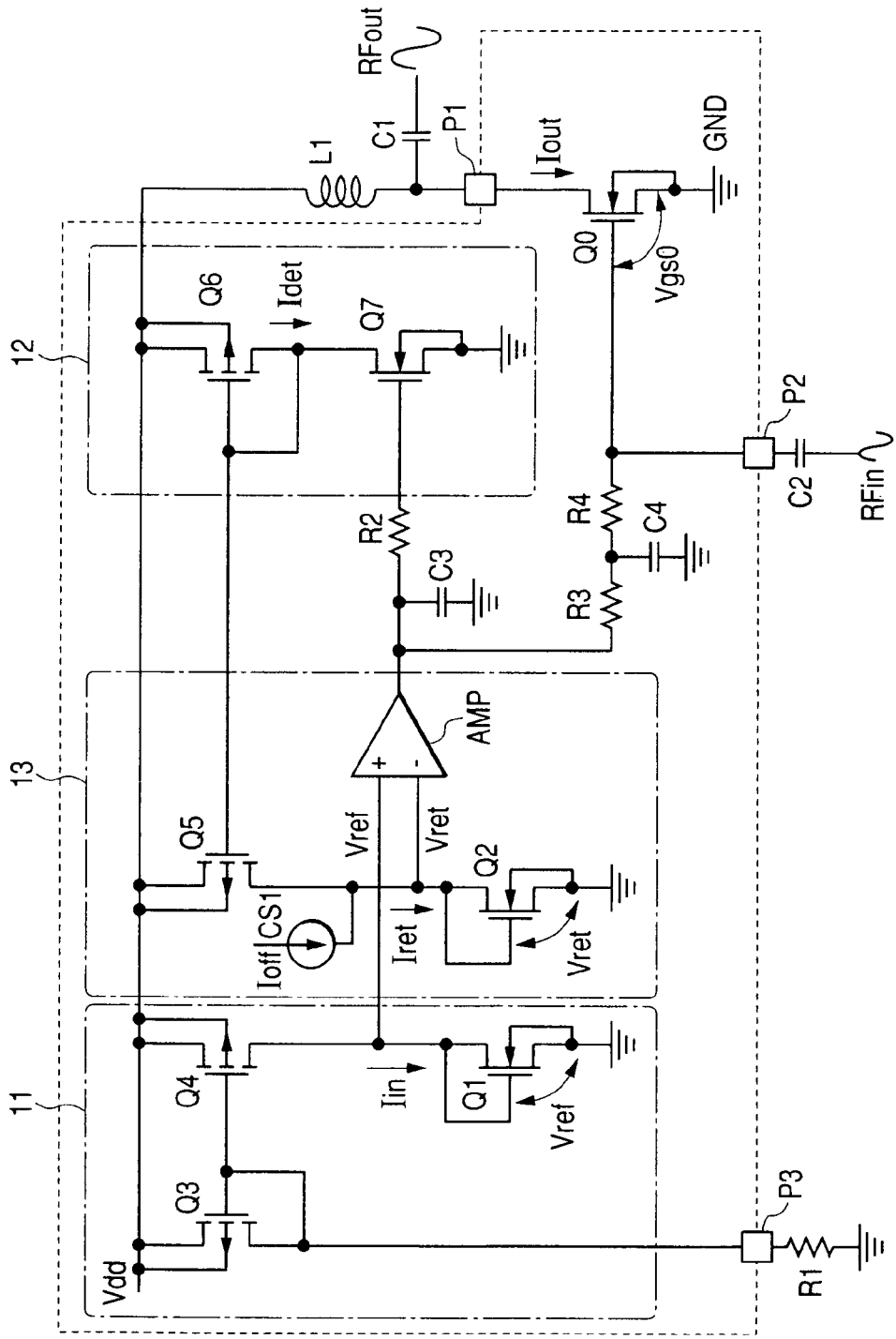
FIG. 1 is a circuit block diagram showing a first embodiment of a high frequency power amplifier according to the present invention.

FIG. 1 shows rough composition of a first embodiment of a high frequency power amplifier circuit according to the present invention. Although not limited in particular, for example, the three high frequency power amplifier circuits having such composition as the embodiment of FIG. 1 are connected in a cascade, and mounted on an insulating substrate, such as a ceramic substrate, together with an external resistive element or a capacitive element, thereby constructing an RF power module (refer to FIG. 9 and FIG. 10). Further, cascade connection means that the three power amplifier circuits are connected so that the previous-stage high frequency output is input to the next-stage input pin. The high frequency power amplifier circuit of each stage is the same as FIG. 1 as the composition respectively, but differs in the size (gate width) of an amplifying FET. An FET of a broader size is used in the order of the first stage, second stage, and third stage. In the FET of this embodiment, because a channel length is equal to a gate length, and a channel width is equal to a gate width, both the channel length and channel width are described as the gate length and gate width below.

The high frequency power amplifier circuit of this embodiment comprises: an amplifying FET Q0 connected between an output pin (pad) P1 and a ground point GND; a reference bias circuit 11 that generates a reference gate bias of the amplifying FET Q0; a current simulating circuit 12 that simulates a current Iout applied to the amplifying FET Q0; and a bias correction circuit 13 that corrects a biased state of the amplifying FET Q0 by correcting a bias voltage generated through the reference bias circuit 11 based on a current detected through the current simulating circuit 12 and supplying the bias voltage to a gate pin of the amplifying FET Q0.

The amplifying FET Q0 is an FET (for example, Lg=0.3 μm) whose gate length Lg is shorter than a usual FET. Further, as the entirety of an RF power module, because output power increases as the rear-stage amplifier circuit is reached, a gate width Wg of the amplifying FET Q0 of the first-stage amplifier circuit is 2 mm, for example. The gate width Wg of the amplifying FET of the final-stage amplifier circuit is 60 mm. The gate width Wg of the amplifying FET Q0 of the second-stage amplifier circuit is an intermediate value between 2 mm and 60 mm.

The gate pin of each amplifying FET Q0 is connected to an external pin (pad) P2 to which a high frequency signal RFin to be amplified is input and a drain pin of the amplifying FET Q0 is connected to the output pin P1. The output pin P1 is connected to a power voltage pin Vdd through an inductor L1 for cutting off a high frequency component and matching an impedance, and is connected to a high frequency input pin (not illustrated) of the next-stage amplifier circuit through a capacitor C1. The capacitor C1 and a capacitor C2 of the external pins P1 and P2 are a capacitive element that cuts off a direct current component of a high frequency signal. These capacitive elements C1 and C2 can also be discrete components, but can have a pair of conductive layers formed on the front and rear of a dielectric layer that constructs a module substrate. Even the inductor L1 can have a microstrip line formed on the module substrate.

The reference bias circuit 11 has, what is called, a diode-connected biasing FET Q1 in which a gate and a drain are coupled, a P-channel type standard MOSFET Q4 connected in series to the Q1 between the drain pin and power voltage pin Vdd of the biasing FET Q1, and a P-channel type standard MOSFET Q3 connected to the MOSFET Q4 in common with a gate. The MOSFET Q3 forms diode connection in which the gate and drain are coupled, and the Q3 and Q4 construct a current mirror circuit. The biasing FET Q1 is, in the bias circuit of the conventional current mirror method shown in FIG. 12, an FET that corresponds to the FET in which a gate pin is connected to the gate pin of the amplifying FET Q0 via a resistor R2 and to which the same symbol Q1 is affixed.

The drain pin of the MOSFET Q3 is connected to a ground point via a resistive element R1 connected to an external pin P3, and the current applied to Q3 and Q1 can be set to a desired value by appropriately setting a value of resistance of this resistive element R1. In this example, a constant current circuit has the MOSFETs Q3 and Q4, and the resistive element R1. FET Q1 is diode-connected to convert the current applied to the constant current circuit into a voltage.

Figure 13:
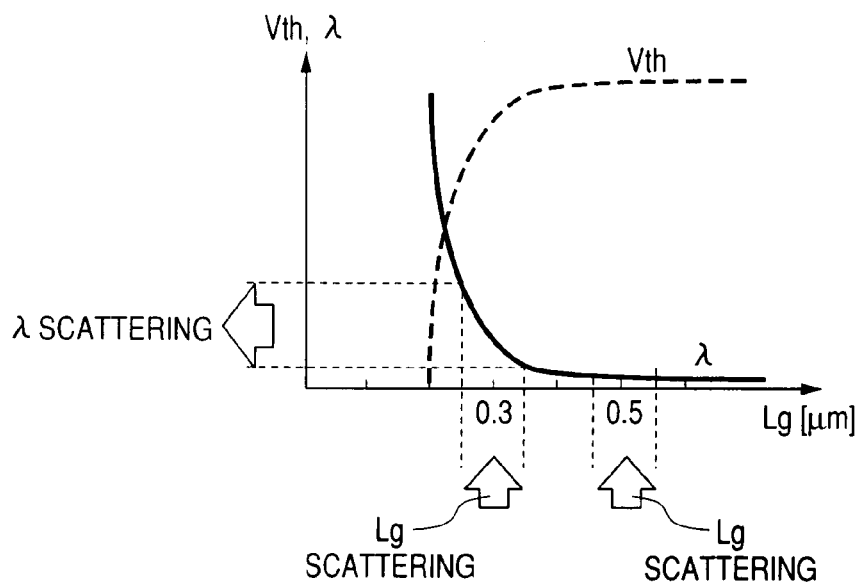
FIG. 13 is a graph showing the relationship between a channel length, a threshold voltage Vth, and a channel length modulation coefficient $\lambda$ when the length of an FET channel is shortened.

Moreover, the FET Q1 is, although not limited in particular, formed in the same process as the amplifying FET Q0 in this embodiment. Accordingly, an element size, by the same token, a chip size can be reduced. Specifically, in the standard MOSFETs Q3 and Q4 formed in a general CMOS process, a gate length is 2 μm, while in the FET Q1 formed in a different process, the gate length Lg is such a value of 0.5 μm so that such a short channel effect as shown FIG. 13 cannot be produced.

The current simulating circuit 12 has a simulating FET Q7 in which the gate length Lg formed in the same process as the amplifying FET Q0 is such a value of 0.3 μm that is the same as the Q0, and a standard MOSFET Q6 connected in series to the FET Q7. The FET Q7 applies the same voltage as the voltage applied to the gate of the Q0 to a gate so that the drain current of the amplifying FET Q0 can be simulated. However, because the current applied to the amplifying FET Q0 is high, the power consumption of the entire circuit will increase when the current of the same size flows to the amplifying FET Q0 and the simulating FET Q7. Accordingly, the Q7 sets the gate width Wg to several one-tenths to several one-hundredths of the Q0. Specifically, the gate width Wg of the simulating FET Q7 is about 80 μm for the first stage, and about 160 μm for the second stage and the third stage with respect to the amplifying FET Q0 having a gate width of 2 mm to 60 mm. The MOSFET Q6 connected in series to this simulating FET Q7 forms diode connection in which a gate and a drain are coupled, and converts a current into a voltage.

The bias correction circuit 13 has a MOSFET Q5 that is connected in series to the MOSFET Q6 of the current simulating circuit 12 by a current mirror method, a diode-connected FET Q2 connected in series to the MOSFET Q5, and a differential amplifier AMP that compares the drain voltage of the FET Q2 with the drain voltage of the FET Q1 of the reference bias circuit 11 and outputs a voltage that corresponds to a potential difference. Subsequently, the output voltage of this differential amplifier AMP is supplied to the gate pins of the amplifying FET Q0 and the simulating FET Q7 through the resistors R2 to R4, and controls the current applied to their gate pins. The resistors R2 to R4 and the capacitors C3 and C4 prevent a high frequency signal RFin input to the external pin P2 from traveling into the differential amplifier AMP and the simulating FET Q7 and prevent the output of the differential amplifier AMP from overshooting.

The MOSFET Q5 of the bias correction circuit 13 is the same size as the MOSFET Q6 of the current simulation circuit 12 in this embodiment. A current Iret that is identical to a current Idet simulated by the simulating FET Q7 applies to the Q5, and the current Iret is converted into a voltage Vret by the Q2 and input to the differential amplifier AMP. Because the simulating FET Q7 has the same characteristic as the amplifying FET Q0, the amplifying FET Q0 allows the threshold value to scatter due to a short channel effect and a drain current to shift from a desired value. At this occasion, the drain current of the amplifying FET Q7 also shifts in the same manner. The drain current is converted into the voltage Vret by the Q2 and input to the differential amplifier AMP. The voltage Vret is compared with the standard voltage Vref from the reference bias circuit 11 and the voltage that corresponds to a potential difference is supplied to the gates of the amplifying FET Q0 and the simulating FET Q7. The Q2 is the same characteristic and the same size as the Q1. In this embodiment, the size ratio of the Q5 and Q6 is 1 to 1. The size ratio of the Q0 and Q7 and the size ratio of the Q5 and Q6 can be set so that the current Iret and the current Iin can change into a current of the same order.

Because the differential amplifier AMP operates (imaginary short-circuits) so that the voltage of a non-inverting input pin matches the voltage of an inverting input pin, feedback is applied so that the voltage Vret of the non-inverting input pin matches the reference voltage Vref of the inverting input pin. A shift of a current due to the short channel effect of the simulating FET Q7 is corrected accordingly. Because the output of the differential amplifier AMP is supplied to even the amplifying FET Q0, even the shift of the current due to the short channel effect of the amplifying FET Q0 is corrected simultaneously at this occasion.

Further, in this embodiment, a current source CS1 that applies an extremely low current Ioff to the FET Q2 is provided in the bias correction circuit 13. This current source CS1 prevents a spurious current from applying to the amplifying FET Q0 when the potential of the inverting input pin of a differential amplifier AMP is floating and an unstable voltage is output for power-on. The current Ioff is set to such a size as 10 μA that can be ignored in comparison with the current Iret applied to the FET Q2 in a normal operation. This extremely low current Ioff can turn off after the input current Iin becomes stable.

Figure 12:
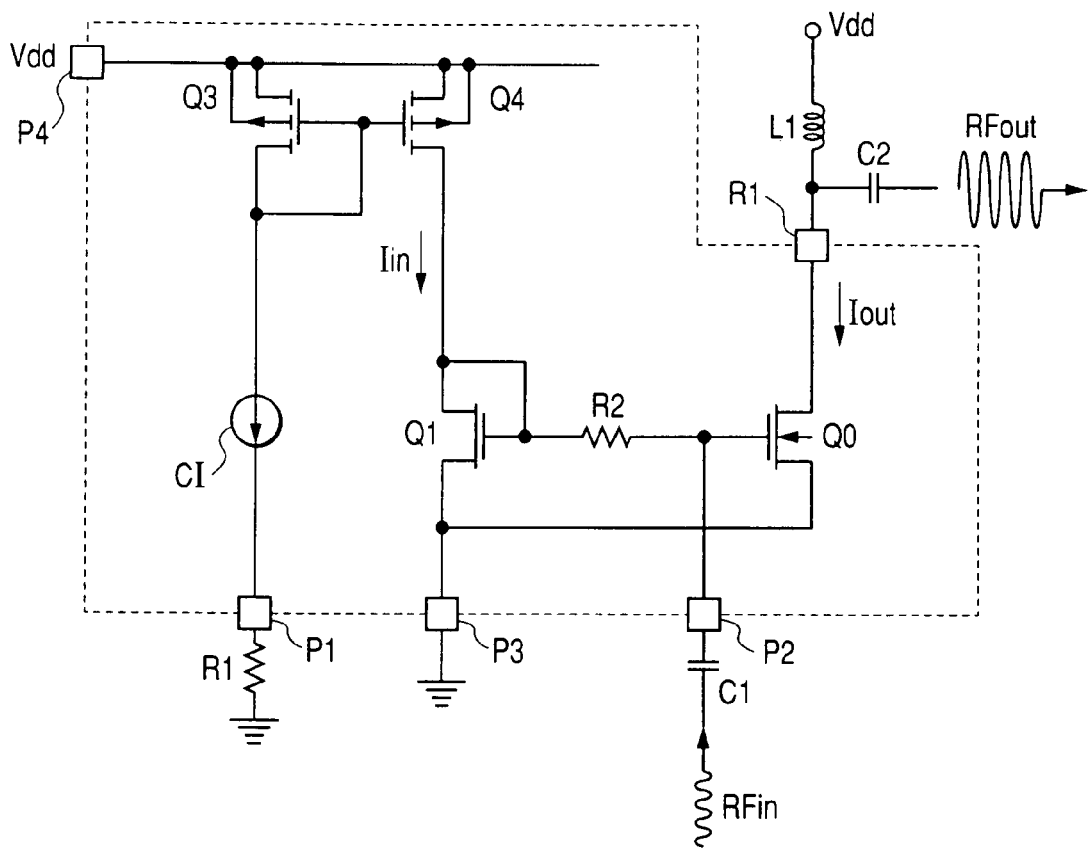
FIG. 12 is a circuit block diagram showing one example of a conventional high frequency power amplifier circuit.

The actions of the high frequency power amplifier circuit of this embodiment are described in detail comparing with those of the high frequency power amplifier circuit of the conventional current mirror bias method shown in FIG. 12.

In the circuit of FIG. 12, when the gate lengths of the amplifying FET Q0 and the biasing FET Q1 are 0.4 μm or longer that will not cause a short channel effect, a shift of a threshold value can hardly be found even if the gate lengths scatter due to process scattering. Moreover, the power voltage Vdd and a threshold voltage Vth1 are set so that the biasing FET Q1 operates in a saturation area. At this state, when the current Iin flows to the biasing FET Q1 from a constant current circuit having the Q3, Q4, and the resistor R1, such a voltage Vgs1 as expressed in the following formula $$Iin = K1(Vgs1 - Vth1)2 \tag{1}$$

is generated between the gate and source of the Q1.

Further, supposing the unit conductance coefficient of the Q1 is K, the gate width of the biasing FET Q1 is Wg1, and the gate length of the biasing FET Q1 is Lg1, K1 is a constant expressed by K1=K (Wg1/Lg1). Subsequently, because this voltage Vgs1 applies to the Q2 gate pin that forms the Q1 and a current mirror, the drain current (idle current) Iout expressed by the following formula is applied to the amplifying FET Q0.

$$Iout = K0(Vgs0 - Vth0)2 \tag{2}$$

Further, Vgs0 is a gate-source voltage of the amplifying FET Q0 and Vth0 is the threshold voltage of the Q0. Moreover, supposing the gate width of the amplifying FET Q0 is Wg0 and the gate length of the amplifying FET Q0 is Lg0, K0 is a constant expressed by K0=K(Wg0/Lg0). When the amplifying FET Q0 and the biasing FET Q1 are elements of the same characteristic and the gate length is 0.4 μm or more that will not cause a short channel effect, Vgs1=Vgs0 and Vth1=Vth0 are supposed in the aforementioned two formulas. Accordingly, a relationship expressed by $$Iout = (Wg0/Wg1)Iin \tag{3}$$

is established between the current Iin of the Q1 and the current Iout of the Q0. That is, the ratio of the input current Iin and the output Iout is determined depending upon the ratio Wg0/Wg1 of the gate widths of the Q0 and Q1.

However, in the circuit of FIG. 12, each of the gate lengths of the amplifying FET Q0 and the biasing FET Q1 is 0.3 μm or shorter that will cause a short channel effect. In this case, when a gate length scatters due to process scattering, a threshold voltage and the channel modulation coefficient λ also scatter. Accordingly, supposing the drain-source voltage of the amplifying FET Q0 is Vds0 and the drain-source voltage of the biasing FET Q1 is Vds1, the current Iin of the Q1 and the current Iout of the Q0 establishes a relationship expressed by the following formula.

$$Iout = (Wg0/Wg1) \cdot \{(1+\lambda Vds0)/(1+\lambda Vds1)\} \cdot Iin \tag{4}$$

Further, in Formula (4), Vds1=Vgs1, but Vds0≠Vgs0. Accordingly, it proves that the ratio of the input current Iin and the output current Iout also depends on the channel modulation coefficient λ as well the ratio Wg0/Wg1 of the gate widths of the Q0 and Q1.

On the other hand, in the high frequency power amplifier circuit of this embodiment, when the current Iin applies to the biasing FET Q1 from a constant current circuit having the Q3, Q4, and the resistor R1, the voltage Vref expressed by the following formula is generated between the gate and source of the Q1.

$$Vref = \sqrt{(Iin/K1)} + Vth1 \tag{5}$$

Moreover, supposing the channel modulation coefficients of the Q0 and Q7 is λ, the current Idet applied to the FET Q7 that simulates the current Iout applied to the Q0 by applying to the gate the same voltage with same characteristic as the amplifying FET Q0 is expressed by the following formula.

$$Idet = (Wg7/Wg0) \cdot \{(1+\lambda Vds7)/(1+\lambda Vds0)\} \cdot Iout \quad \text{Formula (6)}$$

Where, because Vds7=Vdd−Vgs6, Formula (6) is transformed as the following formula.

$$Idet = (Wg7/Wg0) \cdot \{(1+\lambda(Vdd+Vgs6)/(1+\lambda Vds0)) \cdot Iout \tag{7}$$

Where, supposing the Vdd is sufficiently higher than the Vgs6, the aforementioned formula is established.

$$Idet = (Wg7/Wg0) \cdot \{(1+\lambda(Vdd)/(1+\lambda Vds0)) \cdot Iout \tag{8}$$

This current Idet is transferred to the MOSFET Q5 by a current mirror and applies to the FET Q2. Accordingly, the current Iret applied to the Q2 is Iret=(Wg5/Wg6)·Idet+Ioff. Because Ioff is so small that can be ignored in comparison with the Iret, the Ioft can be regarded as Iret=(Wg5/Wg6)·Idet. At this occasion, when a power voltage is fully high so that the Q2 can operate in a saturation area, the voltage Vret expressed by the following formula $$Vret = \sqrt{(Iret/K2)} + Vth2 \tag{9}$$

is generated in a drain pin when Iret is applied to the Q2. Where, supposing the Q1 and Q2 are elements of the same characteristic, K2=K1 and Vth2=Vth1. Accordingly, Formula (9) appears as $$Vret=\sqrt{(Iret/K1)}+Vth1.$$

In the high frequency power amplifier circuit of this embodiment, the voltage Vret generated in the drain of the Q2 and the reference voltage Vref generated in the drain of the FET Q1 are input to the differential amplifier AMP and feedback is applied so that the Vret can match the reference voltage Vref. Accordingly, even if the gate lengths of the Q1 and Q7 are short and the channel modulation coefficient λ scatters due to a short channel effect, and the current Iout of the Q0 shifts from a desired value, the current Idet of the Q7 shifts in the same manner and such a voltage that corrects the current Idet is applied from the differential amplifier AMP to the gates of the FETs Q0 and Q7. As a result, even if the amplifying FET Q0 is put into a short channel to improve an amplifying characteristic, the idle current Iout that does not depend upon element scattering can be applied to the Q0. Subsequently, the relationship shown by the following formula $$Idet/Iout=Wg7/Wg0$$

is established between the current Iout applied to the amplifying FET Q0 and the current Idet applied to the simulating FET Q7 at that occasion, and the current that corresponds to the ratio Wg7/Wg0 of the gate width flows to the Q0 and Q7.

Moreover, when the voltage that corresponds to the gate voltage Vref of the diode-connected FET Q1 to which the current Iin flows is applied, and the Q3 and Q4 operate in a saturation area, the Iin will not vary even if the power voltage Vdd varies. Accordingly, the idle current Iout that does not depend on the power voltage Vdd can be applied to the amplifying FET Q0.

At this point, an element characteristic and size in the high frequency power amplifier circuit of this embodiment are mentioned. With regard to the FETs (FETs that construct the Q3, Q4, Q5, and Q6, and amplifier AMP) other than the FET described below, an element formed in a general CMOS process is used. Moreover, with regard to a gate length, when a short channel effect occurs in these FETs Q3, Q4, Q5, and Q6, the object feedback control fails. Accordingly, the gate length is set to 0.5 μm or longer (2 μm in this embodiment).

In the high frequency power amplifier circuit of this embodiment, the simulating FET Q7 simulates the output current Iout of the amplifying FET Q0. Accordingly, the gate length is also the same (0.3 μm) as the Q0 so that the Q7 can be formed in the same process and the same short channel effect as the Q0 occurs. With regard to the gate width of the FET Q7, because current consumption increases exceedingly when the gate width of the Q7 is the same as the Q0, for example, about several 10 μm or a hundred several 10 μm is selected in accordance with the gate width of the Q0.

The voltages Vref and Vret generated in the drains of the FETs Q1 and Q2 are used as the differential input of the differential amplifier AMP and the gate voltage Vgs0 for applying a desired output current Iout is generated by the amplifying FET Q0 with the V ref as a reference. Accordingly, the Q1 and Q2 have gate lengths that will not generate a short channel effect, and the gate length of the Q1 must be equal to the gate length of the Q2. For example, as such a gate length, a value of 0.5 μm is supposed. Moreover, the gate widths of the Q1 and Q2 are determined in consideration of the controllability of an output current Iout. As such a gate width, for example, such a value as 100 to 200 μm is supposed.

Further, in this example, the FETs Q1 and Q2 use an element (power MOS) formed in the same process as an amplifying FET, but can have a standard N-channel MOSFET; However, when the Q1 and Q2 have the standard N-channel MOSFET, the gate length increases in comparison with the power MOS. Accordingly, in/order to apply a desired current, a gate width must be designed more largely than the case where the Q1 and Q2 have the power MOS. Consequently, it is desirable that the Q1 and Q2 should have the power MOS from the standpoint of reduction in power consumption and reduction in a chip area as shown in this embodiment.

Figure 2A:
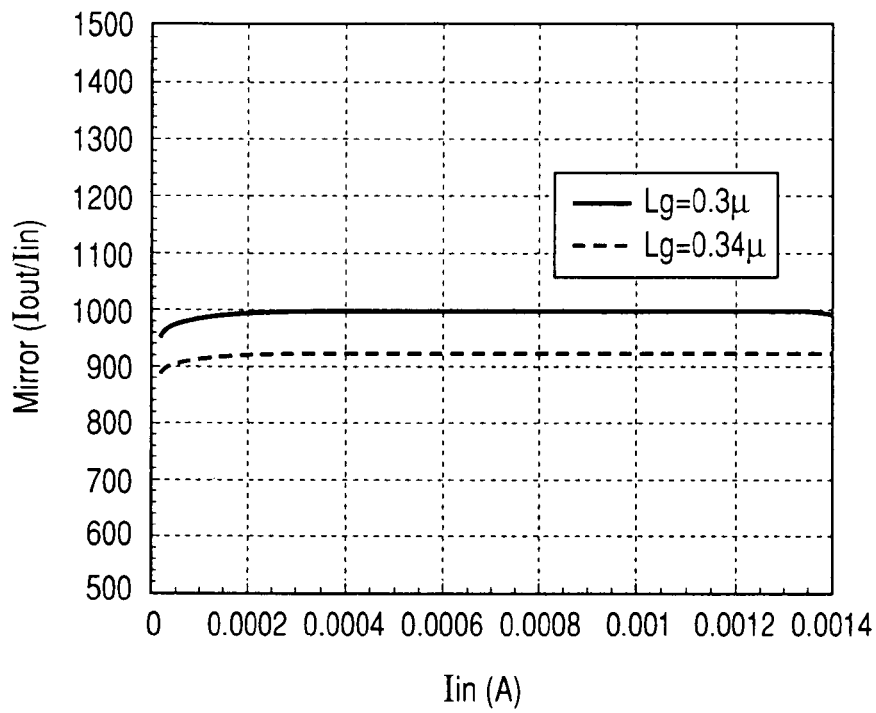
Figure 2B:
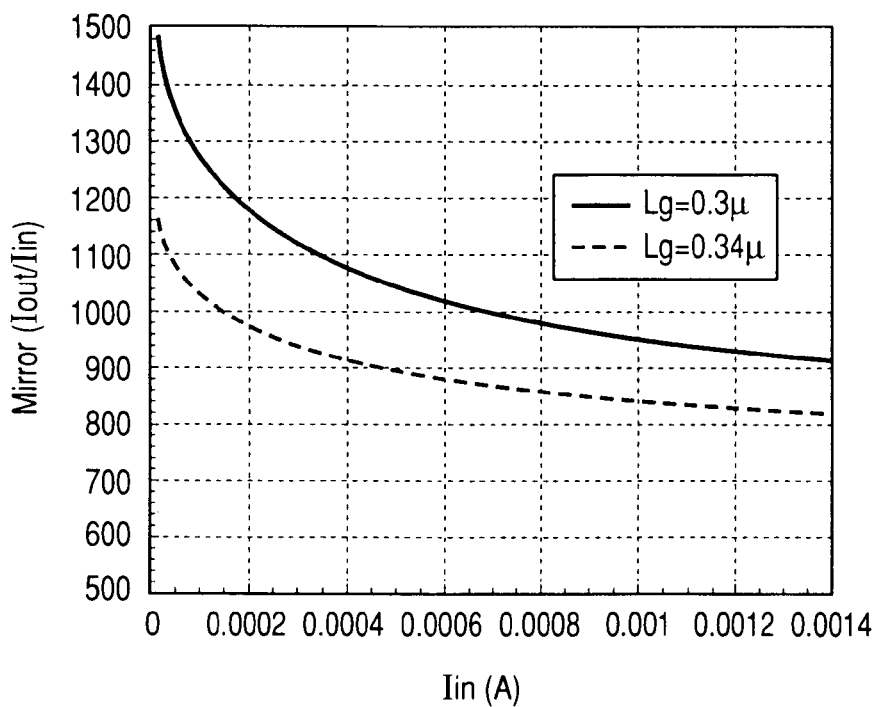

FIG. 2A shows the relationship between the input current Iin applied in the FET Q1 and the output current Iout applied to the amplifying FET Q0 accordingly in this embodiment using the input current Iin as the horizontal axis and a mirror ratio (Iout/Iin) as the vertical axis. In FIG. 2A, a bold line shows the relationship between Iin and Iout when the gate lengths Lg of the Q1 and Q2 are 0.3 μm, and a thin line shows the relationship between the Iin and Iout when the gate lengths of the Q1 and Q0 are 0.34 μm respectively. Moreover, for comparison, FIG. 2B shows, in a high frequency power amplifier circuit that supplies a bias by the conventional current mirror method of FIG. 12, the relationship between the input current Iin and the output current Iout when the gate length Lg shifts from 0.3 μm to 0.34 μm using the input current Iin as the horizontal axis and a mirror ratio (Iout/Iin) as the vertical axis. In FIG. 2B, a bold line shows the relationship between Iin and Iout when the gate lengths Lg of the Q1 and Q0 are 0.3 μm, and a thin line shows the relationship between the Iin and Iout when the gate lengths of the Q1 and Q0 are 0.34 μm respectively.

In comparison with FIG. 2A and FIG. 2B, when the gate length Lg scatters due to manufacturing scattering in a conventional circuit, the ratio (Iout/Iin) of Iin and Iout varies with the size of Iin due to a short channel effect. However, in the high frequency power amplifier of this embodiment, even if the gate length Lg scatters due to the manufacturing scattering, it proves that the relationship between the Iin and Iout hardly varies. Moreover, in an area in which the current Iin is 0.2 mA or more, the relationship between the Iin and Iout is almost linear, and, according to the circuit format of the embodiment of FIG. 1, it proves that the Iout can vary linearly by varying the Iin. However, in the high frequency power amplifier circuit of the embodiment of FIG. 1, an external resistor R1 is adjusted so that the current Iin applied to the FET Q1 can range from 0.4 to 1 mA, and the Iout performs amplification operation in a fixed state.

Further, because the high frequency power amplifier circuit of this embodiment of FIG. 1 is a bias-fixed high frequency power amplifier circuit not having a power control pin, power control is effective for applying to a system. In the power control, the system controls output power, for example, in a more previous stage than the external pin P2, by such a bias-fixed/input variable method that varies the amplitude of the high frequency signal RFin input to the gate pin of the amplifying Q0 in accordance with the output control voltage Vapc. As such a system, there is a cellular phone that enables communication of an EDGE (enhanced data rates for GSM evolution) method or a WCDMA (wide-band code division multiple access) method.

Embodiment 2

Next, a second embodiment of a high frequency power amplifier circuit according to the present invention is described with reference to FIG. 3.

A cellular phone of a GSM (global system for mobile communication) method is constructed so that the output power of the high frequency power amplifier circuit can be controlled by the output control voltage Vapc. FIG. 3 is an embodiment of the high frequency power amplifier circuit in which the output power control by such a Vapc is enabled. FIG. 3 differs from the high frequency power amplifier of the embodiment of FIG. 1 in that a bias current applied to the amplifying FET Q0 is kept constantly by specifying the current Iin applied from the constant current circuits (Q3 and Q4) that construct the reference circuit 11 to the amplifying FET Q1 to be a predetermined current value (fixed). To the contrary, in this embodiment (FIG. 3), the idle current Iout applied to the amplifying FET Q0 varies by allowing the reference bias circuit 11 to apply the current Iin that corresponds to the output control voltage Vapc to the FET Q1.

Accordingly, this embodiment has a current control circuit 14 that includes a voltage-current conversion circuit 141 for converting the output control voltage Vapc input to an external pin P4 and a variable current source 142 for varying the current Iin applied to the FET Q1 in accordance with the current from the voltage-current conversion circuit 141. FIG. 4 shows the relationship between the input/output characteristic, that is, the output control voltage Vapc of the current control circuit 14 and the current Iin applied to the FET Q0.

As shown in FIG. 4, in this embodiment, the current Iin increases almost linearly from a certain voltage (starting point) Vsp in accordance with the output control voltage Vapc. Moreover, the current control circuit 14 is constructed so that the starting point Vsp from which the current Iin starts increasing according to the resistance value of the external resistor R1 is determined.

Figure 4A:
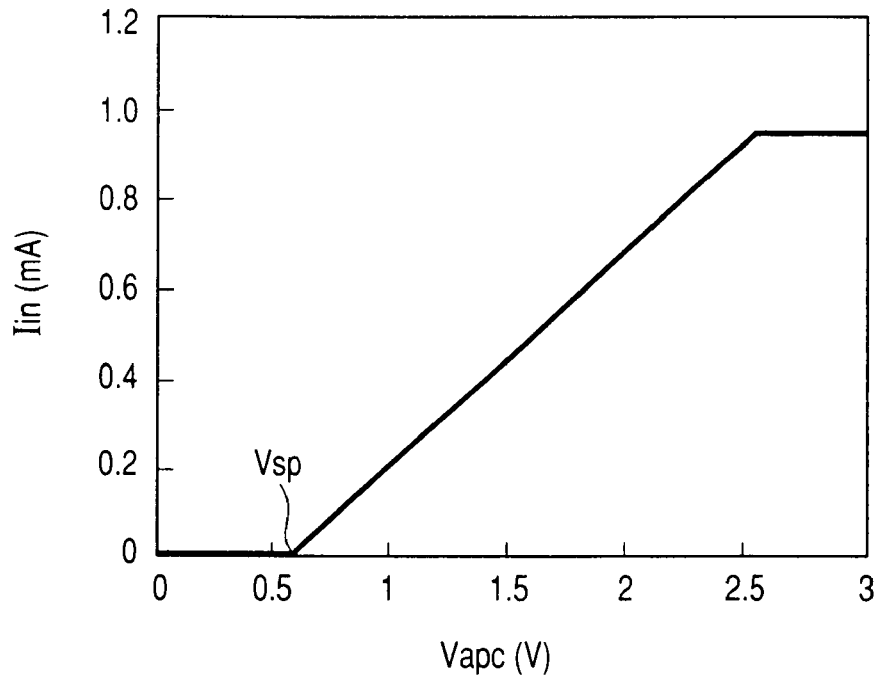
FIG. 4A is a characteristic diagram showing the relationship between an output power control voltage Vapc and the current Iin of the bias circuit in the high frequency power amplifier circuit of a third embodiment.
Figure 4B:
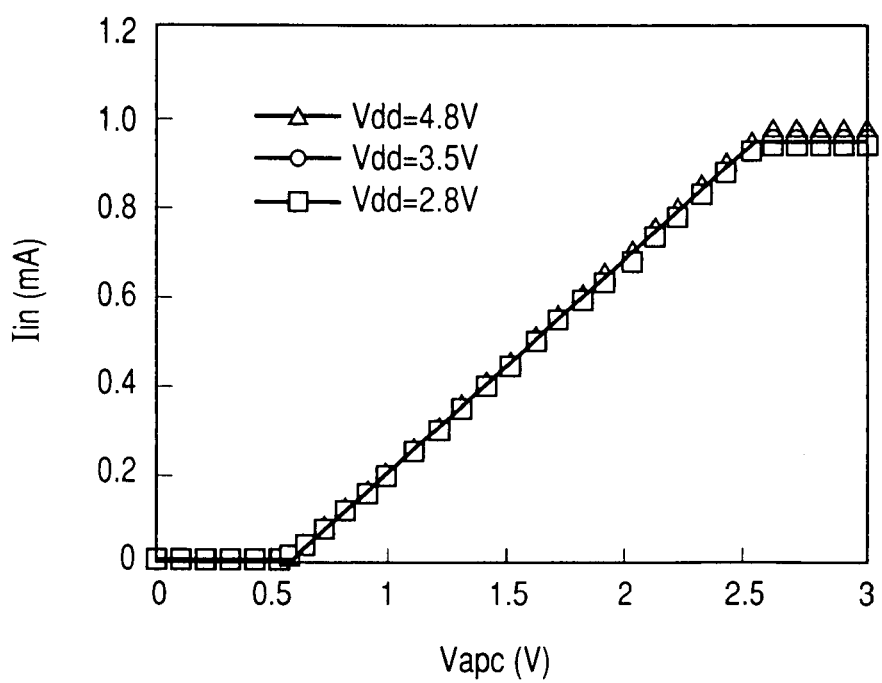
FIG. 4B is a characteristic diagram showing the relationship between the control voltage Vapc and the current Iout applied to the amplifying FET Q0.

A circuit for outputting the current Iin that varies in the characteristic shown in FIG. 4A in accordance with the output control voltage Vapc can be designed comparatively easily by a conventional technology and circuits of various circuit forms are supposed. Accordingly, a specific circuit example is not illustrated, but, for example, it is supposed that an FET in which the output power control voltage Vapc is applied to a gate pin is provided between the FET Q3 and the external pin P3 of the reference bias generation circuit 11. The current Iin varies in the characteristic shown in FIG. 4A in accordance with the output control voltage Vapc. Consequently, in the high frequency amplifier circuit of this embodiment, the idle current Iout applied to the amplifying FET Q0 will vary in the same characteristic shown in FIG. 4B in accordance with the output power control voltage Vapc.

Figure 14A:
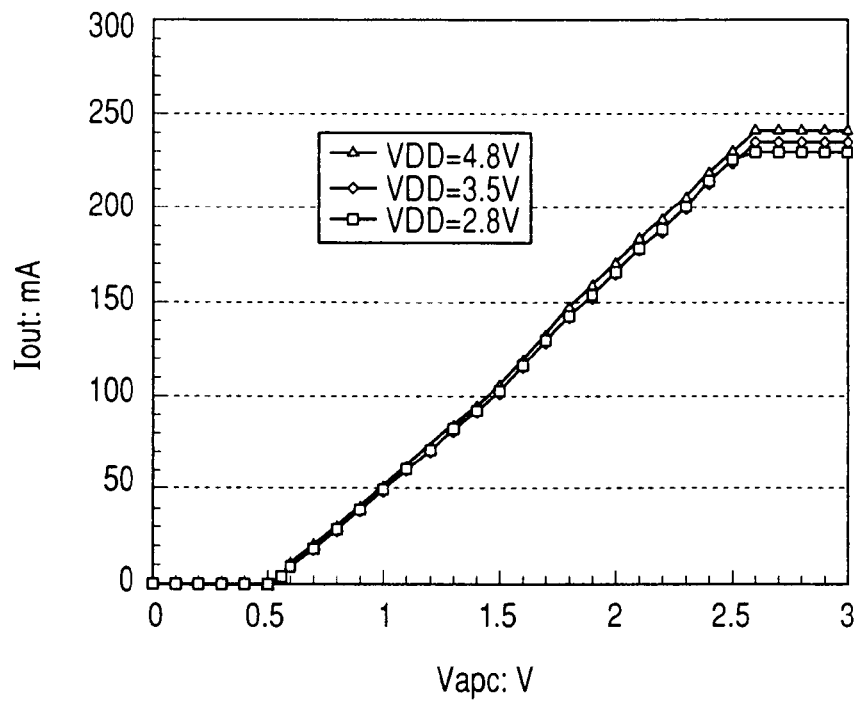
FIG. 14A is a graph showing the relationship between the output power control voltage Vapc and an idle current Iout in the high frequency power amplifier circuit.
Figure 14B:
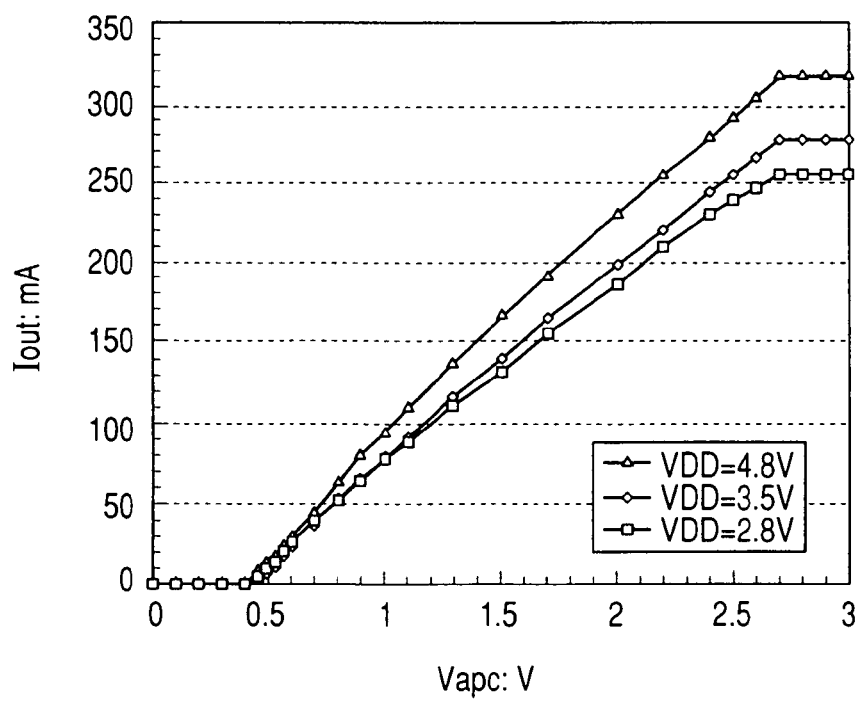
FIG. 14B is a graph showing the output power control voltage Vapc and the idle current Iout in the conventional high frequency power amplifier circuit of FIG. 12.

FIG. 14A shows a result of the relationship between the output power control voltage Vapc and the idle current Iout obtained by simulation. At this occasion, in the high frequency power amplifier circuit of this embodiment, the gate width Wg of the amplifying FET Q0 is set to 16 mm and the power voltage Vdd varies into 2.8 V, 3.5 V, and 4.8 V. For comparison, FIG. 14B shows the relationship between the output power control voltage Vapc and the idle current Iout when the power voltage Vdd varies in the same manner in the high frequency power amplifier circuit that supplies a bias by the conventional current mirror method of FIG. 12. As shown in FIG. 14, it proves that the conventional (FIG. 12) high frequency power amplifier circuit allows the idle current Iout to have power voltage dependency, while the high frequency power amplifier circuit of this embodiment does not have the power voltage dependency.

Embodiment 3

Next, a third embodiment of a high frequency power amplifier circuit according to the present invention is described with reference to FIG. 5.

Figure 3:
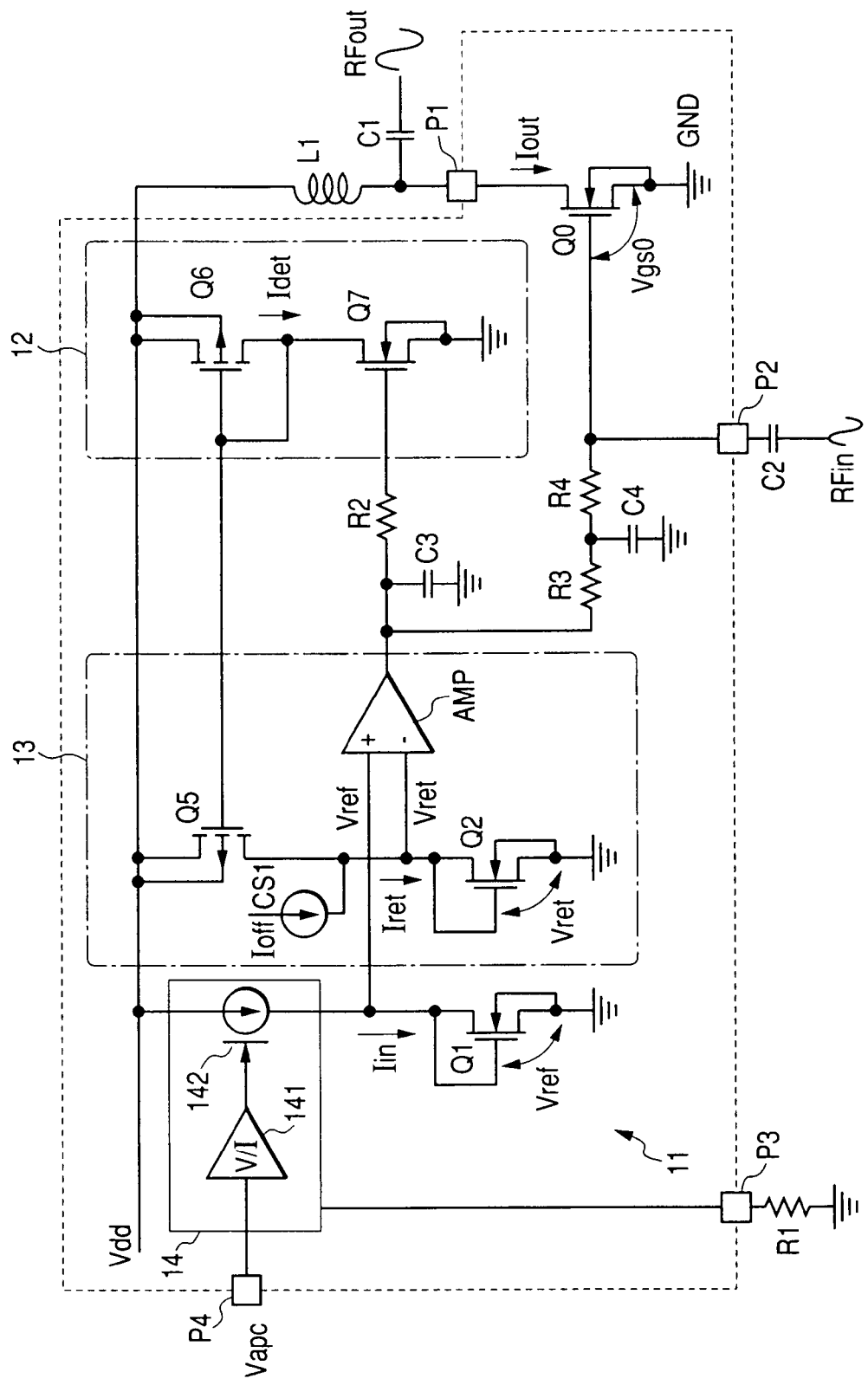
FIG. 3 is a circuit block diagram showing a second embodiment of the high frequency power amplifier circuit according to the present invention.

This embodiment allows the high power amplifier circuit of the example of FIG. 3 to have two semiconductor chips and to provide a detection circuit (current sense circuit) for detecting output power (Power). The output power detection circuit in this embodiment has a detecting FET Q9 in which the same voltage as the voltage input to the gate pin of the amplifying FET Q0 is input to the gate pin through a resistor R5, a current mirror circuit 15 that transfers the drain current applied to the FET Q9, and an external resistor R6 that converts the current transferred from the current mirror circuit 15 into a voltage.

The FET Q9 for detecting output power is an element of the same characteristic having the same gate length formed in the same process as the amplifying FET Q0 and is formed so as to have a smaller gate width than the Q0, whereby a reduced current that is proportional to the ratio of a gate width with regard to the Q0 current flows to the Q9. With regard to the output power detection circuit of such a current detection method, several patent applications have already been submitted by this applicant, but a detailed operation is not described because the detailed operation is not the purview of the present invention.

In this embodiment, the amplifying FET Q0, the simulating FET Q7, and the output power detecting FET Q9 are formed on a semiconductor chip 12 separately from a semiconductor chip 110 on which another FET (FETs Q1, Q2, Q5, and Q6, and an FET having the current control circuit 14 and amplifier AMP). Further, the FET having the current mirror circuit 15 that transfers the drain current applied to the FET Q9 is formed on the semiconductor chip 110 together with the FETs Q1 and Q2 that constructs a bias circuit.

An external resistive element is used as the resistor R6 that converts the current transferred by the current mirror circuit 15 into a voltage in order to improve the accuracy of an output voltage Vsns. The mirror ratio of the current mirror circuit 15 and the resistance value of the resistor R6 are set so that the voltage that matches the voltage of the output pin P1 to which the drain pin of the amplifying FET Q0 is connected can appear in an external pin P5 to which the resistor R6 is connected.

The detection voltage Vsns converted by this resistor R6 is input to an error amplifier 16 to which an output level instruction signal Vramp supplied from a baseband circuit that is not illustrated in accordance with a distance from a base station is input. The error amplifier 16 outputs a voltage that corresponds to the potential difference between the detection voltage Vsns and the output level instruction signal Vramp, and the voltage is supplied to the external pin P4 of the semiconductor 110 on the bias circuit side as the output control voltage Vapc. Accordingly, a feedback control loop that controls the bias current of the amplifying FET Q0 is formed so that the detection voltage Vsns can match the output level instruction signal Vramp, and operates so that the output power varies in accordance with the output level instruction signal Vramp.

In this embodiment, because the amplifying FET Q0, the simulating FET Q7, and the output power detecting FET Q9 are formed on a separate semiconductor chip, the characteristic of each element can be optimized by forming two semiconductor chips through a separate optimum process respectively, and the process can be simplified in comparison with the case where the two semiconductors are formed on a single semiconductor chip. Accordingly, a total chip cost can be reduced as an advantage.

Embodiment 4

Figure 6:
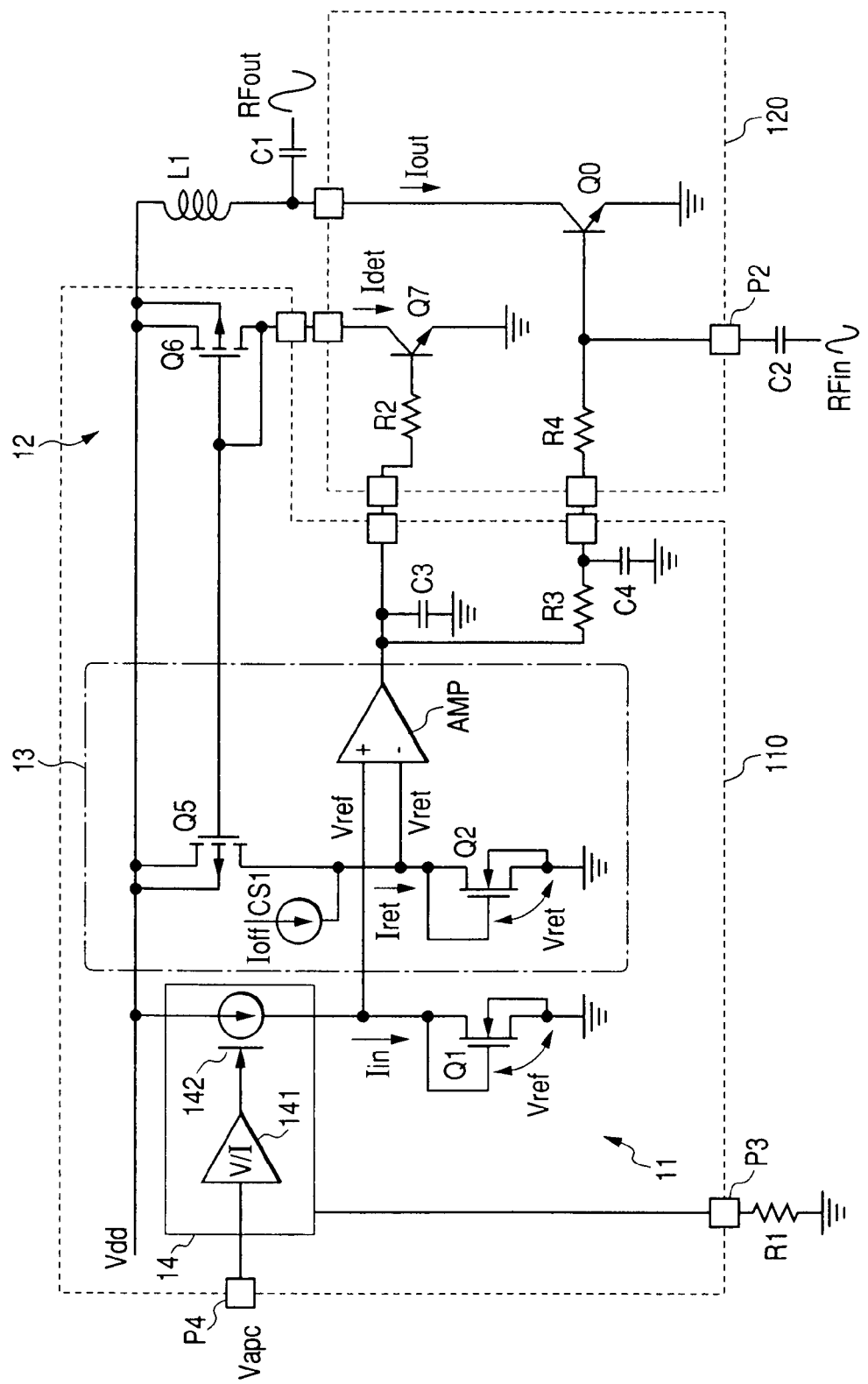
FIG. 6 is a circuit block diagram showing a fourth embodiment of the high frequency power amplifier circuit according to the present invention.

FIG. 6 shows a fourth embodiment of a high frequency power amplifier circuit according to the present invention.

Figure 5:
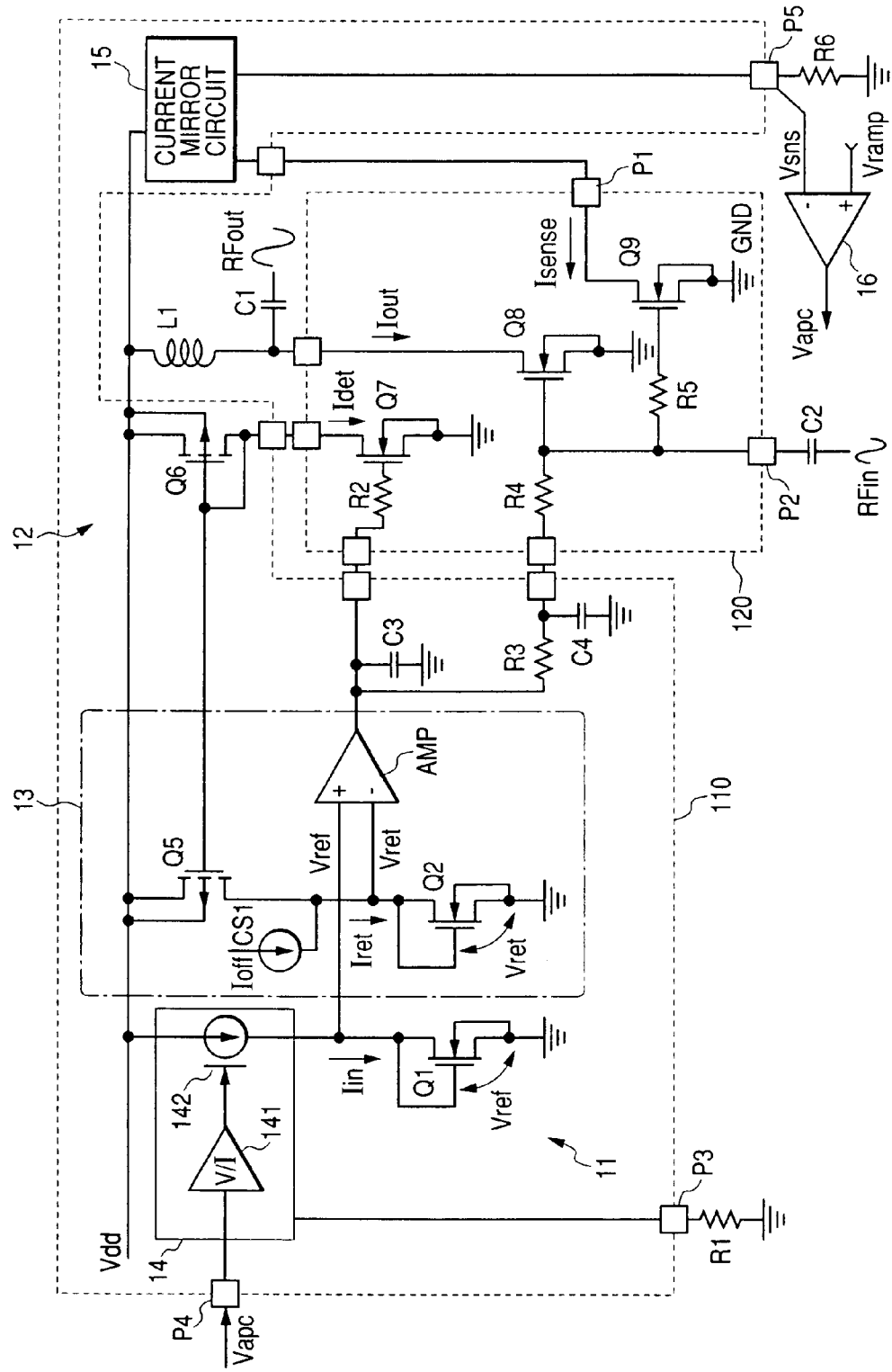
FIG. 5 is a circuit block diagram showing the third embodiment of the high frequency power amplifier circuit according to the present invention.

This embodiment allows the amplifying transistor Q0 and the simulating transistor Q7 of the high frequency power amplifier circuit of the embodiment of FIG. 1 to have a bipolar transistor instead of an FET, and the entirety of the circuit to have two semiconductor chips in the same manner as the embodiment of FIG. 5.

A bipolar transistor does not have such a short channel effect as an FET However, by using the bipolar transistor whose base thickness is thinned as the amplifying transistor Q0 in order to improve a high frequency power amplifying characteristic, even if a base-emitter voltage is kept constantly, an Early effect that an effective base width decreases and a collector current increases as a collector-emitter voltage increases. Accordingly, if the base thickness of the amplifying transistor Q0 scatters due to manufacturing scattering, a base bias point scatters every chip by the effect of the Early effect, and there is a possibility of the stability of the high frequency power amplifying characteristic not being obtained.

At this point, this embodiment has, in the same manner as the embodiment of FIG. 1, the reference bias circuit 11 that generates the reference voltage Vref by the diode-connected transistor Q1, the current simulating circuit 12 including the simulating transistor Q7 that has the same characteristic of the amplifying transistor Q0 and applies to a proportional current, and the correction circuit 13 that generates a bias voltage so that a detected current is converted into a voltage, and the voltage is compared with the reference voltage Vref, then a current shift generated due to the scattering of the base thickness of the amplifying transistor Q0 is corrected. Accordingly, even if the base thickness of the amplifying transistor Q0 is thinned in order to improve a high frequency amplification power amplifying characteristic using a bipolar transistor as the amplifying transistor Q0, the scattering of the base bias point due to the Early effect is reduced, and the stability of the high frequency power amplifying characteristic can be improved.

Moreover, also in this embodiment, because the amplifying transistor Q0 and the simulating transistor Q7 having a bipolar transistor are formed on a separate semiconductor chip 120 from the semiconductor chip 110 on which Q1 to Q6 are formed, a process can be simplified by forming two semiconductor chips through a separate optimum process respectively in comparison with the case where both the Q0 and Q7 are formed a single semiconductor chip. Accordingly, a chip cost can be reduced as an advantage. Further, the bipolar transistor used in this example can also be formed on a silicon chip, but, desirably, the bipolar transistor should have a hetero-junction bipolar transistor having a more excellent amplifying characteristic.

Next, a modification of a high frequency power amplifier circuit according to the present invention is described.

Figure 7:
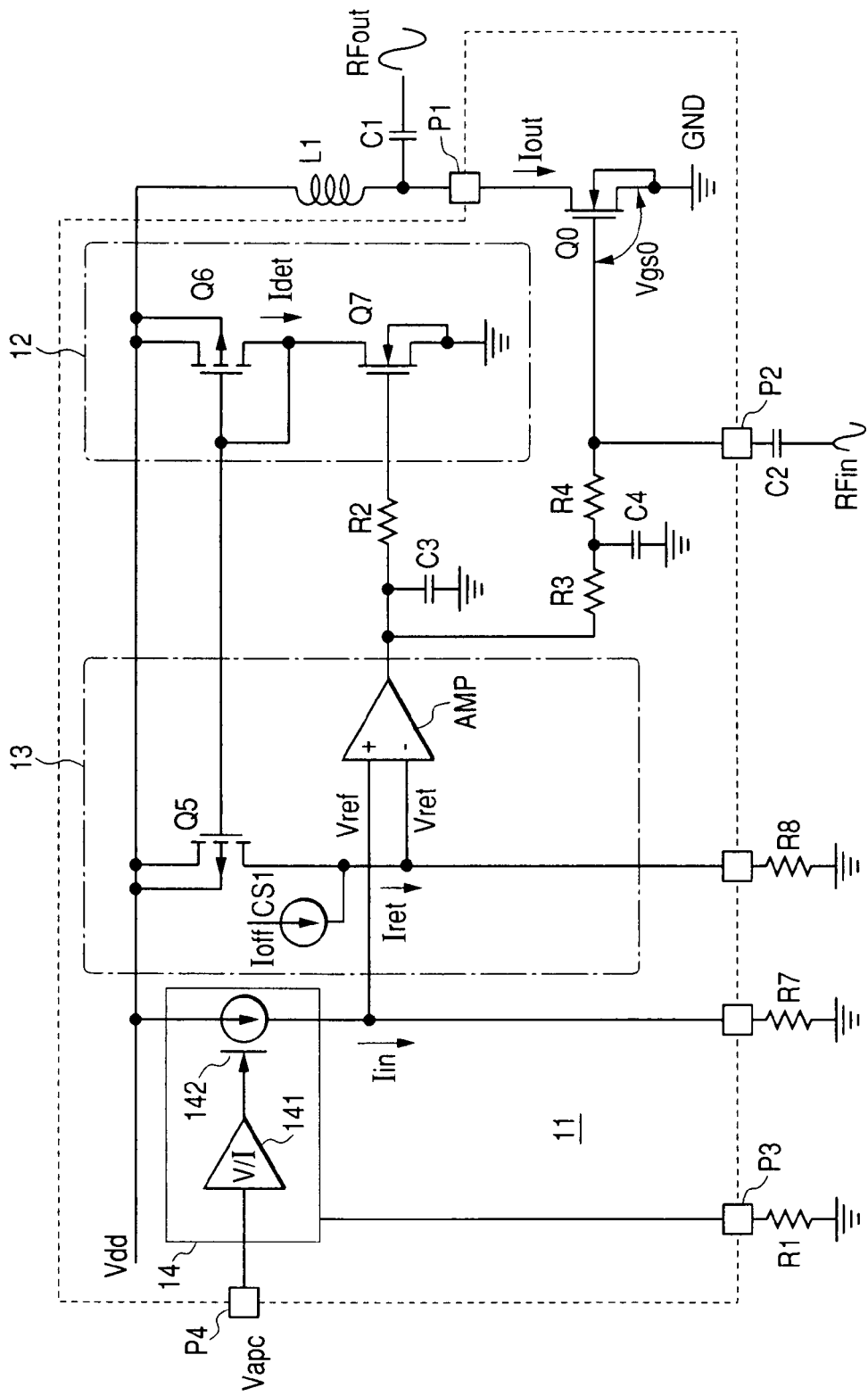
FIG. 7 is a circuit block diagram showing a first modification of the high frequency power amplifier circuit according to the present invention.

FIG. 7 shows a first modification. This modification uses resistors R7 and R8 as the current-voltage converting FET Q1 that constructs the reference bias circuit 11 and the current-voltage converting FET Q2 that constructs the bias correction circuit 13 instead of a diode-connected FET. These resistors R7 and R8 can be on-chip elements, but, desirably, the resistors R7 and R8 should be provided as external elements in order to compensate the scattering of the characteristic of the amplifying FET Q0 caused by a production process. FIG. 7 shows, in the second embodiment of FIG. 3, that the FETs Q1 and Q2 are replaced with the resistors R7 and R8. However, in the embodiments of FIG. 1, FIG. 5, and FIG. 6, modifications in which the Q1 and Q2 are replaced with the resistors R7 and R8 are also possible.

Figure 8:
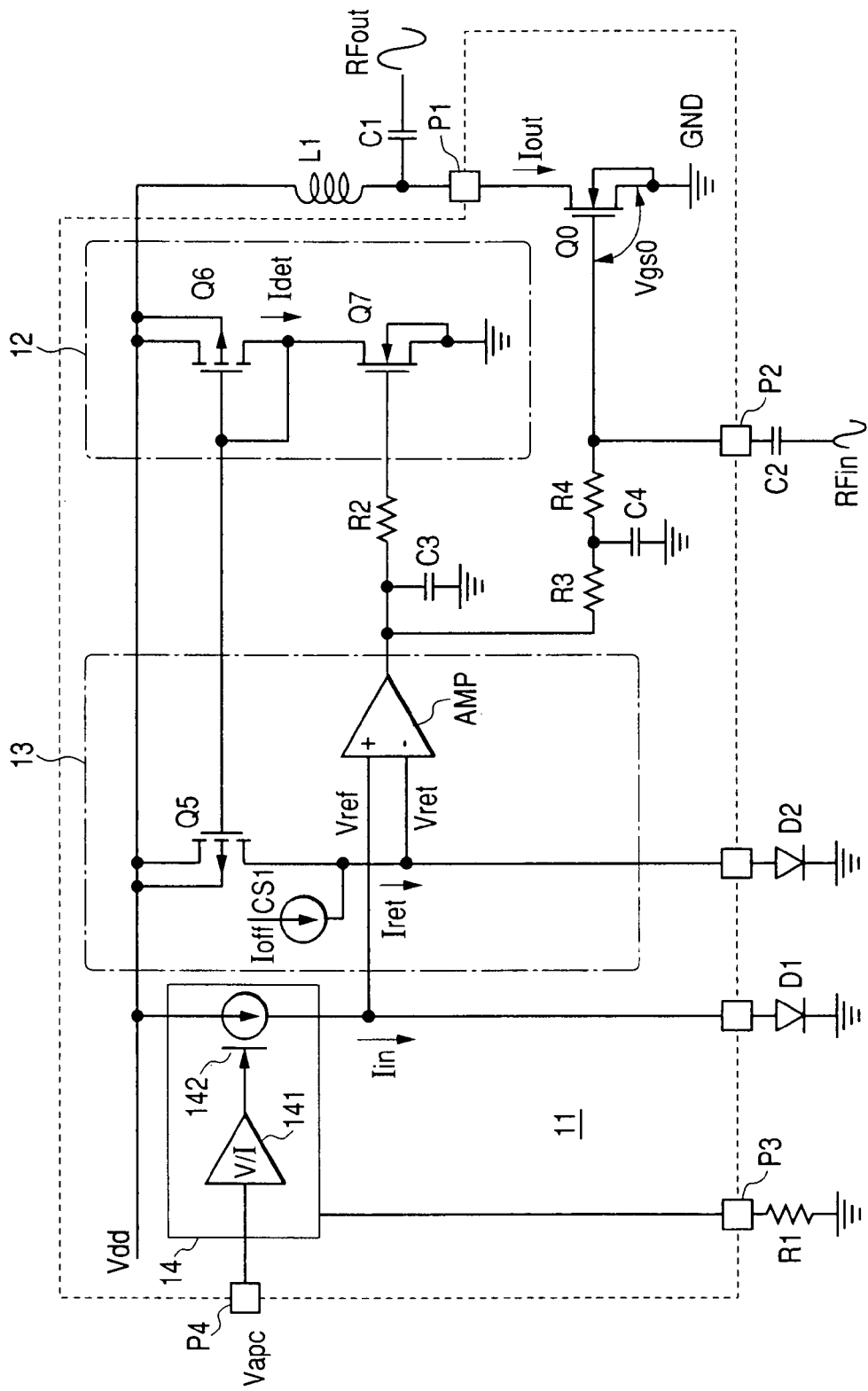
FIG. 8 is a circuit block diagram showing a second modification of the high frequency power amplifier circuit according to the present invention.

FIG. 8 shows a second modification. This modification uses PN-junction diodes D1 and D2 as the current-voltage converting FET Q1 that constructs the reference bias circuit 11 and the current-voltage converting FET Q2 that constructs the bias correction circuit 13 instead of a diode-connected FET. To compensate the scattering of the characteristic of the amplifying FET Q0 caused by a production process, these diodes D1 and D2 can be on-chip elements, but, desirably, the diodes should be provided as external elements.

FIG. 8 shows, in the second embodiment of FIG. 3, that the FETs Q1 and Q2 are replaced with the diodes D1 and D2. In the embodiments of FIG. 1, FIG. 5, and FIG. 6, modifications in which the FETs Q1 and Q2 are replaced with the diodes D1 and D2 are also possible.

As described above, an external resistive element or diode element is used as a current-voltage converting element to which the currents Iref and Iret apply instead of a diode-connected FET. Accordingly, even if the characteristics of the Q0 and Q1 scatter due to manufacturing scattering, a characteristic shift can be reduced by selecting and connecting the resistive elements R7 and R8 having the optimum resistance value or the diode elements D1 and D2 having the optimum forward voltage value.

Figure 9:
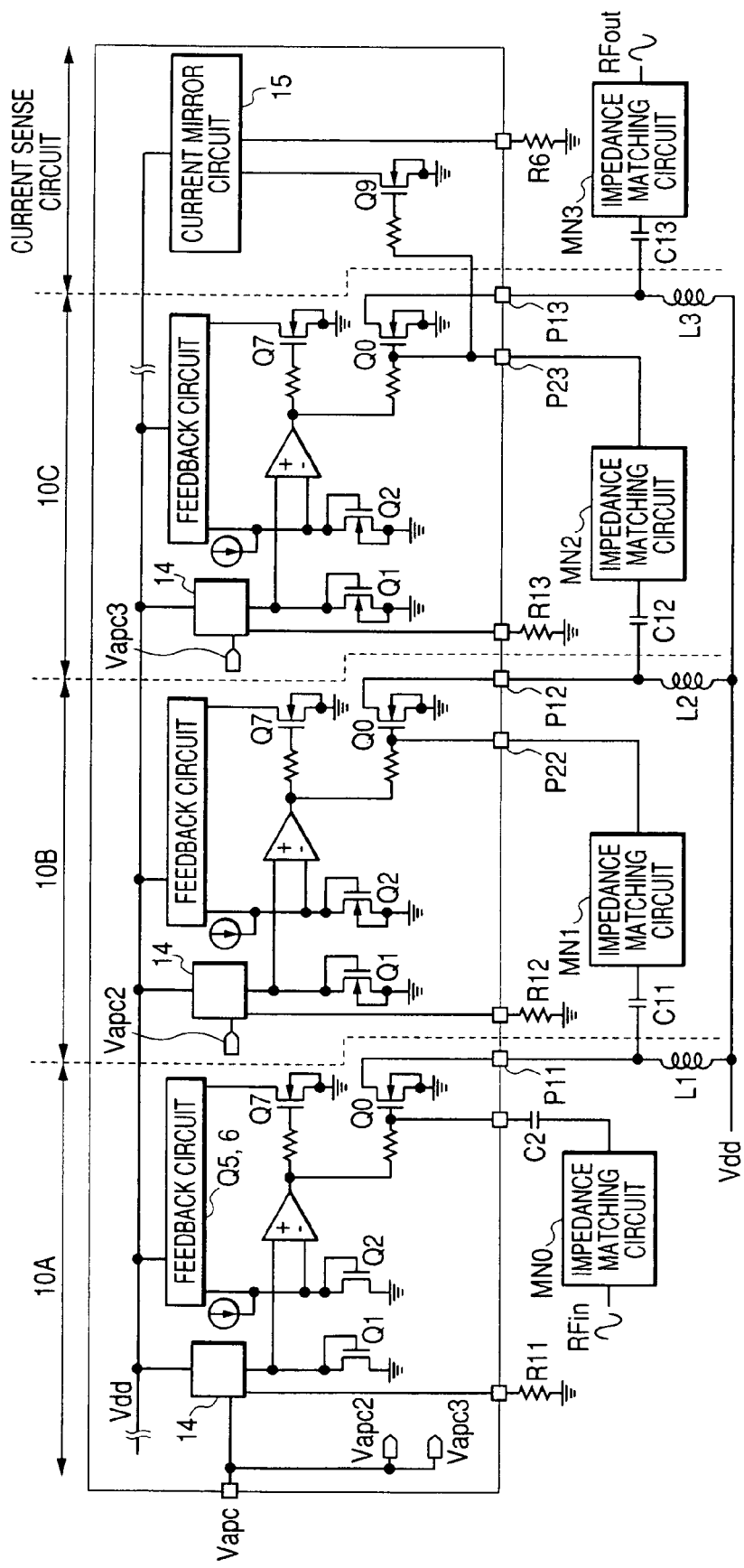
FIG. 9 is a circuit block diagram showing a third modification of the high frequency power amplifier circuit according to the present invention.

FIG. 9 shows a third modification. In this modification, a high frequency power amplifier circuit of three-stage composition is formed as a semiconductor integrated circuit on a single semiconductor chip. An output pin P11 of a first-stage amplifier stage 10A is connected to an output pin P22 of a second-stage amplifier stage 16B through a capacitor C11 and an impedance matching circuit MN1. An output pin P12 of the second-stage amplifier stage 10B is connected to an input pin P23 of a third-stage amplifier stage 10C through a capacitor C12 and an impedance matching circuit MN2. The FET Q9 that constructs an output power detection circuit and the current mirror circuit 15 are provided corresponding to the third-stage amplifier stage 10C.

The semiconductor integrated circuit of this embodiment is mounted on an insulating substrate, such as a ceramic insulating substrate, together with the capacitors C2, C11, C12, and C13 for cutting off a direct current and external resistors R11 to R13, the inductors L1 to L3, and impedance matching circuits MN0 to MN4, and constructed as a module. The inductors L1 to L3 or the impedance matching circuits MN0 to MN4 can be constructed using a microstrip line formed on the insulating substrate of the module. The capacitors C2 and C11 to C13 can also be discrete components. However, when a component in which multiple dielectric layers are laminated as the insulating substrate of the module is used, the component can also be the capacitor that uses a conductive layer formed on the front and rear of any of the dielectric layers so as to be opposed respectively as an electrode. The amplifier stage of each stage uses the embodiment of FIG. 4 as an example, but can also use the embodiment of FIG. 1 or the modification of FIG. 7 or 8.

The high frequency power amplifier circuit of this embodiment allows an FET having first-stage, second-stage, and third-stage amplifier stages to be formed on a semiconductor chip. Accordingly, as an advantage, a module can be miniaturized in comparison with another embodiment.

Figure 10:
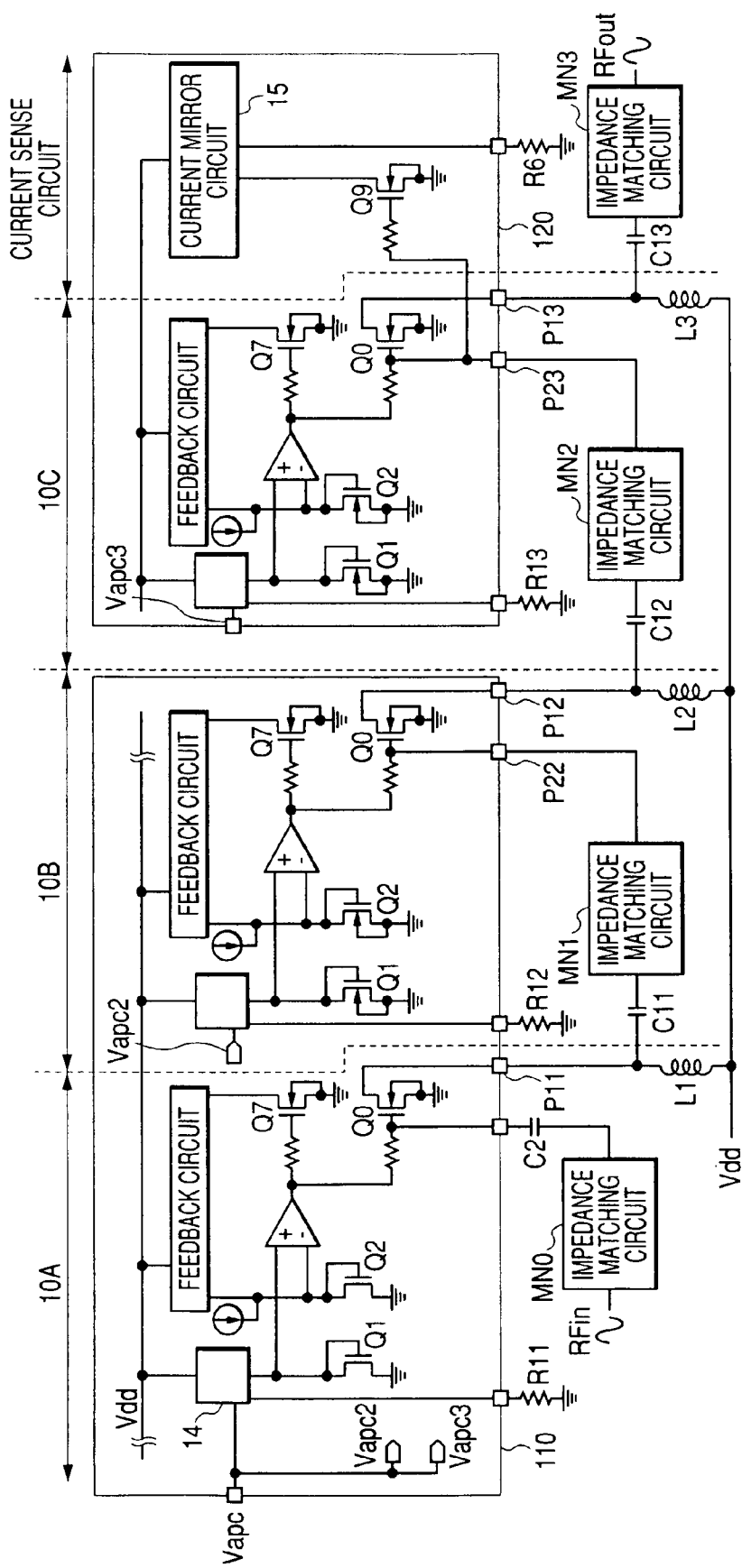
FIG. 10 is a circuit block diagram showing a fourth modification of the high frequency power amplifier circuit according to the present invention.

FIG. 10 shows a fourth modification. This modification shows that a high frequency power amplifier circuit of three-stage composition is formed on the two semiconductor chips 110 and 120 as a semiconductor integrated circuit. Specifically, the first-stage amplifier stage 10A and the second-stage amplifier stage 10B are formed on the first semiconductor chip 110, and the third-stage amplifier stage 10C, the FET Q9 having an output power detection circuit, and the current mirror circuit 15 are formed on the second semiconductor chip 120. Other components are the same as the modification of FIG. 9.

The high frequency power amplifier circuit of this embodiment allows an FET having the first-stage and second-stage amplifier stages to be formed on a semiconductor chip 110. Accordingly, as an advantage, a module can be miniaturized in comparison with another example except the embodiment of FIG. 9. Moreover, the embodiment of FIG. 10 is inferior to that of FIG. 9 in respect of miniaturization, but the high frequency power amplifier circuit having a more excellent amplifying characteristic than the example of FIG. 9 as a whole can be realized as an advantage by forming the amplifying FET Q0 having each different characteristic in the first stage, second stage, and third stage.

Figure 11:
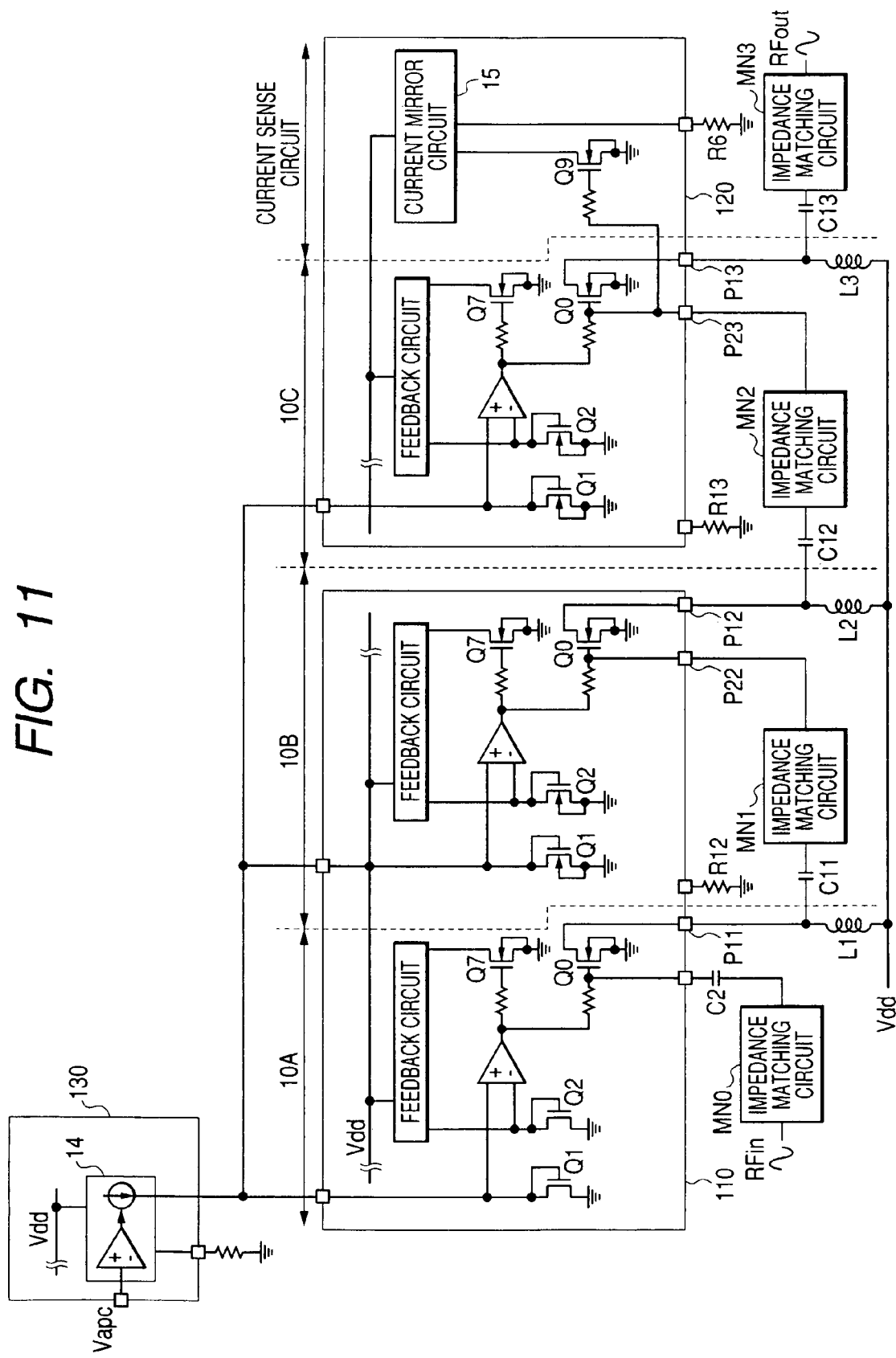
FIG. 11 is a circuit block diagram showing a fifth modification of the high frequency power amplifier circuit according to the present invention.

FIG. 11 shows a fifth modification. This modification allows a high frequency power amplifier circuit of three-stage composition to be formed on three semiconductor chips as a semiconductor integrated circuit. Specifically, the current control circuit 14 of each stage is formed on a first semiconductor chip 130 as a common current control circuit, and the first-stage amplifier stage 10A and the second-stage amplifier stage 10B except the current control circuit 14 are formed on the second semiconductor chip 110. Specifically, the three-stage amplifier stage 10C, the FET Q9 constituting an output power detection circuit, and the current mirror circuit 15 are formed on the third semiconductor chip 120. Other components are the same as the modification of FIG. 9.

The high frequency power amplifier circuit of this embodiment allows the current control circuit 14 of each stage to be formed on the independent semiconductor chip 130 as a common current control circuit. Accordingly, as an advantage, the second and third semiconductor chips 110 and 120 in which an FET that constructs an amplifier stage can be miniaturized in comparison with the embodiment of FIG. 10.

Embodiment 5

Figure 15:
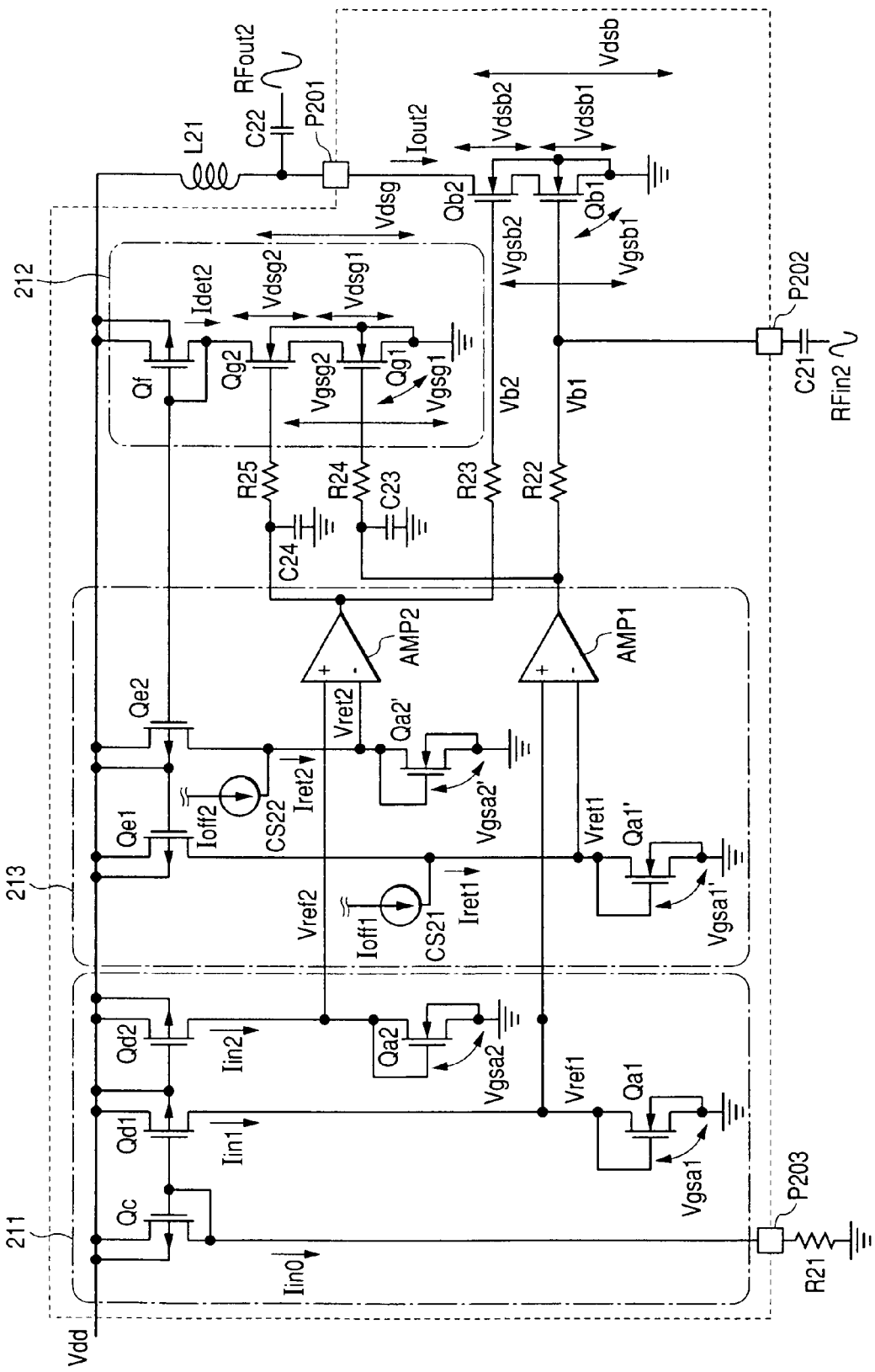
FIG. 15 is a circuit block diagram showing the fifth embodiment of the high frequency power amplifier circuit according to the present invention.
Figure 21:
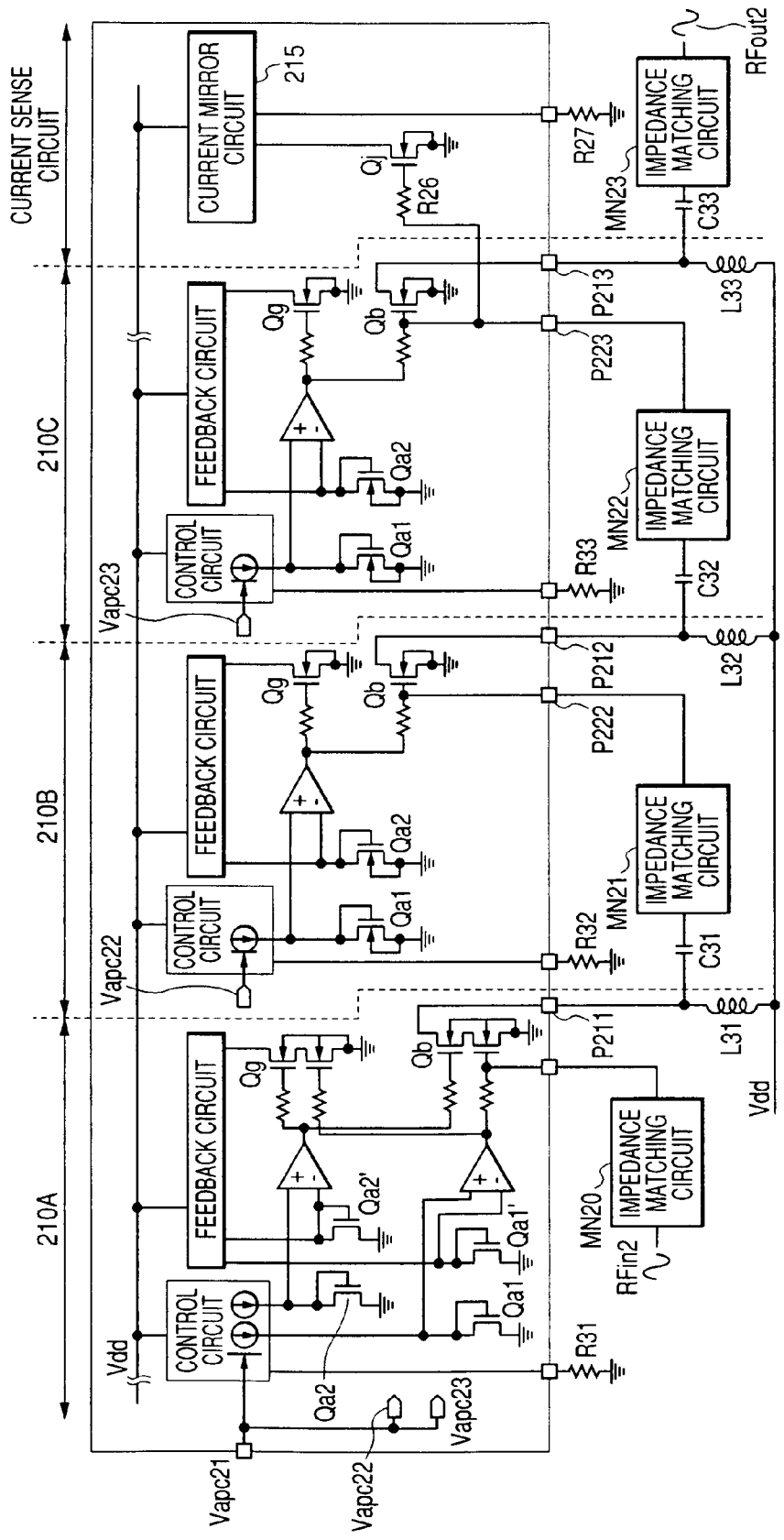
FIG. 21 is a circuit block diagram showing the fifth modification of the high frequency power amplifier circuit according to the present invention.
Figure 22:
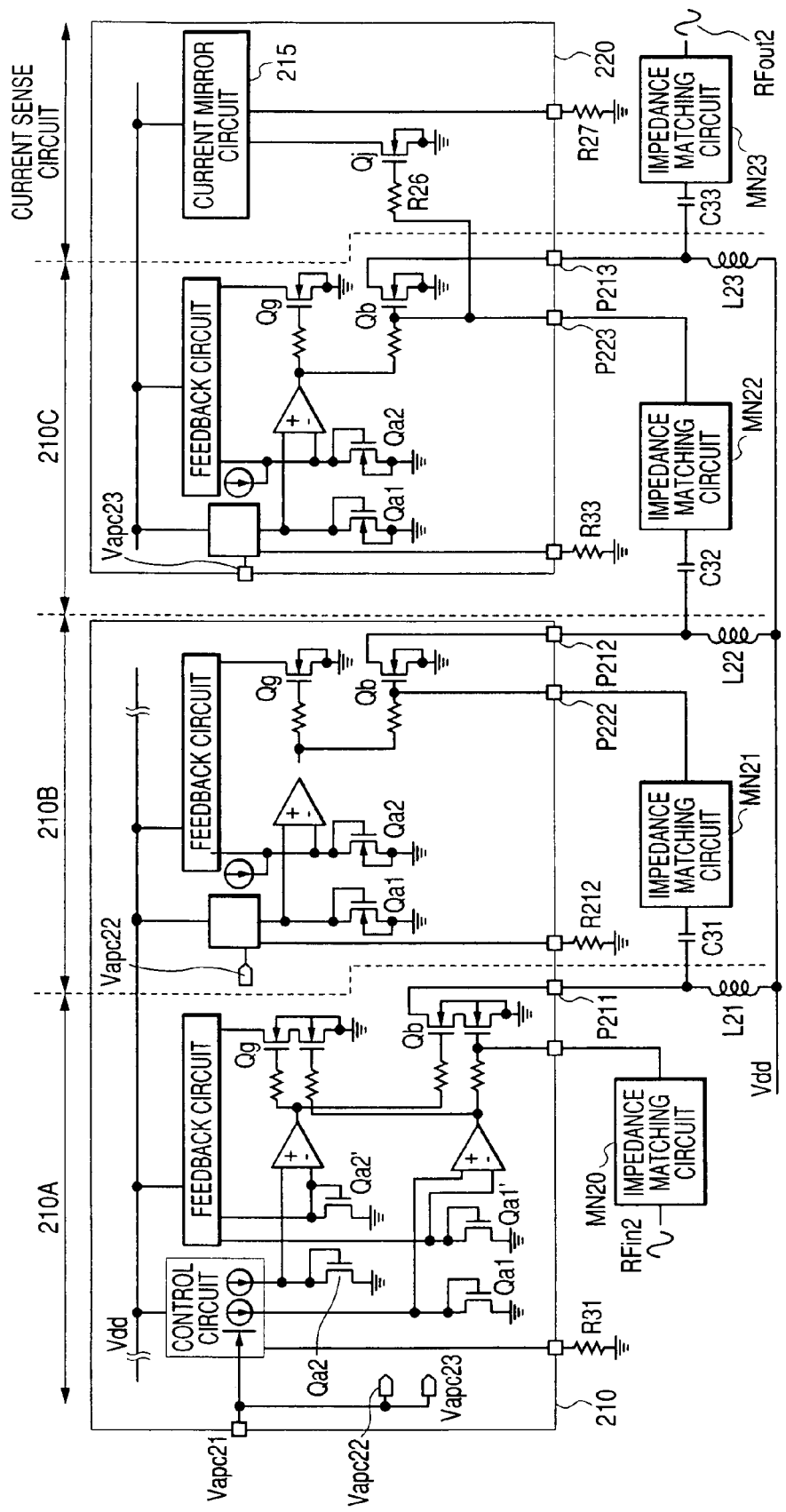
FIG. 22 is a circuit block diagram showing a sixth modification of the high frequency power amplifier circuit according to the present invention.
Figure 23:
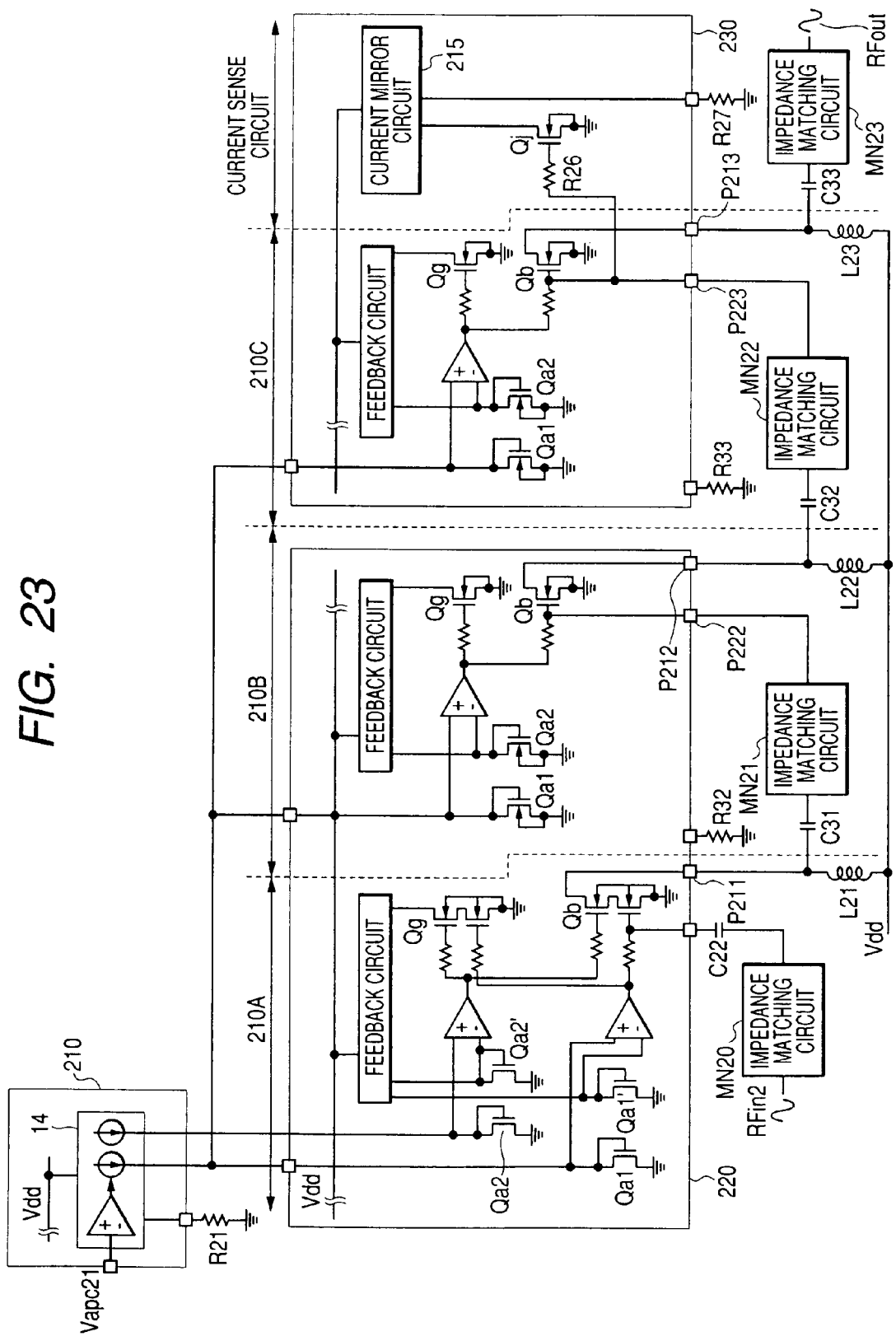
FIG. 23 is a circuit block diagram showing a seventh modification of the high frequency power amplifier circuit according to the present invention.

FIG. 15 shows rough composition of a fifth embodiment of a high frequency power amplifier circuit according to the present invention. Although not limited in particular, three high frequency power amplifier circuits having such composition as the embodiment of FIG. 15 are connected in a cascade, for example, and mounted on an insulating substrate, such as a ceramic insulating substrate, together with an external resistive element or a capacitive element, to constitute an RF power module (FIGS. 21 to 23). Further, cascade connection means that each high frequency power amplifier circuit is connected so that the previous-stage high frequency output can be input to the next-stage input pin. The high frequency power amplifier circuit of each stage is the same as FIG. 15 as the composition respectively. However, the high frequency power amplifier circuit of this embodiment differs in the size (gate width) of an amplifying FET, and the amplifying FET of a broader size is used in the order of the first stage, second stage, and third stage. In the FET of this embodiment, because a channel length is equal to a gate length, and a channel width is equal to a gate width, the channel gate and the channel width are described below as the gate length and the gate width.

The high frequency power amplifier circuit of this embodiment has FETs Qb1 and Qb2 connected in series between an output pin (pad) P201 and the ground point GND and a reference bias circuit 211 that generates the reference gate biases of the FETs Qb1 and Qb2. The high frequency power amplifier circuit has also a current simulating circuit 212 that simulates a current Iout2 applied to the FETs Qb1 and Qb2 and a bias correction circuit 213 that corrects the biased states of the FETs Qb1 and Qb2 by correcting a bias voltage generated from the reference bias circuit 211 based on a current Idet2 detected through the current simulating circuit 212 and supplying the gate pins of the FETs Ob1 and Qb2 with the corrected bias voltage. The FET Qb1 allows a bias voltage Vgsb1 and a high frequency signal RFin2 to be applied to the gate pin and operates as an amplifying FET. The FET Qb2 allows a bias voltage Vgsb2 that differs from the bias voltage Vgsb1 of the Qb1 to be applied and operates as the bias controlling FET Qb2 that controls the bias point of the amplifying FET Qb1.

In this embodiment, the amplifying FET Qb1 is an FET (for example, $Lg=0.3$ μm) in which the gate length Lg is shorter than a normal FET in order to improve a high frequency power amplifying characteristic. The bias controlling FET Qb2 allows the gate length Lg to set to such a value of 0.5 μm that will not generate a short channel effect. Further, as the entirety of an RF module, output power increases as the rear-stage amplifier circuit is reached. Accordingly, the gate width Wg of the first-stage amplifier circuit FET is set to several mm, for example. The gate width Wg of the amplifying FET of the final-stage amplifier circuit is set to several 10 mm, and the gate width Wg of the amplifying FET of the second-stage amplifier circuit is set to their intermediate value.

The gate pin of the amplifying FET Qb1 is connected to an external pin (pad) P202 to which a high frequency RFin2 to be amplified is input, and the drain pin of the bias controlling FET Qb2 is connected to the external output pin P201. The output pin P201 is connected to the power voltage pin Vdd through an inductor L21 for cutting off a high frequency component and matching an impedance and is connected to the high frequency input pin (not illustrated) of the next-stage amplifier circuit. Capacitors C21 and C22 connected to the external pins P201 and P202 outside a chip are capacitive elements that cut off the direct current component of the high frequency signal. These capacitive elements C21 and C22 can also be discrete components, and can have a pair of conductive layers formed on the front and rear of a dielectric layer that constructs a module substrate. The inductor L21 can also have a microstrip line formed on the module substrate.

The reference bias circuit 211 has, what is called, a diode-connected biasing FET Qa1 with which a gate and a drain are coupled and a P-channel type reference MOSFET Qd1 connected in series to the Qa1 between the drain pin and power voltage pin of the biasing FET Qa1. The reference bias circuit has also a P-channel type reference MOSFET Qc that is connected in series to the MOSFET Qd1 in common with the gate, a reference MOSFET Qd2 in which the same voltage as the Qd1 is applied to the gate, and an FET Qa2 of the same characteristic and the same size as the FET Qa1 connected in series to the Qd2. The MOSFET Qc forms diode connection with which the gate and the drain are coupled, and, accordingly, the Qc, Qd1, and Qd2 construct a current mirror circuit.

Figure 25:
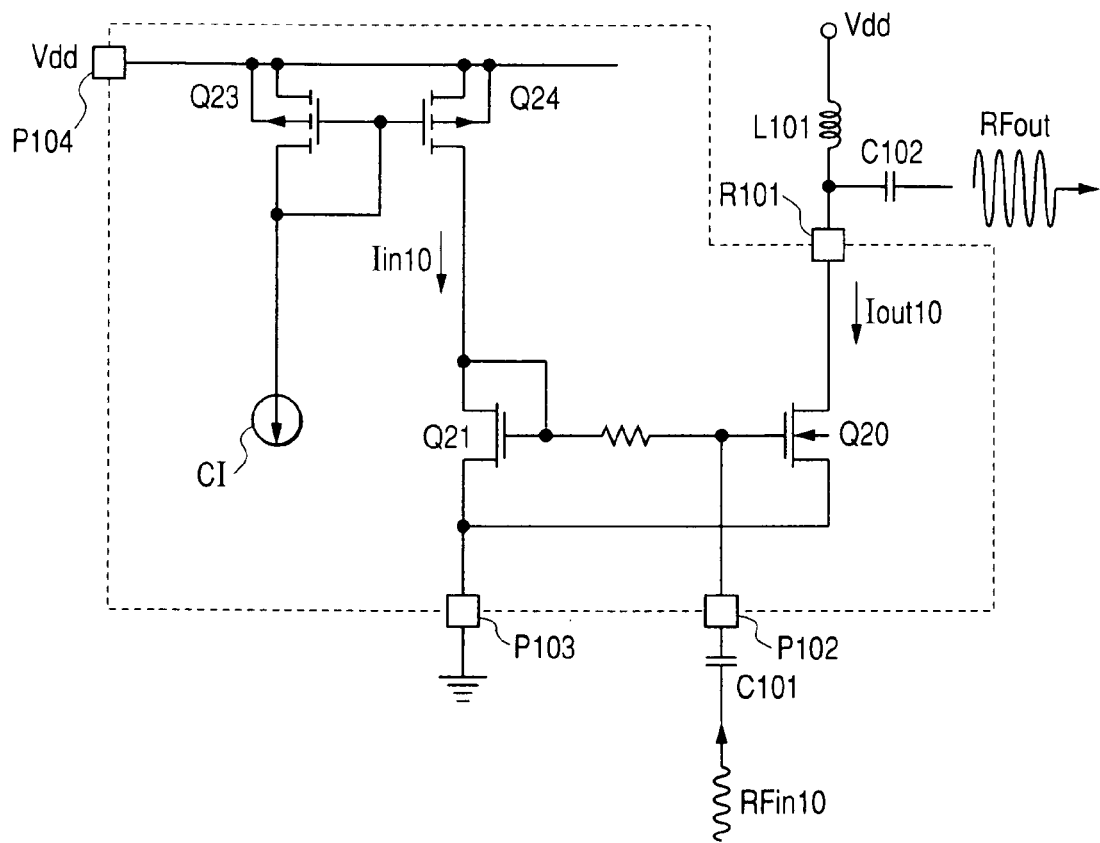
FIG. 25 is a circuit block diagram showing the one example of the conventional high frequency power amplifier circuit.

The biasing FET Qa1 is an FET that corresponds to an FET Q21 in which a gate is commonly connected to the gate pin of an amplifying FET Q20 in the bias circuit of the conventional current mirror method shown in FIG. 25. In this embodiment, the MOSFET Qc, Qd1, Qd2, and the resistive element R1 construct a current control circuit. Furthermore, although not limited in particular, the Qd2 has the gate width twice as broad as the Qd1. Accordingly, the current Iin2 (=2 Iin1) twice as much as a current Iin1 applied from the Qd1 to the Qa1 flows to the Qd2.

The drain pin of the aforementioned MOSFET Qc is connected to a ground point through a resistive element R21 connected to an external pin P203, and can set the currents Iin1 and Iin2 applied to the Qa1 and Q1b to desired values by setting the resistance value of the resistive element R21. The FETs Qa1 and Qa2 form diode connection in order to convert the current applied to the Qa1 and Qa2 into voltage. Moreover, although not limited in particular, the FETs Qa1 and Qa2 are formed in the same process as the amplifying FET Qb1 in this embodiment. Accordingly, an element size, by the same token, a chip size can be reduced. Specifically, the reference MOSFETs Qc, Qd1 and Qd2 formed in a general CMOS process allow a gate length to be 2 μm, while the FETs Qa1 and Qa2 formed in a different process allow the gate length Lg to be such a value of 0.5 μm so that the short channel effect shown in FIG. 26 cannot be produced. Because the FETs Qa1 and Qa2 have a doubled difference in the currents Iin1 and Iin2 applied to the Qa1 and Qa2 and the same characteristic, the generated drain voltage has a √doubled difference. In this example, the drain voltages of the FETs Qa1 and Qa2 are supplied to a bias correction circuit 213 as reference voltages Vref1 and Vref2.

The current simulating circuit 212 has a first simulating FET Qg1 in which the gate length Lg formed in the same process as the amplifying FET Qb1 is set to such a value of 0.3 μm which is the same value as the Qb1, a second simulating FET Qg2 connected in series to the FET Qg1 and having the same characteristic as the bias controlling FET Qg1 the same gate length Lg of 0.5 μm as the Qb2, and a reference MOSFET Qf connected in series to the FET Qg2.

In the FET Qg1, the same voltage as the gate of the FET Qb1 is applied to a gate so that the drain currents of the amplifying FET Qb1 and the FET Qb2 can be simulated. In the FET Qg2, the same voltage as the voltage applied to the gate of the FET Qb2 is applied so that the biased state of the bias controlling Qb2 can be simulated, respectively. However, the current applied to the amplifying FET Qb1 is high. Accordingly, when the current having the same size is applied to the amplifying Qb1 and the simulating FET Qg1, the power consumption of the entirety of the circuit will increase. Consequently, with regard to the gate width Wg, the Qg1 and Qg2 are set to several one-tenths to several one-hundredths of the Qb1 and Qb2. Specifically, the gate widths Wg of the simulating FETs Qg1 and Qg2 are several ten to a hundred several 10 μm with respect to the FETs Qb1 and Qb2 having the gate width of several mm. The MOSFET Qf connected in series to these simulating FETs Qg1 and Qg2 forms diode connection in which a gate and a drain are coupled, and converts a current into a voltage.

The bias correction circuit 213 has differential amplifiers AMP1 and AMP2 that output a voltage in accordance with a potential difference, by comparing the MOSFET Qe1 and Qw2 connected to the MOSFET of the aforementioned current simulating circuit 212 by a current mirror method, diode-connected FETs Qa1' and Qa2' connected in series to the MOSFETs Qe1 and Qe2, the drain voltages of the FETs Qa1' and Qa2' with the drain voltages Vref1 and Vref2 of the FETs Qa1 and Qa2 of the aforementioned reference bias circuit 211 respectively. Subsequently, the output voltage of this differential amplifier AMP1 is supplied to the gate pins of the amplifying FET Qb1 and the simulating FET Qg1 through resistors R22 and R24, and the output voltage of the differential amplifier AMP2 is supplied to the gate pins of the bias controlling FET Qb2 and the simulating FET Qg2 via resistors R23 and R25, to control the current applied to the gate pins. The resistors R22 to R25 and capacitors C23 and C24 prevent the high frequency signal RFin input to the external pin P202 from traveling in the differential amplifier AMP1 or the simulating FET Qg1 and prevent the oscillation of a control loop.

The MOSFETs Qe1 and Qe2 of the bias correction circuit 213 are set to a predetermined size ratio with the MOSFET Qf of the current simulating circuit 12. Currents Iret1 and Iret2 that are proportional to the current Idet2 simulated by the simulating FETs Qg1 and Qg2 flows to the Qe1 and Qe2. The currents are converted into voltages Vret1 and Vret2 by the Qa1' and Qa2' and input to the differential amplifiers AMP1 and AMP2. The simulating FET Qg1 has the same characteristic as the amplifying FET Qb1. Therefore, when, in the amplifying FET Qb1, the threshold scatters and a drain current shifts from a desired value, the drain current of the simulating FET Qg1 also shifts in the same manner. The currents are converted into the voltages Vret1 and Vret2 by the Qa1' and Qa2' to be input to the differential amplifiers AMP1 and AMP2, and the voltages are compared with the voltages Vref1 and Vref2 which are reference from the reference bias circuit 211, then the voltages that comply to their potential differences are supplied to the gates of the amplifying FET Qb1 and the simulating FET Qg1 and the gates of the bias controlling FET Qb2 and the simulating FET Qg2 respectively.

In this embodiment, the Qa1' has the same characteristic and the same size as the Qa1, and the Qa2' has the same characteristic and the same size as the Qa2. Further, the size ratio of the Qb1 and Qg1 and the size ratio of the Qe1, Qe2, and Qf are set so that the currents Iret1 and Iret2, and Iin1 and Iin2 can be the currents of the same order. Although not limited in particular, in this embodiment, the ratio of the gate widths of the FET Qe1 and Qe2 is set to 1 to 2 in accordance with the ratio of the gate widths of the FET Qd1 and Qd2 of the reference bias circuit 211.

Since the differential amplifier AMP1 operates (imaginary short-circuits) so that the voltage of a non-inverting input pin can match the voltage of an inverting input pin, feedback applies so that the reference voltage Vref1 into the non-inverting input pin can match the voltage Vret1 of the inverting input pin. Accordingly, a current shift is also corrected due to the short channel effect of the simulating FET Qg1. Because the output of the differential amplifier AMP1 is also supplied to the amplifying FET Qb1, the current shift due to the short channel effect of the amplifying FET Qb1 is also corrected simultaneously at this occasion. Similarly, since the differential amplifier AMP2 also operates so that the voltage of the non-inverting input pin can match the voltage of the inverting input pin, feedback applies so that the reference voltage Vref2 into the non-inverting input pin can match the reference voltage Vret2 of the inverting input pin. Accordingly, a shift of a biased state with respect to the Qg1 of the simulating FET Qg2 due to the short channel effect of the Qg1 is corrected. Because the output of the differential amplifier AMP2 is also supplied to the bias controlling FET Qb2, the shift of the biased state of the Qb2 with respect to the Qb1 caused by the short channel effect of the Qb1 is corrected simultaneously.

In this embodiment, the gate voltages of the amplifying FET Qb1 and the bias controlling FET Qb2 are controlled independently by the separate differential amplifiers AMP1 and AMP2. Accordingly, even if an idle current point shifts due to the short channel effect of the amplifying FET Qb1, the gate voltage of the power amplifying FET Qb1 varies by the output of the differential amplifier AMP1, and the power amplifying FET Qb1 adjusts an idle current. Simultaneously, a saturation point of gm shifted due to the short channel effect is adjusted by the output of the differential amplifier AMP2 and a biased state (bias point) can automatically be corrected so as to operate at the saturation point.

Further, in this embodiment, current sources CS 21 and CS 22 that apply extremely low currents Ioff1 and Ioff2 toward the FETs Qa1' and Qa2' are provided in the bias correction circuit 213. These current sources CS 21 and CS 22 are provided so as to prevent such a state that, at power on, the potential of the inverting input pins of the differential amplifiers AMP1 and AMP2 is in a floating state to output the unstable voltage, and a spurious current is made to flow to the FETs Qb1 and Qb2 or the FETs Qg1 and Qg2. The extremely low currents Ioff1 and Ioff2 are set to such a size as 10 µA, for example, that can be ignored in comparison with the currents Iret1 and Iret2 applied to the FETs Qa1' and Qa2' during normal operation respectively. These extremely low currents Ioff1 and Ioff2 can also turn off after the input currents Iin1 and Iin2 become stable.

The actions of the high frequency power amplifier circuit of this embodiment are described below in detail comparing with the high frequency power amplifier circuit of the conventional current mirror bias method shown in FIG. 27.

Figure 27:
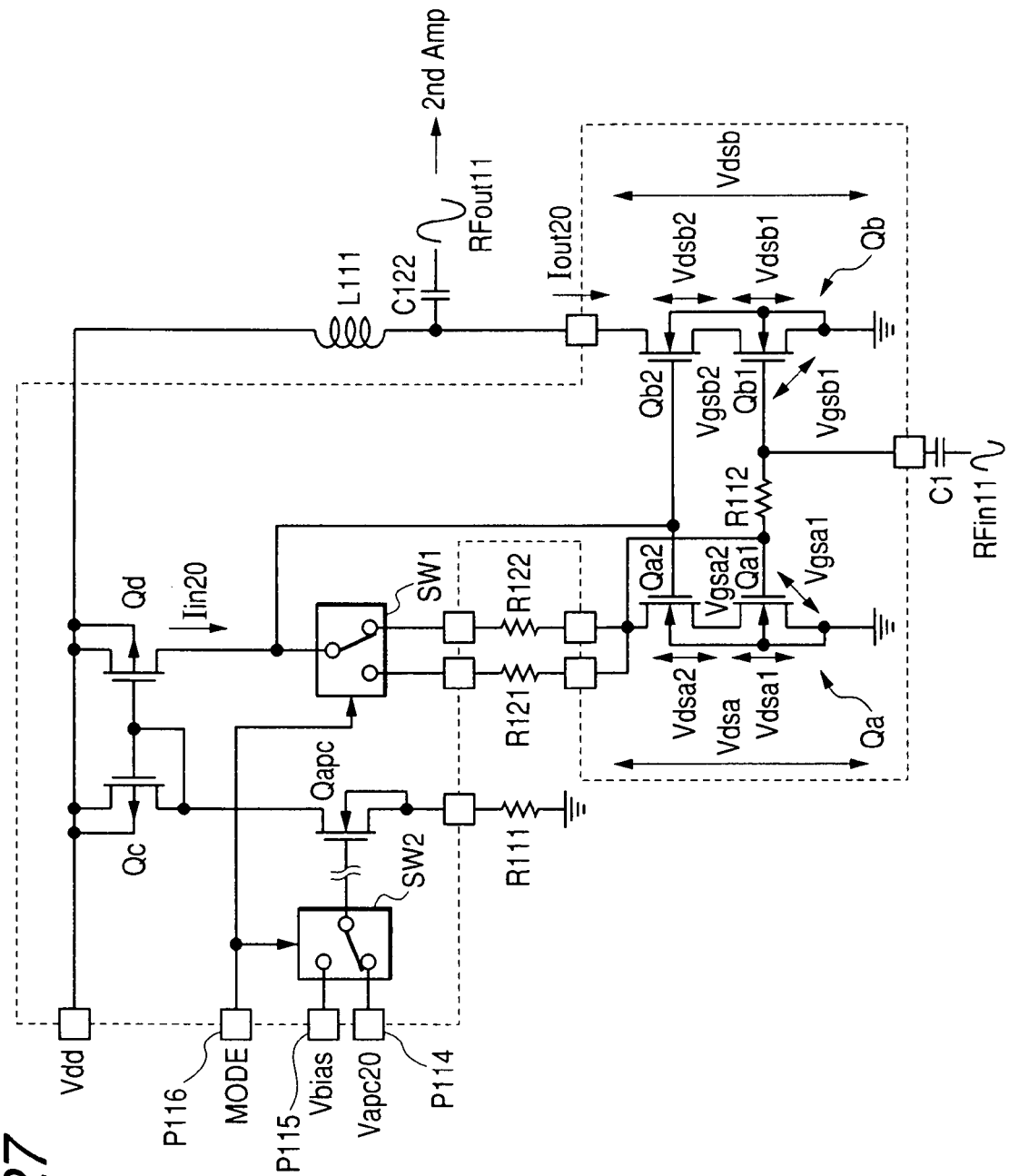
FIG. 27 is a circuit block diagram showing another example of the conventional high frequency power amplifier circuit.

The high frequency power amplifier circuit of FIG. 27 is controlled so as to switch a switch SW1 with a control signal MODE indicating an EDGE (enhanced data rates for GSM evolution) mode or a GSM (global system for mobile communication) mode and apply a bias current Iin20 to a resistor R121 or R122, and then make the gate potential difference of the upper FET and the lower FET in the EDGE mode and the GSM mode. At the same time, the circuit is controlled so as to switch a switch SW2 and vary the bias current Iin20 in accordance with an output power control voltage Vapc20 in the GSM mode, and apply the constant bias current Iin 20 in accordance with a fixed bias voltage Vbias in the EDGE mode and apply a desired bias to the upper FET and the lower FET in a potential difference generated in the resistor R121 or R122.

In the GSM mode in which the bias current Iin20 applies to the R121 by setting the resistors R121 and R122 to R121>R122, the gate potential Vgsb2 in which the sufficient current Iout20 can flow to the amplifying FET Qb. In the EDGE mode, a desired gain is obtained by decreasing the gate potential Vgsb2 in comparison with the GSM mode. Because the operation in the GSM mode is almost the same as a single gate, the operation is not described. The operation of an amplifier circuit in the EDGE mode is described below in detail.

Figure 28:
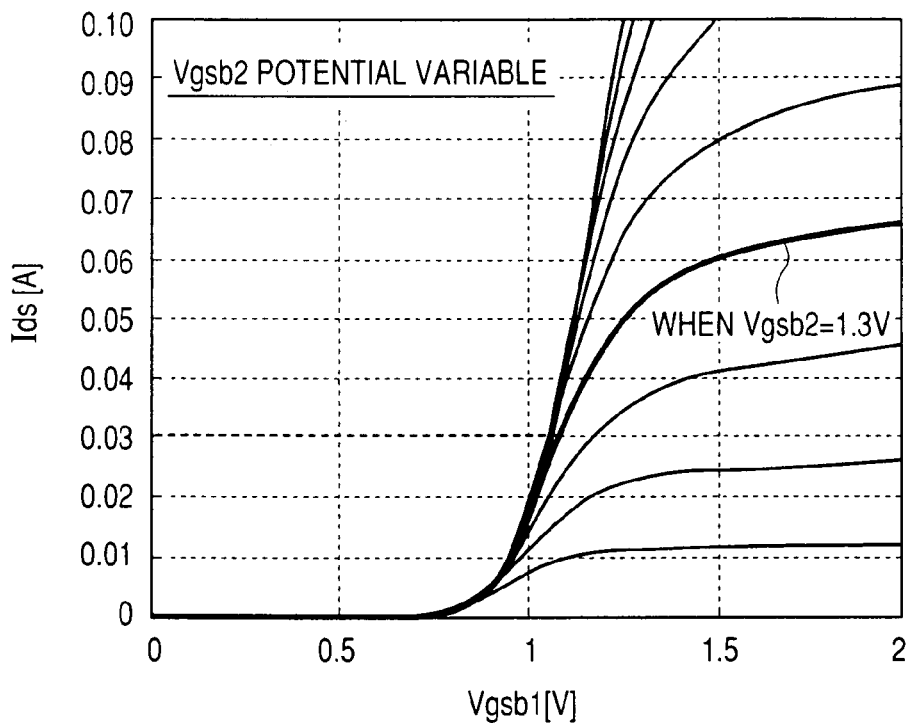
FIG. 28 is a characteristic diagram showing the relationship between the gate potential Vgsb1 of the lower FET Qb1 and drain current Ids of the QB1 or Qb2 when the gate voltage Vgsb2 of the upper FET Qb2 of the amplifying FET of the dual gate is set to a certain value in the conventional high frequency power amplifier circuit of FIG. 27.
Figure 29:
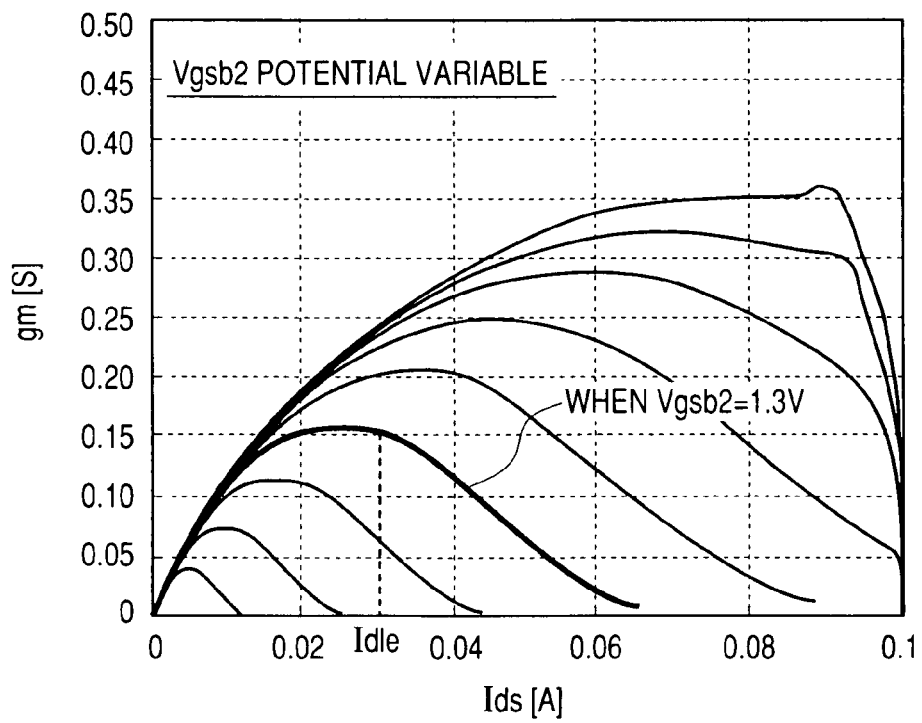
FIG. 29 is a characteristic diagram showing the relationship between gm and the drain current Ids of the lower QB1 when gate voltage Vgsb2 of the upper FET Qb2 of the amplifying FET of the dual gate is set to a certain value in the conventional high frequency power amplifier circuit of FIG. 27.

First, attention is paid to the amplifying FETs Qb1 and Qb2, adjusting the gate potential Vgsb2 of the FET Qb2 on the upper side is equal to controlling the maximum currents of the Qb1 and Qb2. FIG. 28 shows the relationship between the gate potential Vgsb1 of the FET Qb1 on the lower side and the drain currents Ids of the Qb1 and Qb2. Moreover, FIG. 29 shows the relationship between the gm of the FET Qb1 on the lower side and the drain current Ids.

When the currents Ids and the gate potential Vgsb2 of the FETs Qb1 and Qb2 of a series form are adjusted, it proves from this graph that the gm can be adjusted at any rate. Moreover, because the gain of a first-stage amplifier circuit to which a high frequency of a small signal level is input has a strong correlation with the gm of an amplifying FET, a desired gain can be adjusted by adjusting the gm of the amplifying FET. Furthermore, adjusting the current Ids and the gate potential Vgsb2 is equal to adjusting the saturation point of the gm. Accordingly, the class A operation of the Qb1 can be performed in a desired current point. It proves that this operation is highly effective from the standpoint in which the distortion of a waveform is reduced or efficiency can be improved.

Further, the aforementioned is applied to not only the case where an amplifying element has the two FETs Qb1 and Qb2 of a series form shown in FIG. 27, but also the case where a dual gate FET in a narrow sense in which two gate electrodes are arranged together in a channel direction with respect to one channel. At this point, the dual gate FET in the narrow sense and the case where the two FETs Qb1 and Qb2 are connected in a series form are called as a dual gate FET and described below.

In the amplifier circuit of FIG. 27 in which a bias applies to an amplifying FET by a current mirror method using such a dual gate FET, even if the threshold voltage Vth of the dual date varies by a temperature fluctuation, the output current Iout20 (idle current Idle) can be set with the input current Iin20 primarily. Moreover, by using external resistors as the resistors R121 and R122 to adjust their resistance values, the voltage applied to the gate pin of the dual gate FET can be adjusted to operate at a desired operation point (gm), thereby enabling setting so as to obtain a desired gain. Accordingly, the characteristic of an first-stage amplification unit is enhanced.

Figure 30:
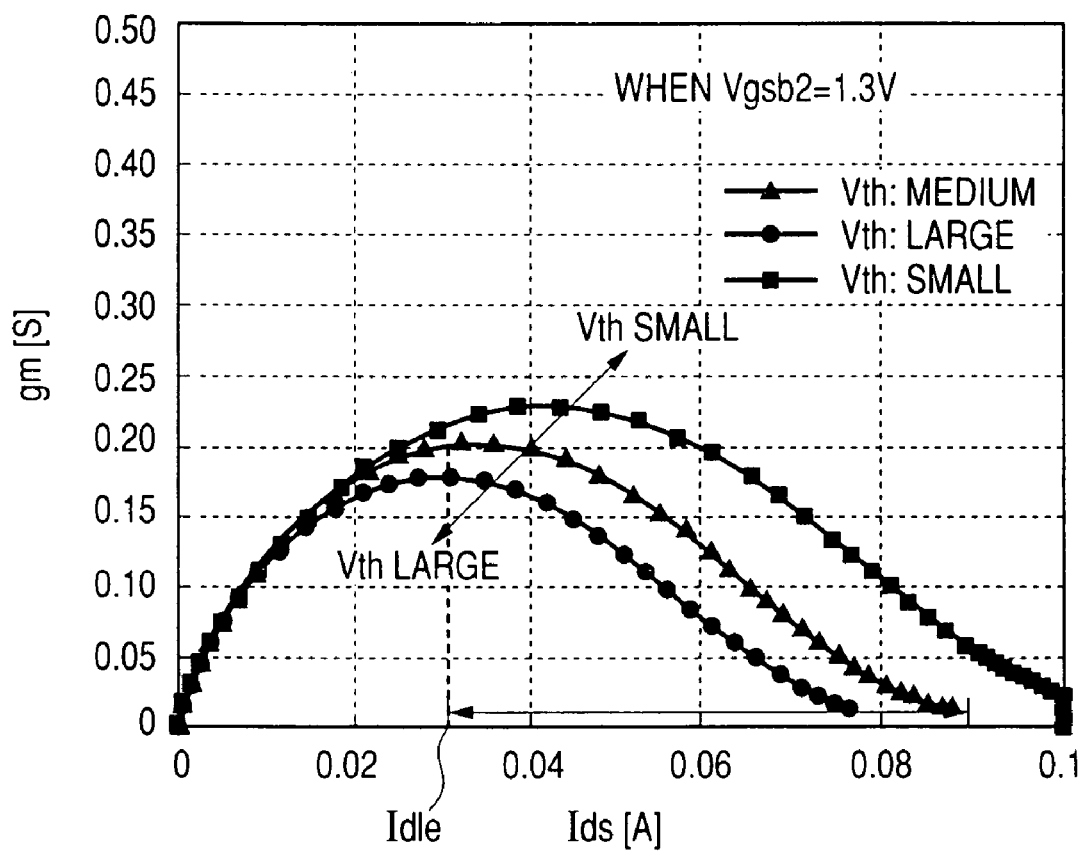
FIG. 30 is a characteristic diagram showing an Ids-gm characteristic when the threshold voltage Vth of a dual gate FET in the conventional high frequency power amplifier circuit of FIG. 27.

However, in the amplifier circuit of FIG. 27, when the threshold voltage Vth of a dual gate FET scatters due to manufacturing scattering (channel impurity concentration), an Ids-gm characteristic varies as shown in FIG. 30. As seen from this graph, when the Vth scatters, the gm will vary and gain scattering will be generated even if a current point is constant.

On the other hand, in the maximum point of the gm, in the same manner as a single gate, the ratio of the maximum current (Idsmax) and the current (Idle) are important. That is, because the potential Vgsb2 of a second gate determines the Idsmax and the potential Vgsb1 of a first gate determines the Idle, finally, the ratio of the Vgsb1 and Vgsb2 is important for the gm. The gm can be described below by using the ratio of the Vgsb1 and Vgsb2.

First, supposing the threshold voltages of the dual gate FETs Qb1 and Qb2 are Vth1 and Vth2, and ΔVgsb1=Vgsb2−Vth2 and ΔVgsb2=ΔVgsb2−Vth2, the relationship of Vth1☐Vth2 is established and ΔVgsb1 and ΔVgsb2 determine a current actually. Accordingly, supposing normalization, that is, Vth1=Vth2=0 by the Vth, the following formula is deduced.

$$gm \approx Idle:Idsmax = Vgsb1:Vgsb2 = \Delta Vgsb1:\Delta Vgsb2$$

Therefore, to make the gm constant, the ratio of each normalized gate potential is assumed important.

When the Vth scattering is considered in the circuit of FIG. 27 in consideration of the aforementioned precondition, a specified current point becomes stable without depending on the scattering of a chip through a current mirror circuit. However, because ΔVgsb1 and ΔVgsb2 that generate the ratio of ΔVgsb1 and ΔVgsb2 are constant in the R122 and Iin20, a difference is identical, that is, ΔVgsb2−ΔVgsb1=ΔVgsb2−ΔVgsb1. A ratio depends on Vtha1 and will not become constant as expressed by Formula (13).

$$\Delta Vgsb2/\Delta Vgsb1=(Vgsb2-Vthb2)/(Vgsb1-Vthb1) \quad \text{Formula (11-1)}$$

$$\Delta Vgsb2/\Delta Vgsb1=(Vgsb2-Vtha2)/(Vgsa1-Vtha1) \quad \text{Formula (11-2)}$$

At this point, because the Qa1, Qa2, Qb1, and Qb2 are the elements of the same characteristic and the same size, a relationship can be regarded as Vtha1≈Vtha2≈Vthb1≈Vthb2. Supposing this relationship is a precondition, the aforementioned formula can be transformed as follows.

$$\Delta Vgsb2/\Delta Vgsb1 \approx \Delta Vgsa2/\Delta Vgsa1 = Vgsa2/Vgsa1 = 1 + R122 \cdot Iin20/Vdsa \quad \text{Formula (12)}$$

Subsequently, because the gate of the Qa1 and the drain of the Qa2 are coupled, the relationships of Vdsa=Vgsa1 and Vgsa1∝Vtha1 are established. Accordingly, the following formula is obtained.

$$\Delta Vgsb2/\Delta Vgsb1 \propto (1+R122 \cdot Iin20/Vtha1) \quad \text{Formula (13)}$$

Accordingly, ΔVgsb2/ΔVgsb1 depends on the scattering of Vtha1 and scatters, the operating point on the Qb side varies and the gain and amplifying characteristic of a high frequency power amplifier circuit vary without obtaining a desired operating point.

Figure 26:
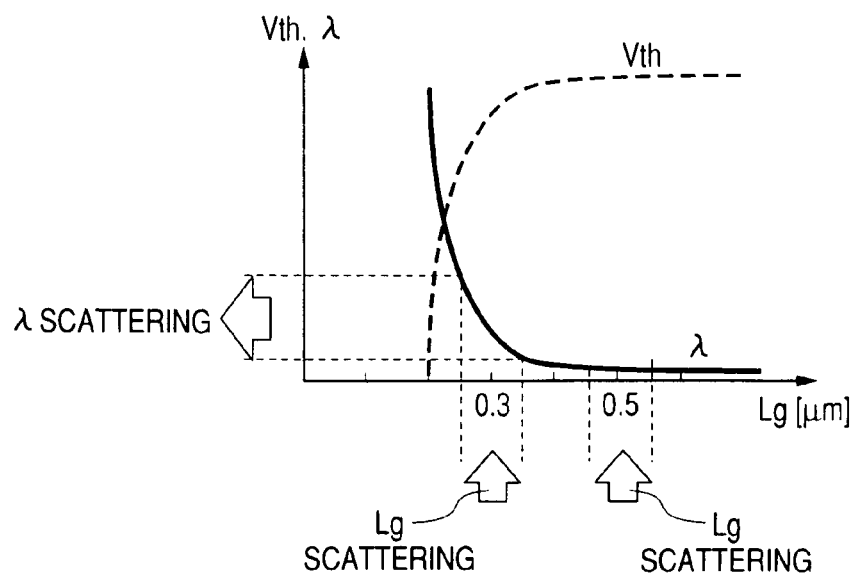
FIG. 26 is a graph showing the relationship between the channel length, threshold voltage Vth, and channel length modulation coefficient $\lambda$ when the length of the FET channel is short.

Moreover, in the amplifier circuit of FIG. 27, in order to improve a high frequency power amplifying characteristic, supposing an FET (Lg=0.3 μm) whose channel length Lg is scaled down is used for the lower FET Qb1 as an amplifying element, as seen from FIG. 26, when a gate length scatters due to process scattering, both the threshold voltage Vth and channel modulation coefficient λ will be scatter. Accordingly, supposing the drain-source voltage of the amplifying FET Qb1 is Vdsb1, the drain-source voltage of the biasing FET Qa1 is Vdsa1, the gate width of the Qa1 is Wga, and the gate width of the Qb1 is Wgb, the current Iin of the Qa1 and the current Iout of the Qb1 establish such a relationship as expressed by the following formula.

$$Iout20=(Wgb/Wga) \cdot \{(1+\lambda Vdsb1)/(1+\lambda Vdsa1)\} \cdot Iin20 \quad \text{Formula (14)}$$

Further, in Formula (14), Vdsa1≈Vgsa1, but Vdsb1≠Vgsb1, that is, Vdsa1≠Vdsb1, and both are affected by the scattering of the threshold voltage Vth. Moreover, the channel length modulation coefficient λ also scatters every chip. Accordingly, the ratio of the input current Iin20 and the output current Iout20 varies depending on the channel modulation coefficient λ and Vth as well as the gate width ratio Wgb/Wga of the Qb1 and Qa1. As a result, it proves that a current point becomes unstable.

From the above, in the amplifier circuit of FIG. 27, in an area where a short channel effect is not produced, the effect of the scattering of the threshold voltage Vth, such as channel impurity concentration is received and the gm saturation point varies. In the area where the short channel effect is produced, furthermore, even the current point (Idle) varies. As a result, a desired stable operating point is not obtained, and an unstable high frequency power amplifying characteristic that depends on the scattering of an element characteristic occurs.

Accordingly, the high frequency power amplifier circuit of FIG. 27 requires such a complicated tuning that, in order to stabilize an amplifying characteristic, the high frequency power amplifier circuit is set so that the constant of a resistor R111 constructing a constant current circuit is finely adjusted and a desired current point is obtained, and further the constant of the resistor R122 is finely adjusted and a desired gate voltage ratio is obtained. This tuning incurs a cost increase as a fault.

On the other hand, in the high frequency power amplifier circuit of this embodiment (FIG. 15), supposing that, in a constant current circuit having the Qc, Qd1, and Qd2, the current applied to the Qc is Iin0, and the gate widths of the Qc, Qd1, and Qd2 are Wgc, Wgd1, and Wgd2, the currents Iin1 and Iin2 applied to the Qa1 and Qa2 become the currents that correspond to the ratio of the gate widths as expressed by the following formulas.

$$Iin1=(Wgd1/Wgc) \cdot Iin0 \quad \text{Formula (15-1)}$$

$$Iin2=(Wgd2/Wgc) \cdot Iin0 \quad \text{Formula (15-2)}$$

Subsequently, when these currents Iin1 and Iin2 flow to the biasing FETs Qa1 and Qa2, such voltages Vref1 and Vref2 that are expressed by the following formulas are generated between the gate and source of the Q1.

$$Vref1=Vgsa1=\sqrt{(Iin1/Ka1)}+Vtha1 \quad \text{Formula (16-1)}$$

$$Vref2=Vgsa2=\sqrt{(Iin2/Ka2)}+Vtha2 \quad \text{Formula (16-2)}$$

At this point, Ka1 and Ka2 are constants expressed by Ka1=K0 (Wga1/Lga1) and Ka2=K0 (Wga2/Lga2) using a process constant K0. In this embodiment, because the FETs Qa1 and Qa2 are the same elements formed on the same chip, in the aforementioned formulas, Ka1=Ka2 and Vtha1=Vtha2 are established. At this point, supposing their values are K and Vth, the aforementioned formulas appear.

$$Vref1=Vgsa1=\sqrt{(Iin1/K)}+Vth \quad \text{Formula (17-1)}$$

$$Vref2=Vgsa2=\sqrt{(Iin2/K)}+Vth \quad \text{Formula (17-2)}$$

At this point, supposing ΔVgsa1=Vgsa1−Vth and ΔVgsa2=Vgsa2−Vth, the aforementioned formula is established.

$$\Delta Vgsa2/\Delta Vgsa1=\sqrt{(Iin2/K)}/\sqrt{(Iin1/K)}=\sqrt{(Iin2/Iin1)} \quad \text{Formula (18)}$$

Because the FETs Qa1, Qa2, Qb1, and Qb2 are elements of the same characteristic, ΔVgsb2/ΔVgsb1=ΔVgsa2/ΔVgsa1 is established. From this formula and the aforementioned formula (18) and the formulas (15-1) and (15-2), a formula $$\Delta Vgsb2/\Delta Vgsb1=\sqrt{(Wgd1/Wgd2)}$$

is obtained. From this formula, it proves that the ratio of the gate voltages ΔVgsa1 (=Vgsb1−Vth) and ΔVgsa2 (=Vgsb2−Vth) of the amplifying FETs Qb1 and Qb2 are set as a square root of the ratio of the gate widths of the FETs Qd1 and Qd2.

In the amplifier circuit of this embodiment, the drain voltages Vgsa1 and Vgsa2 generated by the FETs Qa1 and Qa2 are supplied to the gates of the amplifying FETs Qb1 and Qb2, and Qg1 and Qg2 through the operational amplifiers AMP1 and AMP2 as the reference voltages Vref1 and Vref2, to drive these components. Accordingly, the Iout2 flows to the Qb1 and Qb2, and the simulation current Idet2 of the following formula (19) flows to the simulating FETs Qg1 and Qg2.

$$Idet2=(Wgg/Wgb) \cdot \{(1+\lambda Vdsg)/(1+\lambda Vdd)\} \cdot Iout2 \quad \text{Formula (19)}$$

In the aforementioned formula, Wgg is the gate widths of the amplifying FETs Qb1 and Qb2 and Wgb is the gate widths of the simulating FETs Qg1 and Qg2. A is a channel length modulation coefficient and the Vdd is a power voltage.

In Formula (19), because the Vdd is constant, and Vdsg also becomes constant by the potential dropped from the Vdd for Vf of the Qf, a simulation current Idet2 varies depending on λ. Subsequently, this simulation current Idet2 is fed back as a current in which a desired ratio of Vgsb2:Vgsb1 is held through the current mirror circuits of Qf, Qe1, and Qe2, and the Iret1 and Iret2 shown in the following formulas (20-1) and (20-2) flows to Qa1' and Qa2'.

$$Iret1 = (Wge1/Wgf) \cdot Idet2 \quad \text{Formula (20-1)}$$

$$Iret2 = (Wge2/Wgf) \cdot Idet2 \quad \text{Formula (20-2)}$$

If the power voltage Vdd is high enough to be able to operate the FETs Qa1' and Qa2' in a saturation area, the feedback currents Iret1 and Iret2 flow to the FETs Qa1' and Qa2'. At this occasion, the voltages Vret1 and Vret2 expressed by the following formulas are generated in the drain pins of Qa1' and Qa2'.

$$Vgsa1' = Vret1 = \sqrt{\{(Iret1 + Ioff1)/Ka1'\}} + Vtha1' \quad \text{Formula (21-1)}$$

$$Vgsa2' = Vret2 = \sqrt{\{(Iret2 + Ioff2)/Ka2'\}} + Vtha2' \quad \text{Formula (21-2)}$$

Ka1' and Ka2' are constants expressed by Ka1'=K0(Wga1'/Lga1') and Ka2'=0 (Wga2'/Lga2'). Because the Qa1' and Qa2' are elements of the same characteristic, Ka1'=Ka2' and Vtha1'=Vtha2' are established, and the Ioff1 and Ioff2 are fully small and can be ignored in comparison with the Iret1 and Iret2. The formulas (21-1 and 21-2) appear as the following formulas.

$$Vgsa1' = Vret1 = \sqrt{(1ret1/K)} + Vth \quad \text{Formula (22-1)}$$

$$Vgsa2' = Vret2 = \sqrt{(1ret2/K)} + Vth \quad \text{Formula (22-2)}$$

At this point, supposing Vgsa1'–Vth is ΔVgsa1' and Vgsa2'–Vth is ΔVgsa2', the following formula is obtained.

$$\Delta Vgsa2'/\Delta Vgsa1' = \sqrt{(Iret2/K)}/\sqrt{(Iret1/K)} = \sqrt{(Iret2/Iret1)} \quad \text{Formula (23)}$$

Because the FETs Qa1', Qa2', Qb1, and Qb2 are elements of the same characteristic, the following formula is obtained.

$$\Delta Vgsb2/\Delta Vgsb1 = \Delta Vgsa2'/\Delta Vgsa1'$$

From this formula and the aforementioned formula (23) and the formulas (20-1) and (20-2), the following formula $$\Delta Vgsb2/\Delta Vgsb1 = \sqrt{(Wge1/Wge2)}$$

is obtained.

From this formula, it proves that the ratio of the gate voltages ΔVgsb1(=Vgsb1–Vth) and ΔVgsb2(=Vgsb2–Vth) of the amplifying FETs Qb1 and Qb2 is set by a square root. Accordingly, if the ratio of the gate widths of the Qe1 and Qe1 and the ratio of the gate widths of the Qd1 and Qd2 match with each other, the bias ratio ΔVgsb2/ΔVgsb1 of the power amplifying FET will not collapse. At this point, in this embodiment, each ratio is set to 1 to 2, for example, as previously described.

In the high frequency power amplifier circuit of this embodiment, the voltages Vret1 and Vret2 generated by the FETs Qa1' and Qa2' from the feedback currents Iret1 and Iret2 and the reference voltages Vref1 and Vref2 generated in the drains of the FETs Qa1 and Qa2 are input to the differential amplifiers AMP1 and AMP2, and feedback is applied so that the Vret1 and Vret2 can match the reference voltages Vref1 and Vref2. Accordingly, the gate lengths of the Qb1 and Qg1 are set short, and the channel modulation coefficient λ scatters due to the scattering of a gate length that is caused by a short channel effect. Consequently, even if the current Iout2 of the Qb1 shifts from a desired value, the current Idet2 of the Qg1 shifts in the same manner and such a voltage that corrects the current Idet is applied from the differential amplifiers AMP1 and AMP2 to the gates of the FETs Qb1 and Qg1, and Qb2 and Qg2. As a result, even if the amplifying FET Qb1 is in a short channel to improve an amplifying characteristic, the idle current Iout2 that does not depend on element scattering can flow to the Qb1. Subsequently, such a relationship shown by the following formula $$Idet2/Iout2 = Wgg/Wgb$$

is established between the current Iout2 applied to the amplifying FET Qb1 and the current Idet2 applied to a simulating FET Og1, and the current that corresponds to the ratio Wgg/Wgb of the gate widths flow to the Qb1 and Qg1.

Idet2 is determined depending on Iin0 primarily because the Qg1, Qg2, Qa1, Qa2, Qa1', and Qa2' are all of the same characteristic and the same size, and the Qc and Qf, Qd1 and Qe1, and Qd2 and Qe2 are all of the same characteristic and the same size. Subsequently, the above formula can be induced into the following formula.

$$Iout2 = (Wgb/Wgg) \cdot Iin0$$

Therefore, because the current of the Iout2 is determined with Iin0 primarily, a fixed value can be held.

Moreover, even when the Vth varies due to a short channel effect, the ratio of ΔVgsb2/ΔVgsb1 can be held in a fixed value from the relationship of Wgd1:Wgd2=Wge1:Wge2.

At this point, the element characteristic and size in the high frequency power amplifier circuit of this embodiment are described. Further, with regard to the FETs (FETs that construct the Qc, Qd, Qe, Qf and amplifiers AMP1 and AMP2) other than the FET described below, an element formed in a normal CMOS process is used. Moreover, also with regard to a gate length, when a short channel effect is produced in these FETs Qe and Qf, desired feedback control itself collapses. Accordingly, the gate length is 0.5 μm or longer (2 μm in the embodiment).

In the high frequency power amplifier circuit of this embodiment, because the simulating FET Qg1 simulates the output current Iout2 of the amplifying FET Qb1, an element is formed in the same process as the Qb1, and the gate length is the same (0.3 μm) as the Qb1 so that the same short channel effect as the Qb1 can be produced. If the gate width of the FET Qg1 is the same as the Qb1, current consumption increases exceedingly. Accordingly, in order to obtain a desired current value, the gate width that is fully lower than the gate width of the Qb1, for example, several ten μm or a hundred several ten μm is selected.

The voltages Vref1 and Vref2 generated in the drains of the FETs Qa1 and Qa2 and the voltages Vret1 and Vret2 generated in the drains of the FETs Qa1' and Qa2' are input to the differential amplifiers AMP1 and AMP2, and the gate voltages Vb1 and Vb2 for applying a desired output current Iout2 by the amplifying FETs Qb1 and Qb2 using the Vref1 and Vref2 as standards are generated. Accordingly, the Qa1, Qa2, Qa1', and Qa2' must have a gate length that will not produce a short channel effect. For example, a value of 0.5 μm is supposed as such a gate length. Moreover, the gate widths of the Qa1, Qa2, Qa1', and Qa2' are determined in consideration of the controllability of the output current Iout2. For example, a value of 100 to 200 μm is considered as such a gate width.

Furthermore, in this embodiment, the FETs Qa1, Qa2, Qa1', and Qa2' use an element (power MOS) formed in the same process as the amplifying FET Qb1, but the FETs can also have a standard N-channel MOSFET. However, when the FETs have the standard N-channel MOSFET, the gate length increases in comparison with the power MOS. Accordingly, in order to apply a desired current, the gate width must be designed on a broader scale than when the FETs have the power MOS. Consequently, desirably, the FETs should have the power MOS from the standpoint of low power consumption and a reduction in a chip area.

Figure 16:
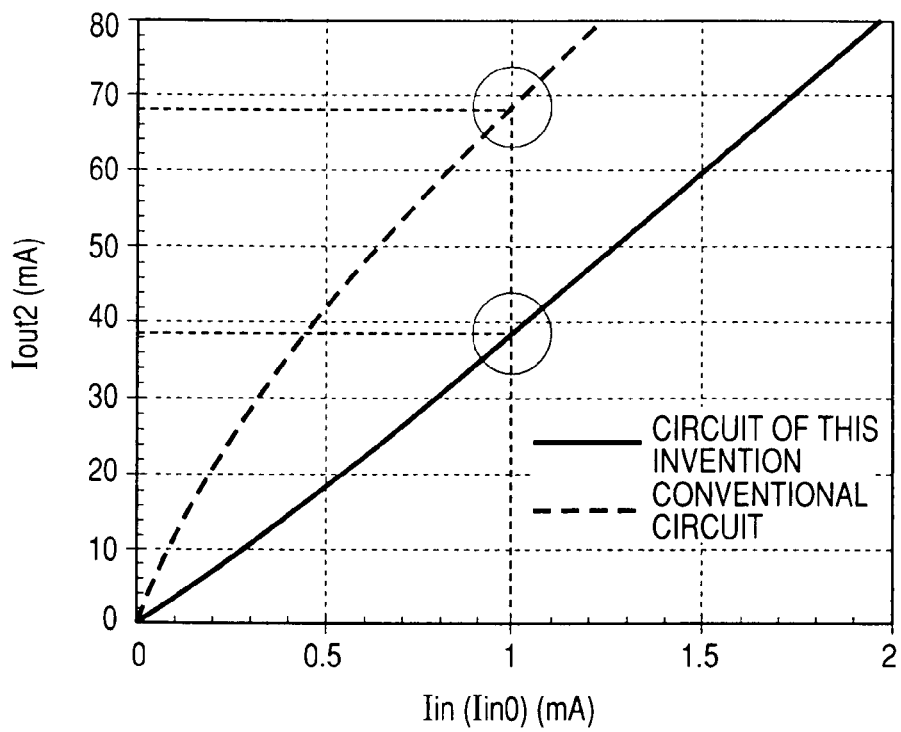
FIG. 16 is a characteristic diagram showing the relationship between a bias current (input current) Iin2 and an idle current Iin2 when the threshold voltage Vth and channel modulation coefficient $\lambda$ scatter due to a short channel effect using a short FET of a gate length as an amplifying FET Qb1 in the high frequency power amplifier circuit of this embodiment and the conventional circuit of FIG. 27.

FIG. 16 shows the relationship between the bias current (input current) Iin 20 and the idle current Iout 20 when the threshold voltage Vth and the channel modulation coefficient λ scatter using an FET having a short gate length due to a short channel effect as the amplifying FET Qb1 in the high frequency power amplifier circuit of this embodiment and the conventional circuit of FIG. 27. FIG. 16 shows the characteristic of the high frequency power amplifier circuit of this embodiment by a solid line and the characteristic of the conventional high frequency amplifier circuit of FIG. 27 by a dotted line respectively. It proves from FIG. 16 that the high frequency power amplifier circuit of this embodiment is more excellent in the linearity of an output/output current characteristic.

Figure 17:
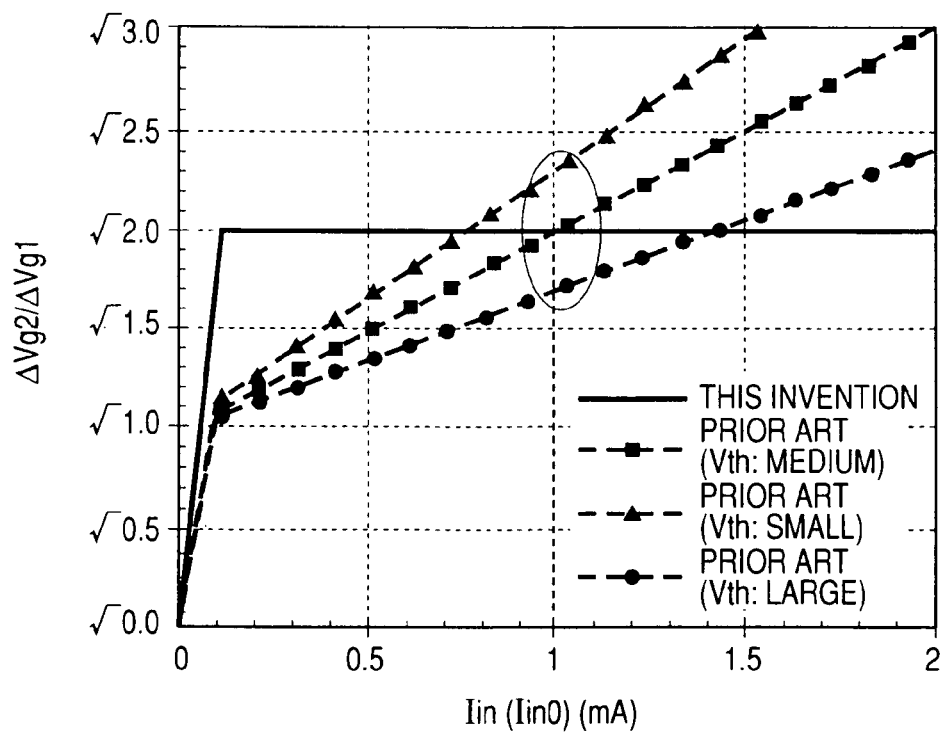
FIG. 17 is a characteristic diagram showing the relationship between the bias current (input current) Iin and bias ratio ($\Delta$Vgsb2/$\Delta$Vgsb1) of a first gate and a second gate of the amplifying FETs Qb1 and Qb2 of a dual gate when the threshold voltage Vth scatters due to the short channel effect using the short FET of the long gate as the amplifying FET Qb1 or when the Vth scatters due to the scattering of channel impurity concentration in an area in which the short channel effect is not produced, and when the Vth scatters due to both the combined effects in the high frequency power amplifier of this embodiment and the conventional circuit of FIG. 27.
Figure 18:
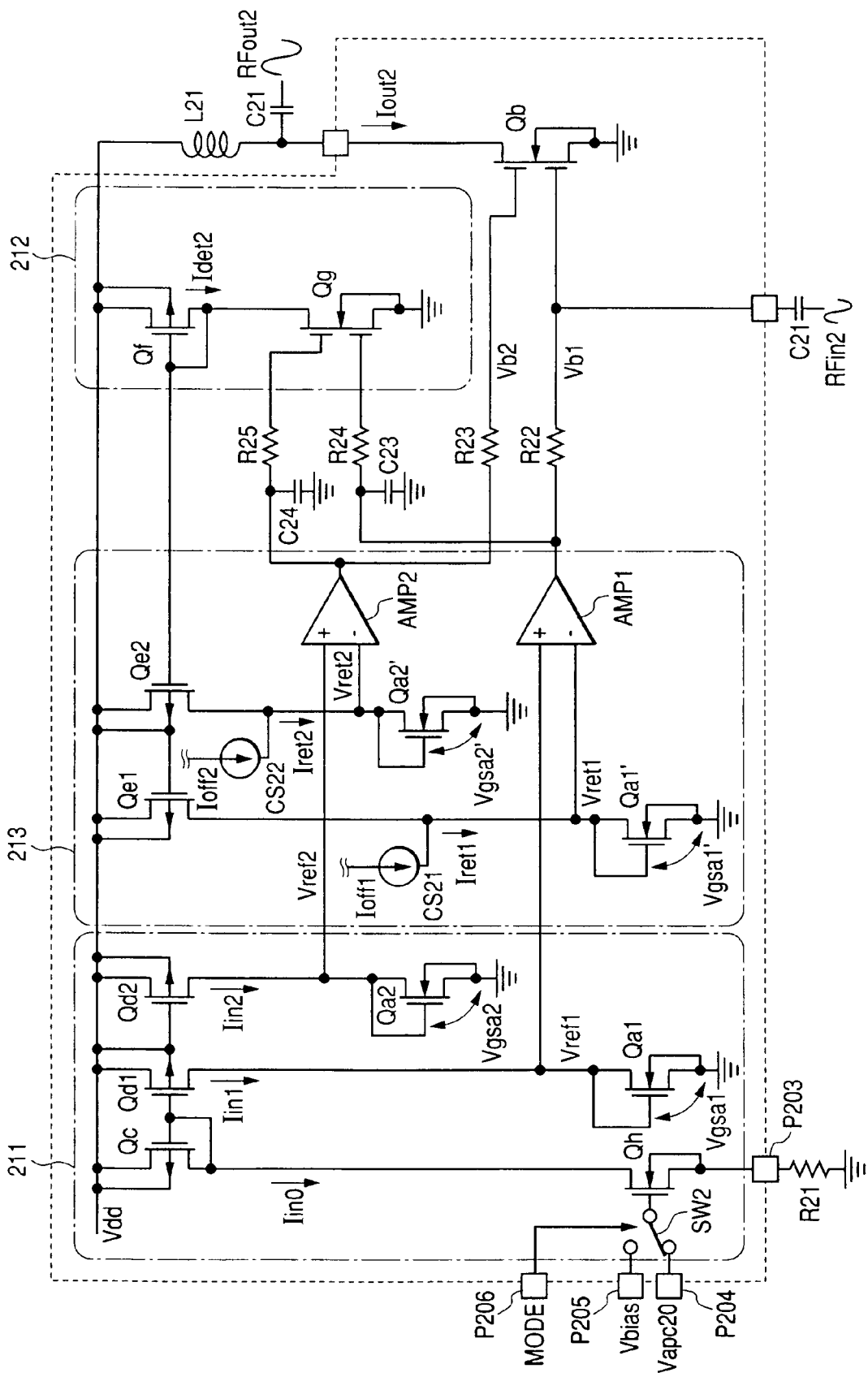
FIG. 18 is a circuit block diagram showing the sixth embodiment of the high frequency power amplifier circuit according to the present invention.

FIG. 17 shows the relationship between the bias ratio $\sqrt{(\Delta Vgsb2/\Delta Vgsb1)}$ of the first gate and the second gate of the bias current (input current) Iin20 and the dual gate amplifying FETs Qb1 and Qb2 in the high frequency power amplifier circuit of this embodiment and the conventional circuit of FIG. 27. This figure shows when the threshold voltage Vth scatters due to a short channel effect using a short gate length as the amplifying FET Qb1, and when the Vth scatters due to the scattering of channel impurity concentration in an area in which a short channel effect is not produced, and when the Vth scatters due to both the combined effects. FIG. 18 shows the characteristic of the high frequency power amplifier circuit of this embodiment by a solid line and the characteristic of the conventional high frequency power amplifier circuit of FIG. 17 as a dotted line respectively.

From FIG. 17, in a conventional high frequency power amplifier circuit, as the input current Iin20 increases, a bias ratio increases, and, as a threshold voltage Vth scatters, the inclination of the bias ratio also varies. However, in the high frequency power amplifier circuit of this embodiment, even if the bias ratio is constant regardless of the size of the input current Iin 20, and the threshold voltage Vth scatters, it proves that the bias ratio will not vary.

Further, because the high frequency power amplifier circuit of FIG. 15 is a bias-fixed high frequency power amplifier circuit that does not have a power control pin, power control is effective for being utilized for a system that controls output power by such a bias-fixed/input variable method that varies the amplitude of a high frequency signal RFin2 input to the gate pin of the amplifying FET Qb1 in a more previous-stage circuit than the external pin P201 in accordance with the output power control voltage Vapc. As a such a system, for example, there is a cellular phone that enables communication using an EDGE (enhanced data rates for GSM evolution) method or a WCDMA (wide-band code division multiple access) method.

Embodiment 6

Next, a sixth embodiment of a high frequency power amplifier circuit according to the present invention is described with reference to FIG. 18. FIG. 18 differs from the high frequency power amplifier circuit of the embodiment of FIG. 15 in that the two dual gate FETs Qb and Qg are used instead of the two FETs Qb1 and Qb2, and Qg1 and Qg2 of a series form as an amplifying transistor and a current simulating transistor, and that the high frequency power amplifier circuit can apply to a system that supports either communication of a GSM method and an EDGE method.

A cellular phone of a GSM method is constructed so that the output power of a high frequency power amplifier circuit can be controlled by the output power control voltage Vapc 20. In an EDGE mode, the linearity in the output power control can be improved by controlling the output power by a bias fixed/input variable method as shown in the aforementioned embodiment. The high frequency power amplifier of this embodiment is an embodiment in which both the bias-fixed/input variable output power control in such an EDGE mode and the input-fixed/bias variable output power control in the GSM mode are enabled.

Accordingly, this embodiment has a voltage-current converting FET Qh connected between the FET Qc of the reference bias circuit 211 and the external pin P203 to which the external resistor R23 is connected, the change-over switch SW2 for selectively supplying either the output control voltage Vapc20 supplied externally in a GSM mode or the fixed bias voltage Vbias supplied externally in an EDGE mode, an external pin P204 for supplying the output power control voltage Vapc20 externally, an external pin P205 for supplying the fixed bias voltage Vbias externally, and an external pin P206 for applying a mode signal MODE that switches and controls the aforementioned change-over switch SW2. In the GSM mode, the reference current Iin1 and Iin2 applied from the reference bias circuit 211 to the FETs Q1a and Q2a vary by changing the current Iin0 of the FETs Qc and Qh in accordance with the output power control voltage Vapc20, and the idle current Iout2 applied to the amplifying FETs Qb1 and Qb2 vary.

Further, a proper voltage conversion circuit for improving the linearity of the output power control voltage Vapc20 and the currents Iin1 and Iin2 can also be provided between the change-over switch SW2 and the gate pin of the voltage-current converting FET Qh.

Figure 19:
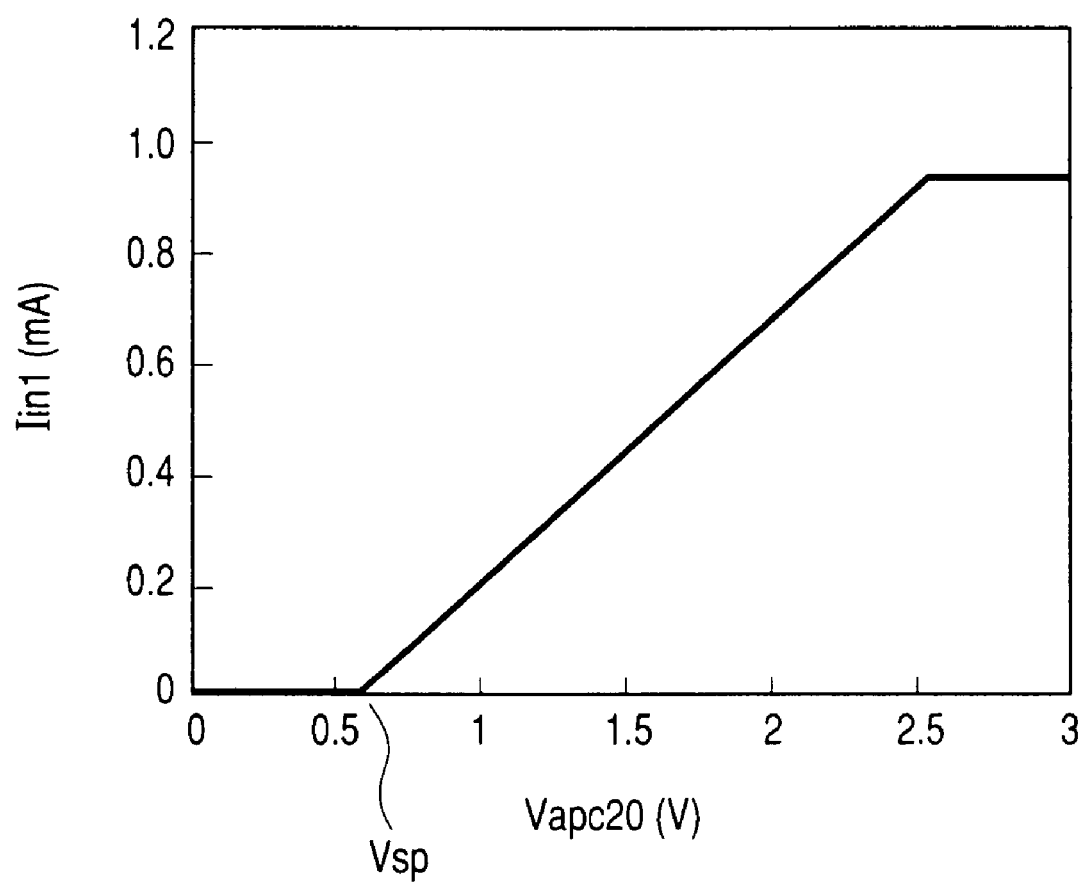
FIG. 19 is a characteristic diagram showing the relationship between a control voltage Vapc20 and a current Iin1 applied to an amplifying FET Qb in the high frequency power amplifier circuit of a sixth embodiment.

FIG. 19 shows the input/output characteristic of the reference bias circuit 211 in a GSM mode, that is, the relationship between the output power control voltage Vapc20 and the current Iin1 applied to the FET Qa1. As shown in FIG. 19, in this example, the current Iin1 increases almost linearly from a certain voltage (starting point) Vsp in accordance with the output power control voltage Vapc20. Moreover, in the reference bias circuit 211, the starting point Vsp in which the current Iin1 starts increasing by the resistance value of the external resistor R21 is determined.

Embodiment 7

Figure 20:
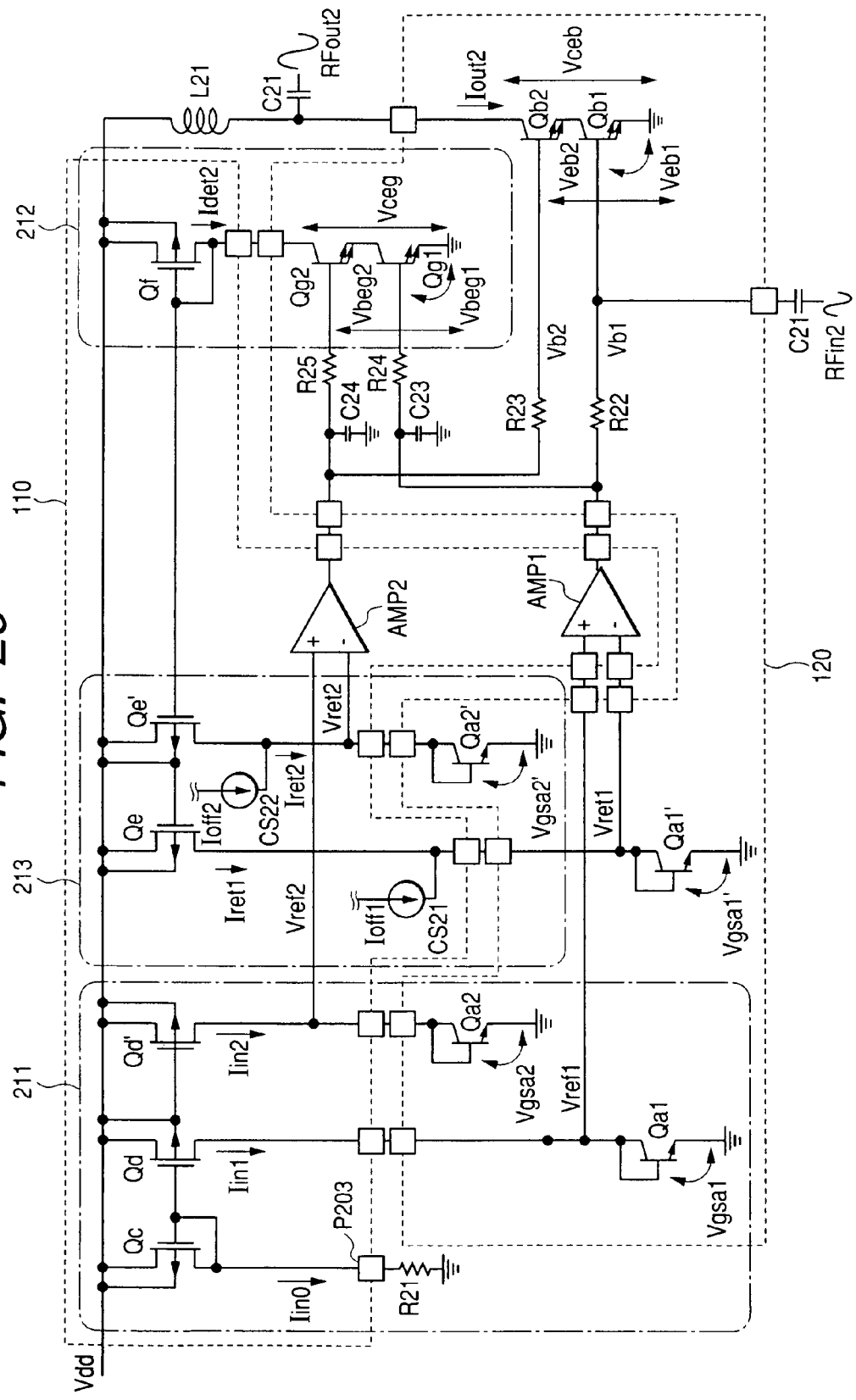
FIG. 20 is a circuit block diagram showing a seventh embodiment of the high frequency power amplifier circuit according to the present invention.

FIG. 20 shows a seventh embodiment of a high frequency power amplifier circuit according to the present invention.

In this embodiment, the amplifying transistors Qb1 and Qb2 and the simulating transistors Qg1 and Qg2 of the high frequency power amplifier circuit of the embodiment of FIG. 15 are constituted of a bipolar transistor instead of an FET, and the entirety of the circuit is constituted of two semiconductor chips. Moreover, the current-voltage converting transistors Qa1, Qa1', Qa2, and Qa2' are constituted of also the bipolar transistor instead of the FET.

The bipolar transistor does not have such a short channel effect as in an FET However, the bipolar transistor whose base thickness is thinned as the amplifying transistor Qb1 is used to improve a high frequency power amplifying characteristic. In this case, even if a base-emitter voltage is kept constantly, an Early effect that, as a collector-emitter voltage increases, an effective base width decreases and a collector current increases, appears. Accordingly, when the base thickness of the amplifying transistor Qb1 scatters every chip due to manufacturing scattering, a base bias point scatters every chip due to the influence of the Early effect. Consequently, there is a possibility of the stability of a high frequency power amplifying characteristic being not obtained.

At this point, this embodiment has, in the same manner as the embodiment of FIG. 15, the reference bias circuit 211 that generates the reference voltages Vref1 and Vref2 by the diode-connected transistors Qa1 and Qa2, and the current simulation circuit 212 that has the same characteristic as the amplifying transistors Qb1 and Qb2 and includes the simulating transistors Qg1 and Qg2 to which a proportional current applies. This embodiment has also the correction circuit 213 that converts a detected current into a voltage, compares the voltage with the reference voltages Vref1 and Vref2, and generates a bias voltage so as to correct a current shift that is generated due to the scattering of the base thickness of the amplifying transistors Qb1 and Qb2. Accordingly, even if the base thickness of the amplifying transistors Qb1 and Qb2 is thinned in order to improve a high frequency power amplifying characteristic using a bipolar transistor as the amplifying transistors Qb1, Qb2, the scattering of a base bias point generated due to an Early effect, and the scattering of the base bias point having the Vth scattering generated due to another factor (channel impurity concentration) other than the Early effect are reduced, and the stability of the high frequency power amplifying characteristic can be improved.

Moreover, also in this embodiment, because the amplifying transistors Qb1 and Qb2 and the simulating transistors Qg1 and Qg2 having a bipolar transistor are formed on the semiconductor chip 120 separately from the bias controlling semiconductor chip 110 on which the FETs Qc to Qf are formed, a process can be simplified by forming two semiconductor chips in each individual optimum process, in comparison with the case where both the transistors are formed on one semiconductor chip. Accordingly, a chip cost can be reduced as an advantage. Further, the bipolar transistor used for this embodiment can also be formed on a silicon chip. Desirably, a hetero-junction bipolar transistor having an excellent amplifying characteristic should be used.

Moreover, FIG. 20 shows that two bipolar transistors are connected in a series form as an amplifying transistor and a simulating transistor. A horizontal bipolar transistor forms two base areas between one collector area and one emitter area, and a vertical bipolar transistor forms a base area of a dual structure in the one collector area and an emitter area in the base area of the inside (a dual base transistor in a narrow sense), and both the transistors can be used also as the amplifying transistor and the simulating transistor. In this specification, a dual base transistor in a narrow sense and two bipolar transistors connected in a series form are referred to as the dual base transistor together.

Next, a modification of a high frequency power amplifier circuit according to the present invention is described.

FIG. 21 shows a sixth modification. This modification forms a high frequency power amplifier circuit of three-stage composition on one semiconductor chip as a semiconductor integrated circuit, and provides a detection circuit for detecting output power. The output power detection circuit in this embodiment has a detecting FET Qj so that the same voltage as the voltage input to the gate pin of the final-stage amplifying FET Qb can be input to the gate pin through a resistor R26, a current mirror circuit 215 that transfers a drain current applied to the current mirror circuit 215, and an external resistor R27 that converts the drain current transferred by the current mirror circuit 215 into a voltage.

The output power detecting FET Qj is an element of the same characteristic having the same gate length formed in the same process as the amplifying FET Qb. The current of such a size in which the Qb current is reduced proportionally at a ratio of a gate width flows to the Qj by forming the element so as to have a smaller gate width than the Qb. With regard to the output power detection circuit of such a current detection method, because several patent applications have already been submitted by these applicants, a detailed operation is not described.

In this embodiment, an output pin P211 of a first-stage amplifier stage 210A is connected to an input pin P222 of a second-stage amplifier stage 210B through a capacitor C31 and an impedance matching circuit MN21, and an output pin P212 of a second-stage amplifier stage 210B is connected to an input pin P223 of a third-stage amplifier stage 210C via a capacitor C32 and an impedance matching circuit MN22. The FET Qj and the current mirror circuit 215 having an output power detection circuit are provided corresponding to the three-stage amplifier stage 210C.

A semiconductor integrated circuit 10 of this embodiment is mounted on an insulating substrate, such as a ceramic insulating substrate, together with the capacitors C31 to C33 for cutting off a direct current, external resistors R31 to R33, inductors L31 to L33, and impedance matching circuits MN20 to MN23, and constructed as a module. The inductors L31 to L33 or the impedance matching circuits MN20 to MN23 can be constructed using a microstrip line formed on a module substrate. The capacitors C31 to C33 can be even discrete components. However, when a capacitor uses a component in which multiple dielectric layers are laminated as a module insulating substrate, the capacitor may also be acceptable in which conductive layers formed on the front and rear of any dielectric layer so as to be opposed respectively are used an electrode. A first-stage amplifier stage can use that of the embodiment of FIG. 15 as an example, but it can also use that of the embodiment (dual gate FET in a narrow sense) of FIG. 16 or the embodiment (bipolar transistor) of FIG. 6.

Because the high frequency power amplifier circuit of this embodiment allows a transistor element having first-stage, second-stage, and third-stage amplifier stages to be formed on one semiconductor chip, a module can be miniaturized in comparison with another example as an advantage.

FIG. 22 shows a seventh modification. This modification forms a high frequency power amplifier circuit of three-stage composition on the two semiconductor chips 210 and 120 as a semiconductor integrated circuit. Specifically, the first-stage amplifier stage 210A and the second-stage amplifier stage 210B are formed on the first semiconductor chip 110, and the third-stage amplifier stage 210C is formed on the second semiconductor chip 220. Other components are the same as the modification of FIG. 21.

Because the high frequency power amplifier circuit of this embodiment allows an FET having the first-stage and second-stage amplifier stages to be formed on the one semiconductor chip 210, a module can be miniaturized in comparison with another embodiment except the embodiment of FIG. 21. Moreover, the embodiment of FIG. 22 is inferior to the embodiment of FIG. 21 in miniaturization, but the embodiment of FIG. 22 can realize the embodiment having an amplifying characteristic superior to the example of FIG. 21 as a whole by forming the amplifying FET Qb so that each different characteristic can be provided in the first-stage, second-stage, and third-stage amplifier stages.

FIG. 23 shows a eighth modification. This modification forms a high frequency power amplifier circuit of three-stage composition on three semiconductor chips as a semiconductor integrated circuit. Specifically, the current control circuit 14 of each stage is formed on the first semiconductor chip 210 as a common current control circuit, and the first-stage amplifier stage 210A and the second-stage amplifier stage 210B except for the current control circuit 14 are formed on the second semiconductor chip 220, and the third-stage amplifier stage 210C is formed on the third semiconductor chip 130. Other components are the same as the modification of FIG. 21.

Because the high frequency power amplifier circuit of this embodiment allows the current control circuit 14 of each stage to be formed on an independent semiconductor chip 230 as a common current control circuit, the second and third semiconductor chips 210 and 220 on which an FET having an amplifier stage can be miniaturized in comparison with the example of FIG. 22 as an advantage.

Figure 24:
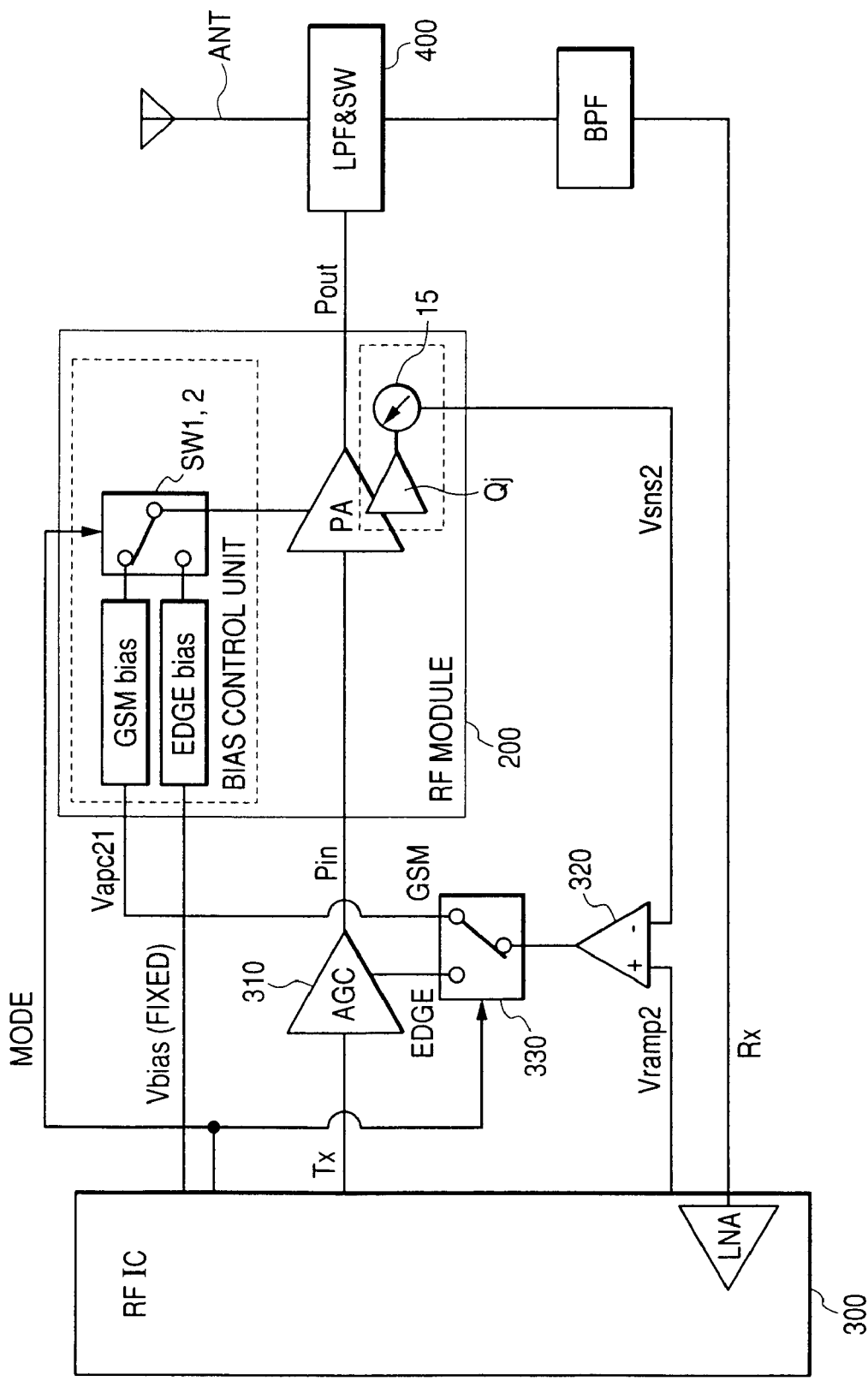
FIG. 24 is a block diagram showing a composition example of a radio communication system, such as a cellular phone, that uses the high frequency power amplifier circuit of this embodiment.

FIG. 24 shows a composition example of a radio communication system, such as a cellular phone. The cellular phone uses the high frequency power amplifier circuit of the example of FIG. 18 that enables both bias-fixed/input variable output power control in an EDGE mode and input-fixed/bias variable output power control in a GSM mode, and provides such an output power detection circuit of a current sense method shown in FIG. 21 in the final stage.

The radio communication system of FIG. 24 comprises: a high frequency signal processing circuit (high frequency IC) 300 having a modulation and demodulation circuit through which a GMSK modulation (frequency modulation) in a GSM mode, a PSK modulation (phase modulation and amplitude modulation) in an EDGE mode, and their demodulation can be performed or a low noise amplifier LNA that amplifies a received signal Rx; a variable gain amplifier 310 that amplifies a transmitted signal Tx from the high frequency IC 300; the high frequency power amplifying module (RF power module) 200 of the aforementioned example that amplifies the output of the variable gain amplifier 310 and drives an antenna ANT to perform transmission; a front-end module 400 including a low pass filter that removes a harmonic component contained in the transmitted signal, a transmitter-receiver change-over switch, and a filter; and a band pass filter BPF having an elastic surface wave filter that removes a spurious wave from the received signal.

Moreover, the radio communication system of this embodiment is provided with: an error amplifier 320 that outputs a voltage in accordance with the potential difference between the output level instruction signal Vramp output from the high frequency IC 300 and the detection signal Vsns detected in the output power detection circuit of the RF power module 200; and a change-over switch 330 that selectively supplies the output power control voltage Vapc output from the error amplifier 320 to a bias control circuit of the variable gain amplifier 310 or the RF power module 200.

This change-over switch 330 is controlled so that the output power control voltage Vapc can be supplied to the bias control circuit in a GSM mode and the output power control voltage Vapc can be supplied to the variable gain amplifier 310 in an EDGE mode with a mode control signal MODE that controls the switches SW1 and SW2 inside the bias control circuit of the RF power module 200. In the GSM mode, the output power control voltage Vapc is supplied to the bias control circuit. Accordingly, a feedback control loop is formed which provides the amplifying FET bias inside the RF power module 200 so that the output power detection signal Vsns can match the output level instruction signal Vramp, and operates so that output power Pout can vary in accordance with the output level instruction signal Vramp.

On the other hand, in an EDGE mode, the output power control voltage Vapc is supplied to the variable gain amplifier 310, and the bias voltage Vbias of a fixed level is supplied from the high frequency IC 300 to the bias control circuit of the RF power module 200. Accordingly, in the RF power module 200, an amplifying FET is held in a constantly biased state through the bias control circuit, and a gain of the variable gain amplifier 310 is varied with the output power control voltage Vapc from output the error amplifier 320. A feedback control loop that operates so that the output power detection signal Vsns can match the output level instruction signal Vramp is formed, and operates so that the output power Pout can vary in accordance with the output level instruction signal Vramp. At this time, the output Pout can be varied linearly in accordance with the output level instruction signal Vramp from the low area to the high area of an output level by using the high frequency power amplifier circuit and the RF power module constructed like the aforementioned embodiment, as an advantage.

An invention made by these inventors is described based on an embodiment, but the present invention is not limited to the aforementioned embodiment, and, needless to say, the present invention can be modified variously within the range in which the present invention will not depart from the purpose.

For example, in the embodiment of FIG. 6, the amplifying FET Q0 and the simulating FET Q7 have a bipolar transistor, and the diode-connected transistors Q1 and Q2 of the reference bias circuit 11 and the bias correction circuit 13 have an FET, but both the Q1 and Q2 can also have a bipolar transistor. Moreover, the embodiment of FIG. 5 or FIG. 9 to FIG. 11 are constructed as a semiconductor integrated circuit including output power detection circuits (Q9 and Q15), but can also be constructed as a high frequency power amplifier circuit that does not include an output power detection circuit.

Furthermore, in the aforementioned embodiment, the case where the amplifying transistor Q0 has an FET or a bipolar transistor is described. However, even when the amplifying transistor Q0 has another transistor, such as a GaAsMESFET, GaAsHBT (hetero-junction bipolar transistor), SiGeHBT, and HEMT (high electron mobility transistor), the same effect can be obtained by applying the aforementioned embodiment.

Moreover, for example, in the embodiment of FIG. 15, a diode-connected transistor is used as current-voltage converting FETs Qa1 and Qa2 having the reference bias circuit 211 and current-voltage converting FETs Qa1' and Qa2' having the bias correction circuit 213, but a resistor or a diode can also be used instead of a transistor. In that case, desirably, their current-voltage converting resistor or diode should be provided as an external element from the standpoint of improved accuracy.

Furthermore, in the aforementioned embodiment, the case where an amplifying transistor has an FET or a bipolar transistor is described. However, even when the amplifying transistor has another transistor, such as a GaAsMESFET, GaAsHBT (hetero-junction bipolar transistor), SiGeHBT, and HEMT (high electron mobility, transistor), the same effect can be obtained by applying the aforementioned embodiment. Moreover, in an embodiment of an application system, an example of the system that enables communication by two modulation methods of a GSM mode and an EDGE mode is described. However, the present invention can also apply to the system that enables the communication by a CDMA (code division multiple access) method.

In the above description, the case where an invention made by these inventors applies to a high frequency power amplifier circuit and a power module used for a cellular phone that is a field of utilization as the background is described. However, the present invention is not limited to the high frequency power amplifier circuit or the power module, but can be utilized for the high frequency power amplifier circuit and the power module that construct a wireless LAN.

What is claimed is:

1. A high frequency power amplifier circuit, comprising:
   a power amplifying element for amplifying a high frequency signal; and
   a current-voltage converting element for converting a current into a voltage by applying a predetermined current,
   wherein a voltage corresponding to the voltage generated by said current-voltage converting element is applied to a control pin of said power amplifying element thereby to make flow a current that is proportional to the current flowing to said current-voltage converting element, and
   wherein said power amplifying element comprises a field-effect transistor of a dual gate having a first gate and a second gate, and includes a bias control circuit that can independently set a bias voltage of said first gate and said second gate.

2. A high frequency power amplifier circuit according to claim 1, wherein said bias control circuit includes:
   a current simulating transistor of a dual gate having the same channel length and formed in the same process as said amplifying transistor of the dual gate; and
   a diode-connected transistor having such a channel length in which a threshold voltage and a channel length modulation coefficient do not vary due to manufacturing scattering and connected in series to said current simulating transistor,
   said high frequency power amplifier circuit further comprising:
   a first bias generation circuit which compares a voltage formed based on the current flowing to said diode-connected transistor with a reference voltage generated by the current-voltage converting element that converts the current from a current control circuit into a voltage, and supplies such a bias that inhibits an idle current of said amplifying transistor from varying due to a short channel effect to a first gate to which a signal to be amplified of said amplifying transistor and the first gate to which the current simulating transistor corresponds; and
   a second bias generation circuit which compares the voltage formed based on the current flowing to said diode-connected transistor with the reference voltage generated by the current-voltage converting element that converts the current from the current control circuit into the voltage, and supplies the bias to the second gates of said amplifying transistor and current simulating transistor.

3. A high frequency power amplifier circuit according to claim 2, wherein said first bias generation circuit comprises:
   a first differential amplifier circuit which compares a voltage formed based on the current applied to said diode-connected transistor and a first reference voltage generated by a first current-voltage converting element for converting the current from a current control circuit into a voltage, and outputs the voltage that complies with a potential difference,
   wherein said second bias generation circuit comprises:
   a second differential amplifier circuit which compares the voltage formed based on the current flowing to said diode-connected transistor and a second reference voltage generated by a second current-voltage converting element that converts the current from a current control circuit into the voltage, and outputs the voltage that complies with the potential difference, and
   wherein said first differential amplifier circuit operates so that the voltage formed based on the current flowing to said diode-connected transistor can match said first reference voltage, and the output voltage of said first differential amplifier circuit is applied to a first gate of said amplifying transistor, and said second differential amplifier circuit operates so that the voltage formed based on the current flowing to said diode-connected transistor can match said second reference voltage, and the output voltage of said second differential amplifier circuit is applied to a second gate of said amplifying transistor to make an idle current flow to said amplifying transistor.

4. A high frequency power amplifier circuit according to claim 3, wherein said current-voltage converting element is a diode-connected field-effect transistor, and said transistor allows the channel length to be formed longer than the channel length of said amplifying transistor.

5. A high frequency power amplifier circuit according to claim 4, wherein a diode-connected transistor connected in series to said current simulating transistor allows the channel length to be equal to or larger than the channel length of said current-voltage converting transistor.

6. A high frequency power amplifier circuit according to claim 2, wherein a voltage is generated that is compared with said first reference voltage in said first differential amplifier circuit by a first transistor connected to said diode-connected transistor by a current mirror method and a diode-connected second transistor connected in series to said first transistor, and a voltage is generated that is compared with said second reference voltage in said second differential amplifier circuit by a third transistor connected to said diode-connected transistor by the current mirror method and a diode-connected fourth transistor connected in series to said third transistor.

7. A high frequency power amplifier according to claim 1, further comprising:
   a power amplifying element having a plurality of amplifier stages connected in a cascade and in which each amplifier stage amplifies a high frequency signal respectively; and
   a current-voltage converting element that converts a current into a voltage by applying a predetermined current,
   wherein a voltage corresponding to the voltage generated by said current-voltage converting element is applied to a control pin of said power amplifying element, thereby to make flow a current that is proportional to the current flowing to said current-voltage converting element, and
   wherein said power amplifying element of an first-stage amplifier stage comprises a field-effect transistor of a dual gate having a first gate and a second gate.

8. A high frequency power amplifier circuit according to claim 1, wherein the amplifying transistor and the current simulating transistor of said dual gate comprise two field-effect transistors of a series form respectively.

* * * * *